(12) United States Patent
Asaoka et al.

(10) Patent No.: US 10,067,272 B2
(45) Date of Patent: Sep. 4, 2018

(54) DISPLAY DEVICE AND LIGHT-DIFFUSING MEMBER

(71) Applicant: Sharp Kabushiki Kaisha, Osaka-shi, Osaka (JP)

(72) Inventors: Yasushi Asaoka, Osaka (JP); Shohei Katsuta, Osaka (JP); Tsuyoshi Maeda, Osaka (JP); Tsuyoshi Kamada, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 206 days.

(21) Appl. No.: 14/902,606

(22) PCT Filed: Jul. 1, 2014

(86) PCT No.: PCT/JP2014/067513
§ 371 (c)(1),
(2) Date: Mar. 15, 2016

(87) PCT Pub. No.: WO2015/005176
PCT Pub. Date: Jan. 15, 2015

(65) Prior Publication Data
US 2016/0202541 A1    Jul. 14, 2016

(30) Foreign Application Priority Data

Jul. 9, 2013 (JP) ................................. 2013-144015

(51) Int. Cl.
*G03F 7/00* (2006.01)
*G03F 7/20* (2006.01)
(Continued)

(52) U.S. Cl.
CPC ......... *G02B 5/0294* (2013.01); *G02B 5/0226* (2013.01); *G02B 5/0231* (2013.01);
(Continued)

(58) Field of Classification Search
CPC ... G02B 5/0294; G02B 5/0226; G02B 5/0231
(Continued)

(56) References Cited

U.S. PATENT DOCUMENTS

2002/0122144 A1 9/2002 Yoshida et al.
2013/0265774 A1 10/2013 Umeda et al.
(Continued)

FOREIGN PATENT DOCUMENTS

JP 2002-207434 A 7/2002
JP 2010-145469 A 7/2010
(Continued)

OTHER PUBLICATIONS

Official Communication issued in International Patent Application No. PCT/JP2014/067513, dated Oct. 7, 2014.

*Primary Examiner* — William R Alexander
*Assistant Examiner* — Grant Gagnon
(74) *Attorney, Agent, or Firm* — Keating & Bennett, LLP

(57) ABSTRACT

Provided is a display device including a substrate that has light transmissivity, a plurality of light shielding layers that is formed at a recurring period on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, and the periodic direction at which the light shielding layers are recurrently formed is non-parallel to the direction of a pixel pitch of a display body.

17 Claims, 34 Drawing Sheets

(51) Int. Cl.
    *G02B 5/02*     (2006.01)
    *G02B 5/30*     (2006.01)
    *G02F 1/1335*     (2006.01)
    *G03F 7/32*     (2006.01)

(52) U.S. Cl.
    CPC ......... *G02B 5/0257* (2013.01); *G02B 5/0278* (2013.01); *G02B 5/3033* (2013.01); *G02F 1/133504* (2013.01); *G02F 1/133512* (2013.01); *G02F 1/133528* (2013.01); *G03F 7/0005* (2013.01); *G03F 7/20* (2013.01); *G03F 7/32* (2013.01)

(58) Field of Classification Search
    USPC ........................................................ 359/599
    See application file for complete search history.

(56) References Cited

U.S. PATENT DOCUMENTS

2014/0253844 A1    9/2014    Yamamoto et al.
2016/0202541 A1    7/2016    Asaoka et al.

FOREIGN PATENT DOCUMENTS

| | | |
|---|---|---|
| JP | 2015-018048 A | 1/2015 |
| WO | 2012/086424 A1 | 6/2012 |
| WO | 2013/061875 A1 | 5/2013 |

DISPLAY DEVICE AND LIGHT-DIFFUSING MEMBER

TECHNICAL FIELD

The present invention relates to a display device and to a light-diffusing member.

This application claims priority based on Japanese Patent Application No. 2013-144015, filed on Jul. 9, 2013, the entire content of which is incorporated herein by reference.

BACKGROUND ART

A liquid crystal display device has been widely used as a display of a mobile electronic apparatus including a mobile phone, or of a television, a personal computer, or the like. However, in the related art, a liquid crystal display device is generally known to have a narrow viewing angle while having excellent visibility from the front, and various studies are being carried out in order to increase the viewing angle. One example of these studies is a configuration in which a member that diffuses light emitted from a display body such as a liquid crystal panel (hereinafter, referred to as "light-diffusing member") is included on the visible side of the display body.

There is disclosed an optical sheet that includes a base film layer, an optical functional sheet layer arranged on the base film layer, and a diffusion material containing layer (light-diffusing layer) arranged on the optical functional sheet layer (for example, refer to PTL 1). This optical sheet is configured in such a manner that the optical functional sheet layer includes substantially trapezoidal prism units that are parallelly formed along the upper face of the base film layer and that a light absorbing unit is arranged at a substantially wedge-shaped part between the prism units.

CITATION LIST

Patent Literature

PTL 1: Japanese Unexamined Patent Application Publication No. 2010-145469

SUMMARY OF INVENTION

Technical Problem

Recently, there has been developed a light-diffusing member that includes a substrate having light transmissivity, a plurality of light shielding layers formed on one face of the substrate, and a light-diffusing unit formed in an area on the one face of the substrate except for the area where the light shielding layers are formed. When a liquid crystal display device is configured by bonding such a light-diffusing member having a non-random arrangement of light shielding layers to a display face of a liquid crystal panel, the light shielding layer arrays interfere with the pixel pitch of the liquid crystal panel, thereby leading to a strong visualization of moire interference fringes and to a decrease in display characteristics of the liquid crystal display device.

An object of the present invention is to provide a display device capable of reducing the occurrence of moire interference fringes caused by interference of light shielding layer arrays with a pixel pitch of a liquid crystal panel, a method for manufacturing the same, and a light-diffusing member.

Solution to Problem

According to an aspect of the present invention, there is provided a display device including a substrate that has light transmissivity, a plurality of light shielding layers that is formed at a recurring period on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, and the periodic direction at which the light shielding layers are recurrently formed is non-parallel to the direction of a pixel pitch of a display body.

According to another aspect of the present invention, there is provided a display device including a substrate that has light transmissivity, a plurality of light shielding layers that is formed on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the periodic direction at which the light shielding layers are arranged is non-parallel to the direction of a pixel pitch of a display body, and the period at which the light shielding layers are arranged is smaller than the pixel pitch.

According to still another aspect of the present invention, there is provided a light-diffusing member including a substrate that has light transmissivity, a plurality of light shielding layers that is formed at a recurring period on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, and the direction of strong scattering of the light-diffusing unit is non-parallel to the periodic direction at which the light shielding layers are recurrently formed.

According to still another aspect of the present invention, there is provided a light-diffusing member including a substrate that has light transmissivity, a plurality of light shielding layers that is formed on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, and the direction of strong scattering of the light-diffusing unit is non-parallel to the periodic direction at which the light shielding layers are arranged.

According to still another aspect of the present invention, there is provided a display device including a substrate that has light transmissivity, a plurality of light shielding layers that is formed on one face of the substrate, and a light-diffusing unit that is formed in an area of the one face of the substrate except for the area where the light shielding layers are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, the direction of strong scattering of the light-diffusing unit is non-parallel to the periodic direction at which the light shielding layers are arranged, the periodic direction at which the light shielding layers are arranged is non-parallel to the direction of a pixel pitch of a display body, and the period at which the light shielding layers are arranged is smaller than the pixel pitch.

According to still another aspect of the present invention, there is provided a display device including a substrate that has light transmissivity, a plurality of light-diffusing units that is formed at a recurring period on one face of the substrate, and a light shielding layer that is formed in an area of the one face of the substrate except for the area where the light-diffusing units are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, and the periodic direction at which the light-diffusing units are recurrently formed is non-parallel to the direction of a pixel pitch of a display body.

According to still another aspect of the present invention, there is provided a display device including a substrate that has light transmissivity, a plurality of light-diffusing units that is formed on one face of the substrate, and a light shielding layer that is formed in an area of the one face of the substrate except for the area where the light-diffusing units are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the periodic direction at which the light-diffusing units are arranged is non-parallel to the direction of a pixel pitch of a display body, and the period at which the light-diffusing units are arranged is smaller than the pixel pitch.

According to still another aspect of the present invention, there is provided a light-diffusing member including a substrate that has light transmissivity, a plurality of light-diffusing units that is formed at a recurring period on one face of the substrate, and a light shielding layer that is formed in an area of the one face of the substrate except for the area where the light-diffusing units are formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, and the direction of strong scattering of the light-diffusing unit is non-parallel to the periodic direction at which the light-diffusing units are recurrently formed.

According to still another aspect of the present invention, there is provided a light-diffusing member including a substrate that has light transmissivity, a plurality of light-diffusing units that is formed on one face of the substrate, and a light shielding layer that is formed in an area of the one face of the substrate except for the area where the light shielding layer is formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, and the direction of strong scattering of the light-diffusing unit is non-parallel to the periodic direction at which the light-diffusing units are arranged.

According to still another aspect of the present invention, there is provided a display device including a substrate that has light transmissivity, a plurality of light-diffusing units that is formed on one face of the substrate, and a light shielding layer that is formed in an area of the one face of the substrate except for the area where the light shielding layer is formed, in which the light-diffusing unit includes a light emitting end face on the substrate side and includes a light incident end face having an area larger than the area of the light emitting end face on the side opposite to the substrate side, the height of the light-diffusing unit from the light incident end face to the light emitting end face is greater than the thickness of the light shielding layer, the light-diffusing member is an anisotropic light-diffusing member in which the intensity of scattering of the light-diffusing unit has a direction of strong scattering and a direction of weak scattering when viewed from the normal direction of the one face of the substrate, the direction of strong scattering of the light-diffusing unit is non-parallel to the periodic direction at which the light-diffusing units are arranged, the periodic direction at which the light-diffusing units are arranged is non-parallel to the direction of a pixel pitch of a display body, and the period at which the light-diffusing units are arranged is smaller than the pixel pitch.

In the display device, it is preferable that at least one of an anti-reflective layer, an anti-static layer, an anti-glare processed layer, and an anti-stain processed layer is disposed on the face of the substrate opposite to the one face.

In the display device, it is preferable that the direction of strong scattering of the light-diffusing unit is non-parallel to a diagonal that connects vertices of a display body.

In the display device, it is preferable that a polarization plate is disposed between the substrate and a display body and that a member that has a refractive index residing between a refractive index of the substrate and a refractive index of the polarization plate is interposed between the substrate and the polarization plate.

In the display device, it is preferable that a part of the face of the light shielding layer on the opposite side thereof from the substrate is covered by a member that has light scattering ability.

In the display device, it is preferable that the planar shape of the light shielding layer when viewed from the normal direction of the one face of the substrate is an anisotropic shape that has a long axis and a short axis.

In the display device, it is preferable that the planar shape of the light shielding layer when viewed from the normal direction of the one face of the substrate is an elliptic shape or a polygonal shape.

In the display device, it is preferable that the plurality of light shielding layers includes light shielding layers of different sizes.

In the display device, it is preferable that a space that is defined by the light shielding layer and a side face of the light-diffusing unit is a cavity and that the cavity is filled with gas.

In the display device, it is preferable that the inclination angle of a side face of at least one light-diffusing unit of the plurality of light-diffusing units is different from the inclination angle of a side face of another light-diffusing unit.

In the display device, it is preferable that the inclination angle of a side face of at least one light-diffusing unit of the plurality of light-diffusing units is different depending on location.

In the display device, it is preferable that the planar shape of the light shielding layer when viewed from the normal direction of the one face of the substrate is an isotropic shape and that the side shape of the light shielding layer is an anisotropic shape having a long axis and a short axis.

According to still another aspect of the present invention, there is provided a method for manufacturing a display device, the method including a step of forming a plurality of light shielding layers at a recurring period on one face of a substrate having light transmissivity; a step of forming a negative photosensitive resin layer having light transmissivity on the one face of the substrate to cover the light shielding layers; a step of exposing the negative photosensitive resin layer to light by irradiating the negative photosensitive resin layer with diffused light from the face of the substrate opposite to the one face, where the light shielding layers and the negative photosensitive resin layer are formed, through an area except for the area where the light shielding layers are formed; a step of developing the negative photosensitive resin layer on which the step of exposing is completed to form a light-diffusing unit on the one face of the substrate, the light-diffusing unit including a light emitting end face on the substrate side and including a light incident end face of an area larger than the area of the light emitting end face on the opposite side from the substrate side; a step of bonding a polarization plate to the light incident end face of the light-diffusing unit through an optical adhesive; and a step of cleaving a laminated body including the substrate, the light shielding layers, the light-diffusing unit, and the polarization plate thickness-wise and arranging a thickness-wise end face of the light-diffusing unit to approximately match a thickness-wise end face of the polarization plate.

According to still another aspect of the present invention, there is provided a method for manufacturing a display device, the method including a step of forming a light shielding layer on one face of a substrate having light transmissivity, the light shielding layer including opening portions at a recurring period; a step of forming a negative photosensitive resin layer having light transmissivity on the one face of the substrate to cover the light shielding layer; a step of exposing the negative photosensitive resin layer to light by irradiating the negative photosensitive resin layer with diffused light from the face of the substrate opposite to the one face, where the light shielding layers and the negative photosensitive resin layer are formed, through the opening portions of the light shielding layer; a step of developing the negative photosensitive resin layer on which the step of exposing is completed to form a light-diffusing unit on the one face of the substrate, the light-diffusing unit including a light emitting end face on the substrate side and including a light incident end face of an area larger than the area of the light emitting end face on the opposite side from the substrate side; a step of bonding a polarization plate to the light incident end face of the light-diffusing unit through an optical adhesive; and a step of cleaving a laminated body including the substrate, the light shielding layers, the light-diffusing unit, and the polarization plate thickness-wise and arranging a thickness-wise end face of the light-diffusing unit to approximately match a thickness-wise end face of the polarization plate.

According to still another aspect of the present invention, there is provided a method for manufacturing a display device, the method including a step of forming light shielding layers at a recurring period on one face of a substrate having light transmissivity; a step of forming a negative photosensitive resin layer having light transmissivity on the one face of the substrate to cover the light shielding layers; a step of exposing the negative photosensitive resin layer to light by irradiating the negative photosensitive resin layer with diffused light from the face of the substrate opposite to the one face, where the light shielding layers and the negative photosensitive resin layer are formed, through an area except for the area where the light shielding layers are formed; and a step of developing the negative photosensitive resin layer on which the step of exposing is completed to form a light-diffusing unit on the one face of the substrate, the light-diffusing unit including a light emitting end face on the substrate side and including a light incident end face of an area larger than the area of the light emitting end face on the opposite side from the substrate side, in which the light incident end face of the light-diffusing unit and a display face of the display device including recurring pixels are installed to face each other so that recurring periods of both are non-parallel to each other.

Advantageous Effects of Invention

According to the aspects of the present invention, moire interference fringes do not stand out in a display device, and thus, the visibility of the display device can be improved.

BRIEF DESCRIPTION OF DRAWINGS

FIG. 1(A) is a sectional view of the liquid crystal display device of the first embodiment, and FIG. 1(B) is a plan view of the liquid crystal display device of the first embodiment.

FIG. 21(A) is a sectional view of the liquid crystal display device of the second embodiment, and FIG. 21(B) is a plan view of the liquid crystal display device of the second embodiment.

FIG. 23(A) is a sectional view of the liquid crystal display device of the third embodiment, and FIG. 23(B) is a plan view of the liquid crystal display device of the third embodiment.

FIG. 25(A) is a sectional view of the liquid crystal display device of the fourth embodiment, and FIGS. 25(B) and 25(C) are plan views of the liquid crystal display device of the fourth embodiment.

FIG. 27(A) is a sectional view of the liquid crystal display device of the fifth embodiment, and FIGS. 27(B) and 27(C) are plan views of the liquid crystal display device of the fifth embodiment.

FIG. 29(A) is a sectional view of the liquid crystal display device of the sixth embodiment, and FIG. 29(B) is a plan view of the liquid crystal display device of the sixth embodiment.

FIG. 31(A) is a sectional view of the liquid crystal display device of the seventh embodiment, and FIG. 31(B) is a plan view of the liquid crystal display device of the seventh embodiment.

FIG. 33(A) is a sectional view of the liquid crystal display device of the eighth embodiment, and FIG. 33(B) is a plan view of the liquid crystal display device of the eighth embodiment.

FIG. 35(A) is a sectional view of the liquid crystal display device of the ninth embodiment, and FIGS. 35(B) and 35(C) are plan views of the liquid crystal display device of the ninth embodiment.

FIG. 37(A) is a sectional view of the liquid crystal display device of the tenth embodiment, and FIGS. 37(B) and 37(C) are plan views of the liquid crystal display device of the tenth embodiment.

FIG. 39(A) is a sectional view of the liquid crystal display device of the eleventh embodiment, and FIGS. 39(B) and 39(C) are plan views of the liquid crystal display device of the eleventh embodiment.

DESCRIPTION OF EMBODIMENTS

Embodiments of a display device, a method for manufacturing the same, and a light-diffusing member of the present invention will be described. The embodiments are specifically described for better understanding of the gist of the invention and do not limit the present invention unless otherwise specified.

(1) First Embodiment

Hereinafter, a first embodiment of the present invention will be described with reference to FIG. 1 to FIG. 20. In the present embodiment, a liquid crystal display device that includes a transmissive liquid crystal display element will be described as an example of the display device. In all of the drawings below, dimensions of elements may be illustrated on a different scale for easy viewing of each element.

Figure 1:
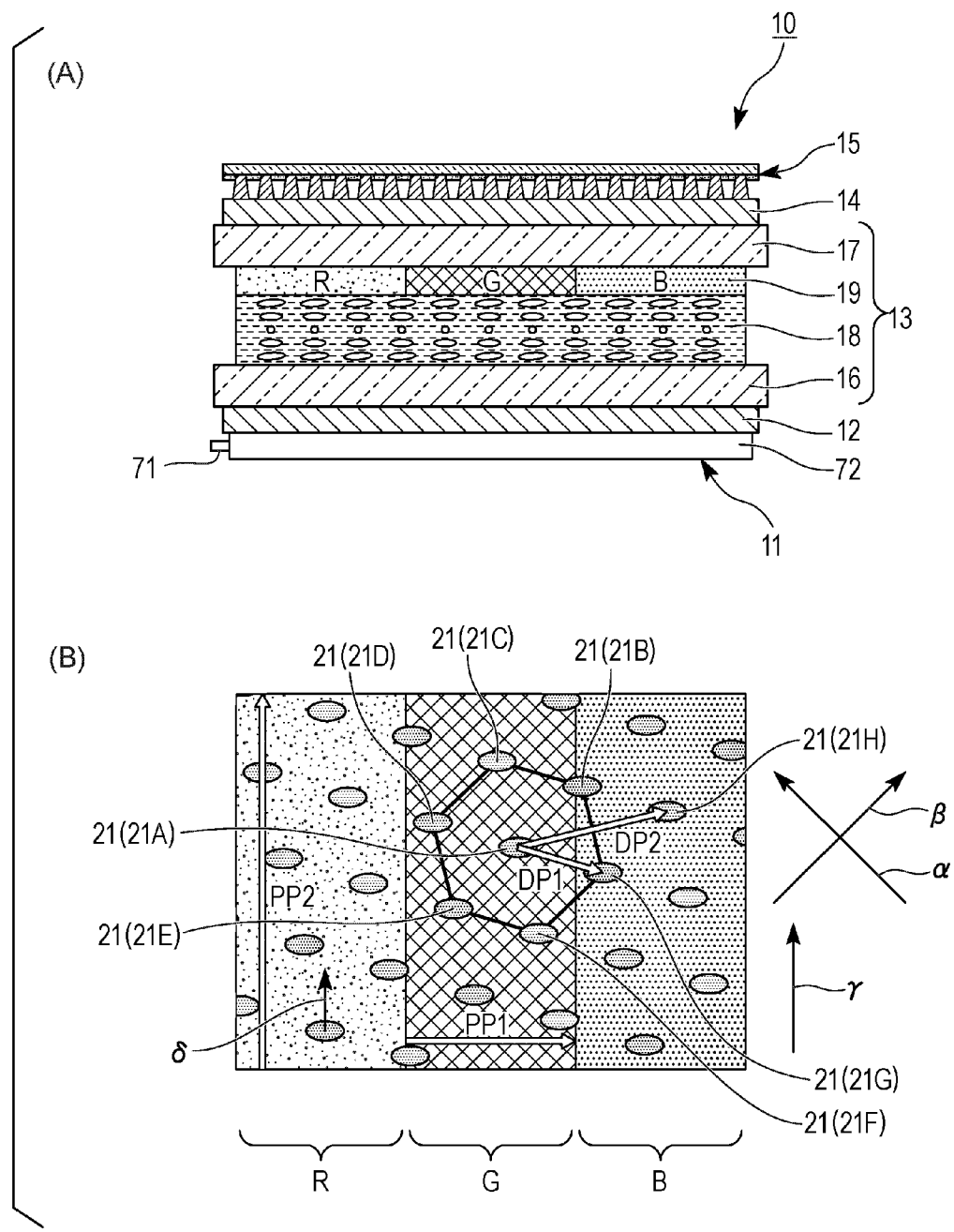
FIG. 1 is a schematic diagram illustrating a liquid crystal display device of a first embodiment.
Figure 2:
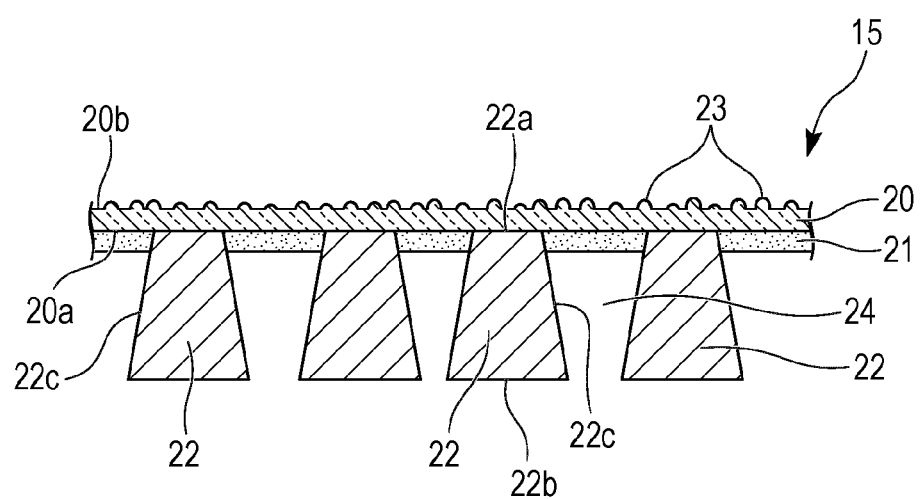
FIG. 2 is a sectional view of a light-diffusing member of the first embodiment.
Figure 3:
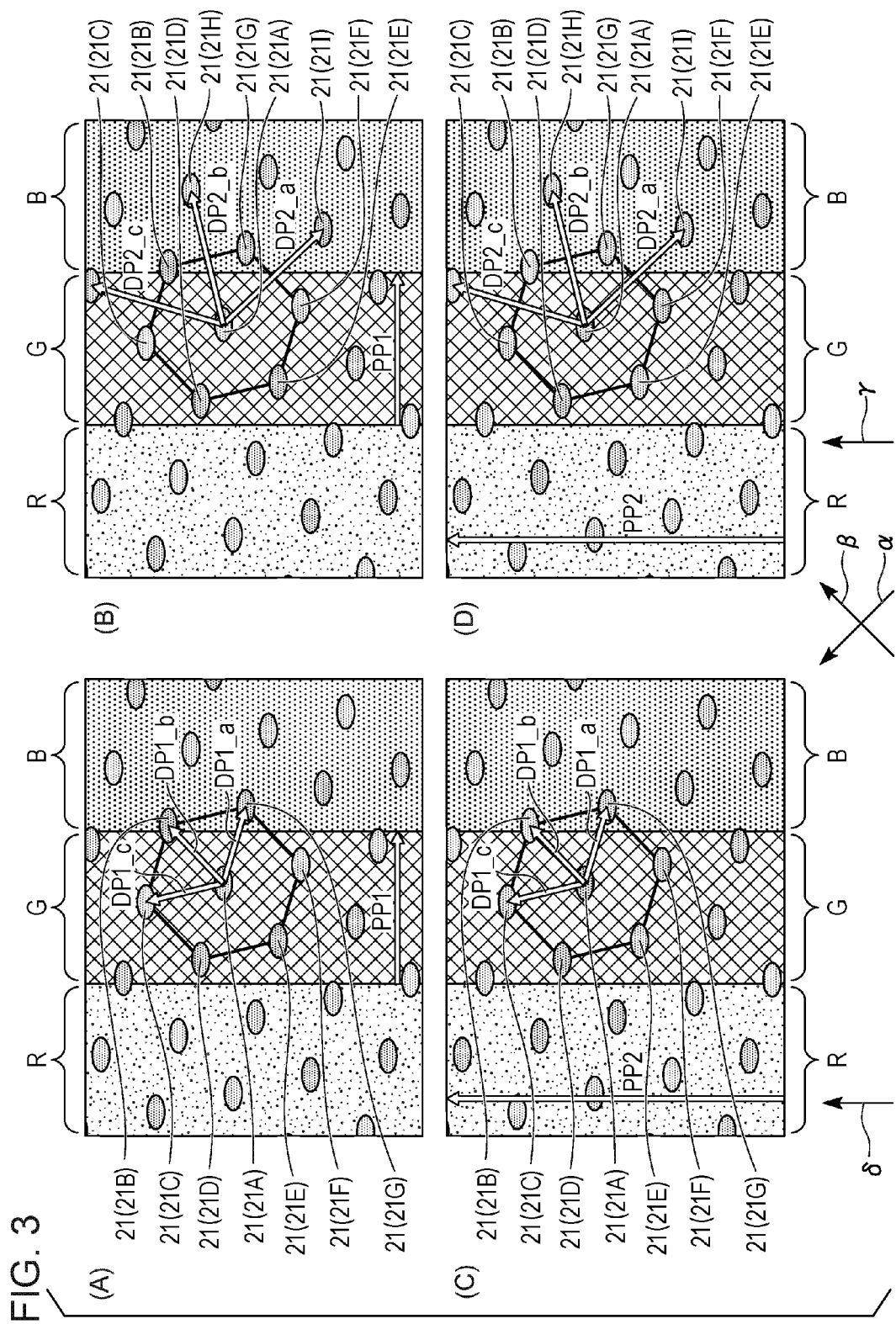
FIG. 3 is a schematic plan view illustrating the liquid crystal display device of the first embodiment.

FIG. 1 is a schematic diagram illustrating the liquid crystal display device of the present embodiment: FIG. 1(A) is a sectional view of the liquid crystal display device of the present embodiment, and FIG. 1(B) is a plan view of the liquid crystal display device of the present embodiment. FIG. 2 is a sectional view of a light-diffusing member of the present embodiment.

A liquid crystal display device (display device) 10 of the present embodiment is schematically configured of a backlight (light source) 11, a first polarization plate 12, a liquid crystal panel 13, a second polarization plate 14, and a light-diffusing member 15.

While the liquid crystal panel 13 is schematically illustrated by one piece of a plate in FIG. 1, a detailed structure thereof will be described later.

An observer views a display from the upper side of the liquid crystal display device 10 on which the light-diffusing member 15 is arranged in FIG. 1. Therefore, in the description below, the side of the liquid crystal display device 10 on which the light-diffusing member 15 is arranged will be referred to as a visible side, and the side thereof on which the backlight 11 is arranged will be referred to as a rear side.

In FIG. 1(B), an arrow α indicates the direction of a transmission axis of the first polarization plate 12, an arrow β indicates the direction of a transmission axis of the second polarization plate 14, an arrow γ indicates a direction of view (asymmetrical direction), and an arrow δ indicates the direction in which the intensity of scattering of the light-diffusing member 15 is high (direction of strong scattering).

The liquid crystal panel 13 modulates light emitted from the backlight 11, and the modulated light displays a predetermined image, a character, or the like in the liquid crystal display device 10 of the present embodiment. In addition, when light emitted from the liquid crystal panel 13 is transmitted through the light-diffusing member 15, the angular distribution of the emitted light becomes wider than that before the light is incident on the light-diffusing member 15, and light is emitted from the light-diffusing member 15. Accordingly, the observer can view a display with a wide viewing angle.

The liquid crystal panel 13 is schematically configured of a TFT substrate 16 in which a switching element and the like are formed, a color filter substrate 17 that is arranged to face the TFT substrate 16, and a liquid crystal layer 18 that is interposed between the TFT substrate 16 and the color filter substrate 17. In addition, a color filter 19 that includes color elements for each of red (R), green (G), and blue (B) is disposed on the side of the color filter substrate 17 facing the liquid crystal layer 18.

The light-diffusing member 15 is schematically configured of a substrate 20 having light transmissivity, a plurality of light shielding layers 21 formed on one face (face on the rear side) 20a of the substrate 20, a light-diffusing unit 22 formed in an area on the one face 20a of the substrate 20 except for the area where the light shielding layers 21 are formed, and a light-scattering layer 23 formed on other face (face on the visible side) 20b of the substrate 20.

The light-diffusing unit 15 includes a light emitting end face 22a on the substrate 20 side and includes a light incident end face 22b having a larger area than the light emitting end face 22a on the side opposite to the substrate 20 side.

The height of the light-diffusing unit 15 from the light incident end face 22a to the light emitting end face 22b is greater than the thickness of the light shielding layer 21.

A space that is defined by the light shielding layer 21 and a side face 22c of the light-diffusing unit 22 is a cavity 24. The cavity 24 is filled with gas such as air.

It is also possible that at least one of an anti-reflective layer, a polarizing filter layer, an anti-static layer, an anti-glare processed layer, and an anti-stain processed layer is configured to be disposed on the visible side (on the side opposite to the one face 20a) of the substrate 20 of the light-diffusing member 15. According to this configuration, a function of reducing reflection of external light, a function of preventing attachment of dust or stains, a function of preventing scratches, and the like can be added according to types of layer disposed on the visible side of the substrate 20, and temporal degradation of viewing angle characteristics can be prevented.

The angle of inclination of the side face 22c of the light-diffusing unit 22 (angle formed by the one face 20a of the substrate 20 and the side face 22c of the light-diffusing unit 22) is preferably greater than or equal to 60° and less than or equal to 90°. The angle of inclination of the side face 22c of the light-diffusing unit 22 is not particularly limited, provided that incident light can be sufficiently diffused when being emitted from the light-diffusing member 15.

In addition, while the light-diffusing unit 22 includes multiple side faces 22c having a constant angle of inclination in the cavity 24 in the present embodiment, the present embodiment is not limited thereto. At least one angle of inclination of the multiple side faces 22c may be different from the angle of inclination of another side face 22c. In addition, at least one angle of inclination of the multiple side faces 22c may be different depending on location.

As illustrated in FIG. 1(B), in the light-diffusing member 15, the planar shape of the light shielding layer 21 viewed from the normal direction of the other face (face on the visible side) 20b of the substrate 20 is an anisotropic shape (long and narrow elliptic shape) having at least a long axis and a short axis.

The light shielding layers 21 are arranged at a predetermined period. For example, as illustrated in FIG. 1(B), six dots 21B, 21C, 21D, 21E, 21F, and 21G of the light shielding layers 21 are arranged around one dot 21A of the light shielding layers 21. That is, the dots 21B, 21C, 21D, 21E, 21F, 21G, and the like constituting the light shielding layers 21 are arranged to form a hexagonal close-packed structure.

In addition, these six dots 21B, 21C, 21D, 21E, 21F, and 21G are arranged to have six-fold rotational symmetry.

The periodic direction at which the light shielding layers 21, that is, the dots 21A, 21B, 21C, 21D, 21E, 21F, 21G, and the like constituting the light shielding layers 21, are recurrently formed is non-parallel to the direction of a pixel pitch of the liquid crystal panel 13 in the present embodiment.

The pixel pitch of the liquid crystal panel 13 includes a pixel pitch PP1 that is an interval between the color elements for each of red (R), green (G), and blue (B) and a pixel pitch PP2 that is the width of each color element as illustrated in FIG. 1(B).

For example, the direction of the pixel pitch PP1 and the direction of the pixel pitch PP2 are non-parallel to a distance (pitch) direction DP1 of the distance from the dot 21A to the closest dot 21G as illustrated in FIG. 1(B) in the present embodiment. The direction of the pixel pitch PP1 and the direction of the pixel pitch PP2 are non-parallel to a distance (pitch) direction DP2 of the distance from the dot 21A to a second closest dot 21H.

The direction of the pixel pitch PP1 is non-parallel to a distance (pitch) direction DP1-*b* of the distance from the dot 21A to the closest dot 21B as illustrated in FIG. 3(A). The direction of the pixel pitch PP1 is non-parallel to directions DP1-*a* and DP1-*c* of the distances (pitches) from the dot 21A to the second closest dots 21C and 21G.

The direction of the pixel pitch PP1 is non-parallel to a distance (pitch) direction DP2-*b* of the distance from the dot 21A to the closest dot 21H beyond the hexagonal close-packed structure as illustrated in FIG. 3(B). The direction of the pixel pitch PP1 is non-parallel to directions DP2-*a* and DP2-*c* of the distances (pitches) from the dot 21A to the second closest dots 21I and 21J beyond the hexagonal close-packed structure.

The direction of the pixel pitch PP2 is non-parallel to the direction DP1-*b* of movement from the dot 21A to the closest dot 21B as illustrated in FIG. 3(C). The direction of the pixel pitch PP2 is non-parallel to the directions DP1-*a* and DP1-*c* of the distances (pitches) from the dot 21A to the second closest dots 21C and 21G.

The direction of the pixel pitch PP2 is non-parallel to the distance (pitch) direction DP2-*b* of the distance from the dot 21A to the closest dot 21H beyond the hexagonal close-packed structure as illustrated in FIG. 3(D). The direction of the pixel pitch PP1 is non-parallel to directions DP2-*a* and DP2-*c* of the distances (pitches) from the dot 21A to the second closest dots 21I and 21J beyond the hexagonal close-packed structure.

The display type of liquid crystal panel 13 is a TN type in which light distribution characteristics do not have multi-directional symmetry.

In addition, the direction in which the anisotropy of the liquid crystal panel 13 is strong is approximately parallel to the direction in which the intensity of scattering of the light-diffusing member 15 is high (direction of strong scattering).

While the shape of each dot (dots 21A, 21B, 21C, 21D, 21E, 21F, 21G, and the like) constituting the light shielding layers 21 is a long and narrow elliptic shape in FIG. 1(B) (FIG. 4(A)), the shape of the light shielding layers 21 is not limited thereto.

For example, as illustrated in FIG. 4(B), a light shielding layer 21K having a long and narrow oblong shape may be used.

Alternatively, as illustrated in FIG. 4(C), a light shielding layer 21L having a long and narrow octagonal shape may be used.

Alternatively, as illustrated in FIG. 4(D), a light shielding layer 21M having a shape in which two facing edges of a long and narrow oblong are curved outward may be used.

Alternatively, as illustrated in FIG. 4(E), a light shielding layer 21N having a shape in which two oblongs having different aspect ratios intersect in two orthogonal directions may be used.

Alternatively, as illustrated in FIG. 4(F), a light shielding layer 21O having an isosceles triangular shape may be used.

Alternatively, as illustrated in FIG. 4(G), a light shielding layer 21P having a rhombus shape may be used.

A plurality of types of light shielding layer of different sizes and shapes having various directions of anisotropy (refer to FIGS. 4(A) to 4(G)) may coexist by making the planar shape of each light shielding layer 21 different from each other.

The planar shape of the light shielding layers 21 viewed from the normal direction of the one face 20*a* of the substrate 20 of the light-diffusing member 15 may be an isotropic shape while the side shape of the light shielding layers 21 is an anisotropic shape having a long axis and a short axis.

Figure 4:
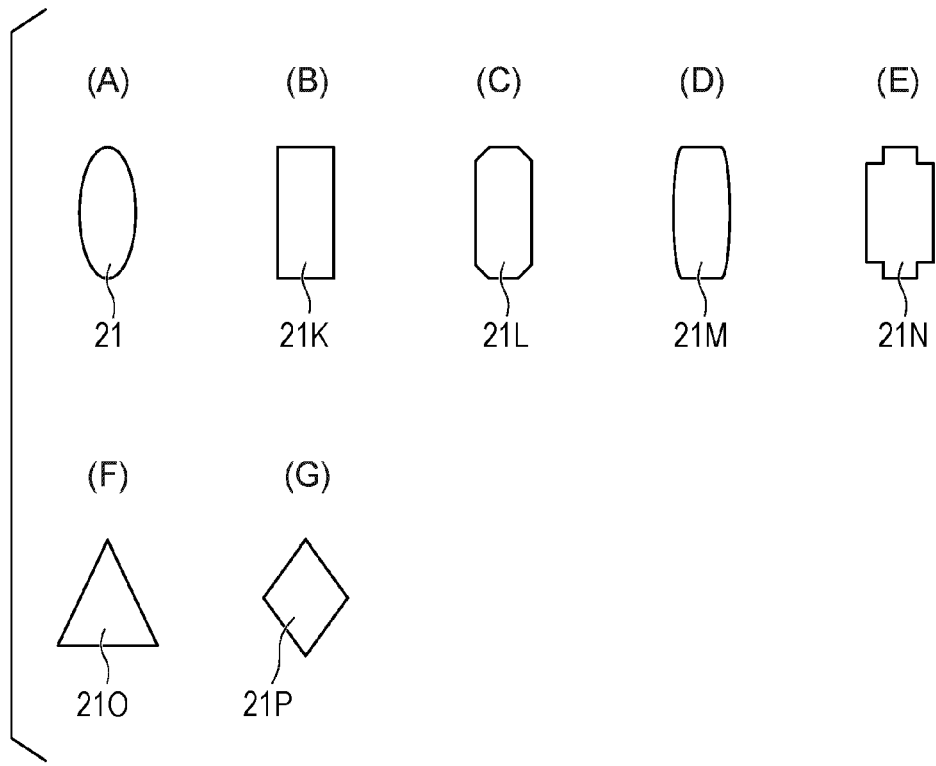
FIG. 4 is a plan view illustrating another example of a light shielding layer of the light-diffusing member.

The direction in which the intensity of scattering of the light-diffusing member 15 is high (direction of strong scattering) is a direction that is perpendicular to the longitudinal direction of the light shielding layers 21 in FIG. 4 (up-down direction on the page of FIG. 4).

The period (interval or pitch) at which the light shielding layers 21 are arranged is preferably smaller than the pixel pitches PP1 and PP2.

Specifically, the interval (pitch) from the dot 21A to the dot 21G and the interval (pitch) from the dot 21A to the dot 21H are preferably smaller than the pixel pitches PP1 and PP2.

Accordingly, at least one light shielding layer 21 is formed within a pixel. Thus, a wide viewing angle can be obtained when the light-diffusing member 15 is combined with a small pixel pitch liquid crystal panel used in a mobile device or the like.

A relationship between the pitch of a moire interference fringe occurring in the liquid crystal display device 10 and the angle formed by a pixel pitch (the pixel pitch PP1 or the pixel pitch PP2) and the direction DP1 of movement from the dot 21A to the closest dot 21B in FIG. 1(B) will be described.

Figure 5:
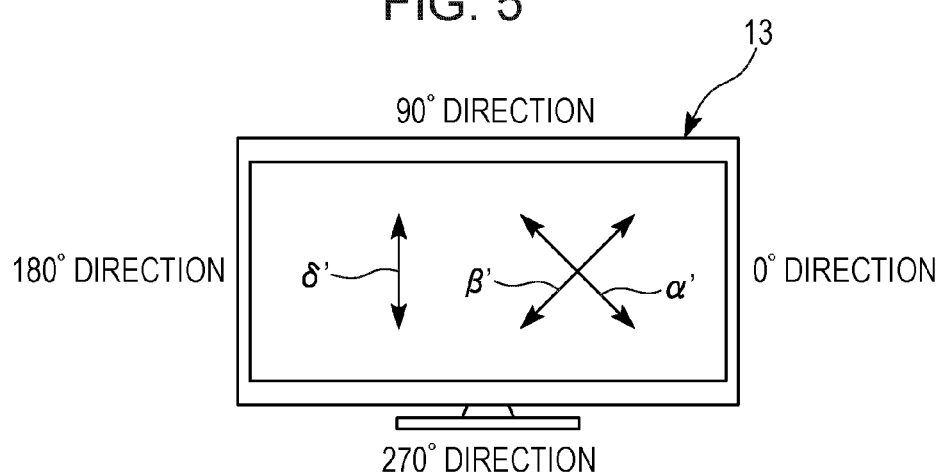
FIG. 5 is a diagram illustrating a direction of strong scattering of a liquid crystal panel, a direction of an absorption axis of a first polarization plate, and a direction of an absorption axis of a second polarization plate.

As illustrated in FIG. 5, the direction of rubbing of the liquid crystal panel 13 is set at 45 degrees and at 135 degrees, and for example, the direction of an absorption axis of the second polarization plate 14 (direction of an arrow β') and the direction of an absorption axis of the first polarization plate 12 (direction of an arrow α') are aligned to the direction of rubbing. In FIG. 5, the direction of the arrow α' indicates the direction of the absorption axis of the first polarization plate 12, the direction of the arrow β' indicates the direction of the absorption axis of the second polarization plate 14, and the direction of an arrow δ' indicates the direction of strong scattering of the liquid crystal panel 13.

Figure 6:
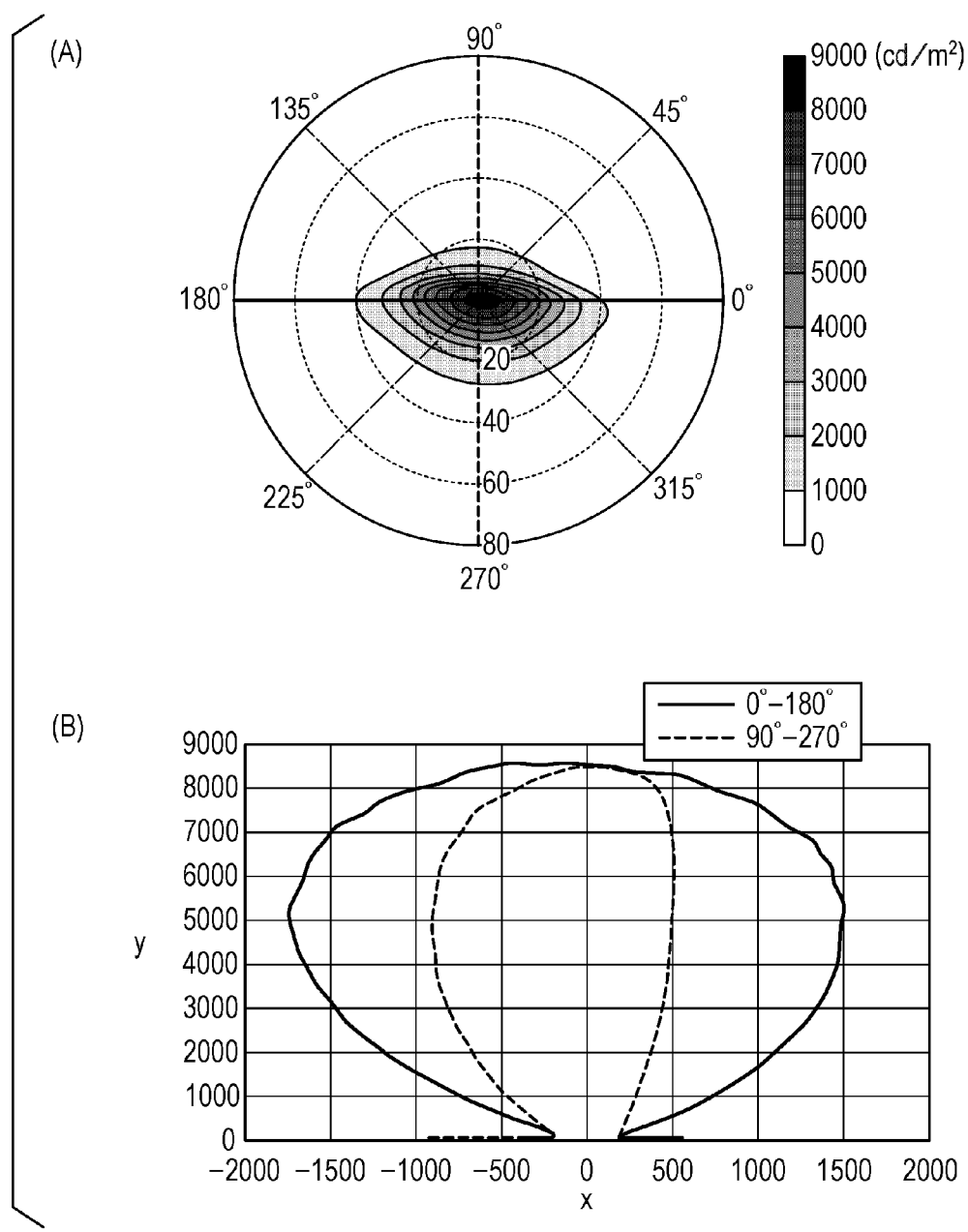
FIG. 6 is a diagram illustrating light distribution characteristics of light emitted from a light source.

When light emitted from the backlight 11 anisotropically spreads as illustrated in FIG. 6, light that is transmitted through the liquid crystal panel 13 spreads further in the left-right direction (0-180 degree direction) perpendicular to the up-down direction of the liquid crystal panel 13 than in the up-down direction (90-270 degree direction) of the liquid crystal panel 13. Thus, display performed by the liquid crystal display device 10 can be bright in the left-right direction perpendicular to the up-down direction of the liquid crystal panel 13.

Figure 7:
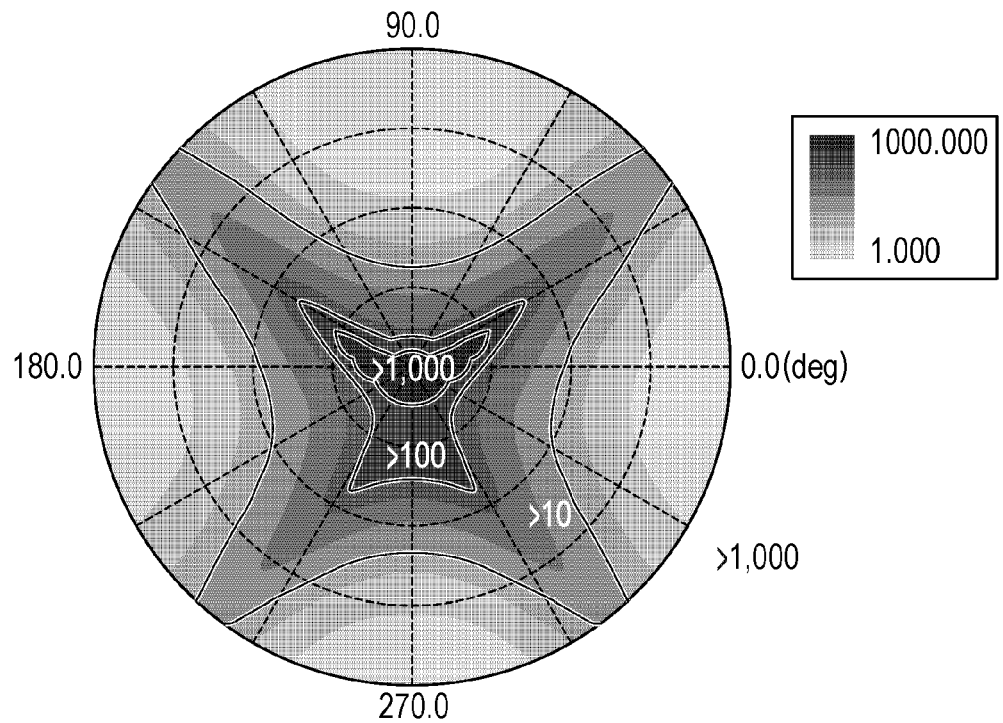
FIG. 7 is a diagram illustrating brightness on a visible side of the liquid crystal panel.

Such a configuration enables the display to have high contrast in the left-right direction and to have brightness in the left-right direction as illustrated in FIG. 7.

In addition, since the direction of strong scattering of the light-diffusing member 15 is the up-down direction (90-270 degree direction) of the liquid crystal panel 13, using the light-diffusing member 15 enables light emitted from the backlight 11 to spread strongly in the up-down direction of the liquid crystal panel 13. Thus, the direction of strong scattering being the up-down direction of the liquid crystal panel 13 produces light distribution characteristics in which the light intensity is approximately the same at the left and at the right with good left-right symmetry and can realize visualization of a wide location. In addition, the direction of strong scattering being the up-down direction of the liquid crystal panel 13 causes 90 degree directional light and 270 degree directional light to be likely to coexist and reduces the anisotropy of display characteristics of the liquid crystal panel 13. Thus, grayscale inversion in the 270 degree direction and a color shift between the direction of the front and the 270 degree direction can be alleviated.

The pitch of a moire interference fringe occurring in the liquid crystal display device 10 has a period that is changed by the angle of rotation of two diffraction gratings (the liquid crystal panel 13 and the light-diffusing member 15). The period is maximized when the two diffraction gratings are parallel and decreases as the angle formed by the directions of recurring periods of the two diffraction gratings increases.

Given that the pitch of the moire interference fringe is $T_M$, a recurring period of the liquid crystal panel 13 is $T_1$, a recurring period of the light-diffusing member 15 is $T_2$, and the angle formed by the liquid crystal panel 13 and the light-diffusing member 15 is $\alpha_1$, the pitch $T_M$ of the moire interference fringe is calculated by the following Expression (1). For example, the recurring period $T_1$ of the liquid crystal panel 13 is a period at which dots are formed in the direction of the pixel pitch PP1, and the recurring period $T_2$ of the light-diffusing member 15 is a period at which dots are formed in the distance direction DP1.

[Math. 1]

$$T_M = \frac{T_1 T_2}{\sqrt{T_1^2 + T_2^2 - 2T_1 T_2 \cos\alpha_1}} \quad (1)$$

The moire interference fringe is not visible when the period of the moire interference fringe is short and is at or below the resolution limit of a human eye.

Thus, when the direction of the pixel pitch PP1 or the direction of the pixel pitch PP2 of the liquid crystal panel 13 illustrated in FIG. 1(B) is parallel to the distance direction DP1 of the distance from the dot 21A to the closest dot 21G, the period of the moire interference fringe caused by the distance direction DP1 and the direction of the pixel pitch PP1 is maximized and is likely to be viewed in the liquid crystal display device 10.

Meanwhile, the period of the moire interference fringe caused by the distance direction DP1 and the direction of the pixel pitch PP1 or of the pixel pitch PP2 can be decreased by making the distance direction DP1 non-parallel to the direction of the pixel pitch PP1 or of the pixel pitch PP2. In addition, the pitch (period) of a moire interference fringe caused by the distance direction DP2 and the direction of the pixel pitch PP1 or of the pixel pitch PP2 can be decreased by making the distance direction DP2 non-parallel to the direction of the pixel pitch PP1 or of the pixel pitch PP2. Accordingly, the visibility of the liquid crystal display device 10 can be improved.

Figure 8:
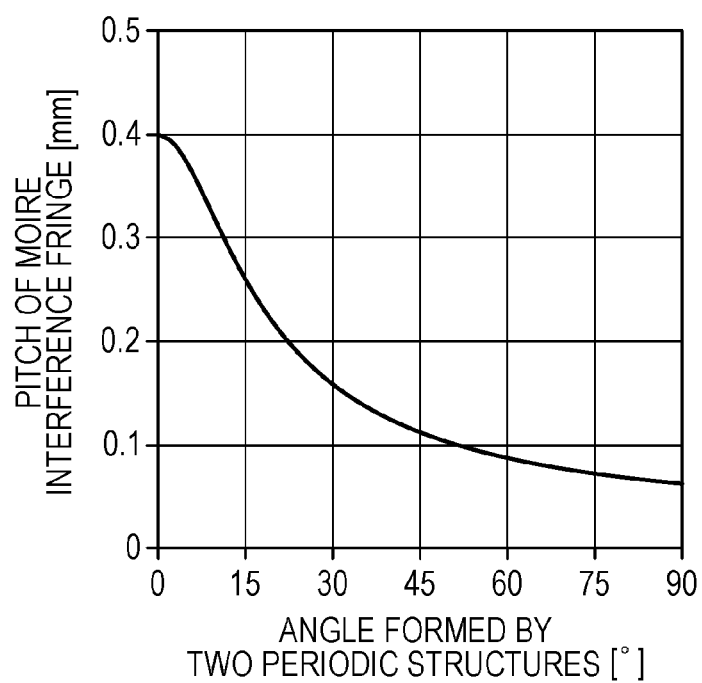
FIG. 8 is a graph illustrating a relationship between a pitch of a moire interference fringe and an angle formed by a periodic structure having a period of 0.1 mm and a periodic structure having a period of 0.08 mm.

FIG. 8 is a graph illustrating a relationship between the pitch of the moire interference fringe and the angle formed by a periodic structure having a period of 0.1 mm and a periodic structure having a period of 0.08 mm.

As illustrated in FIG. 8, the pitch of the moire interference fringe decreases as the angle formed by the two periodic structures increases. That is, as the angles formed by the distance directions DP1 and DP2 and the directions of the pixel pitches PP1 and PP2 increase, the visibility of the liquid crystal display device 10 can be improved.

Figure 9:
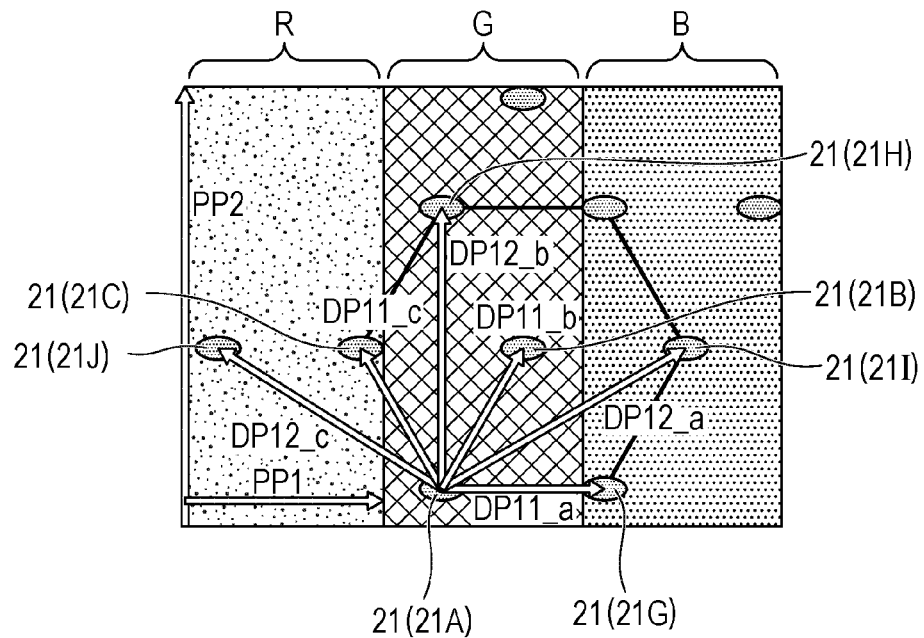
FIG. 9 is a schematic plan view illustrating the liquid crystal display device of the first embodiment.

A case, as illustrated in FIG. 9, where dots of the light shielding layers 21 of the light-diffusing member 15 arranged on the liquid crystal panel 13 are arranged in a hexagonal close-packed structure will be reviewed.

The pixel pitch PP1 of the liquid crystal panel 13 is set to 0.033 mm, and the pixel pitch PP2 of the liquid crystal panel 13 is set to 0.099 mm. Then, the angle formed by the distance direction DP1-$a$ and the distance direction DP1-$b$ is 60 degrees satisfying distance direction DP1-$a$=distance direction DP1-$b$=distance direction DP1-$c$=0.025 mm.

In addition, the angle formed by the distance direction DP1-$a$ and the distance direction DP2-$a$ is 30 degrees satisfying distance direction DP2-$a$=distance direction DP2-$b$=distance direction DP2=$c$=0.043 mm.

Figure 10:
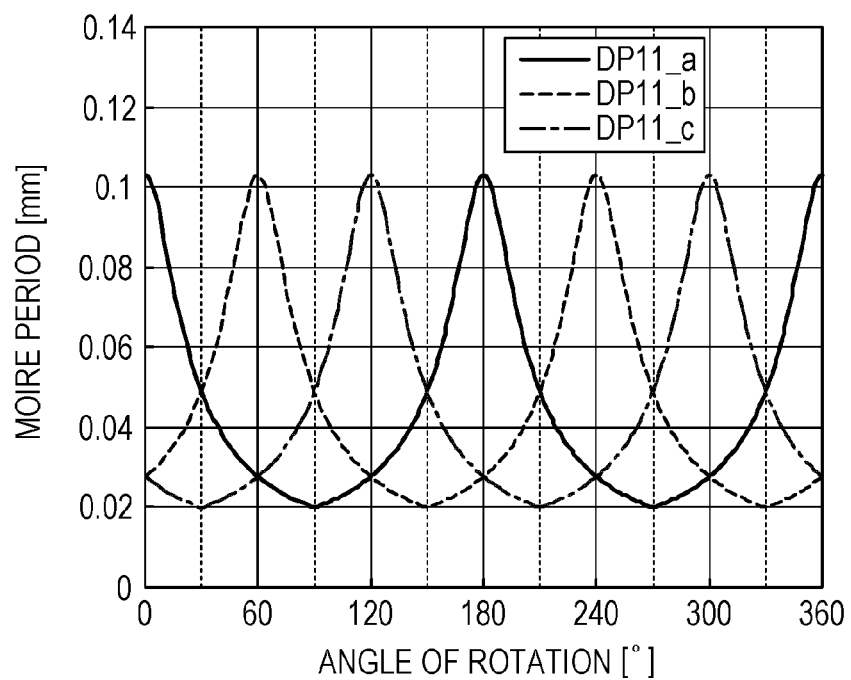
FIG. 10 is a graph illustrating a relationship between a pitch (period) of a moire interference fringe and an angle formed by a direction of a pixel pitch of the liquid crystal panel and a direction of movement from a dot of a light shielding layer to the closest dot thereof.

FIG. 10 is a graph illustrating a relationship between the period of the moire interference fringe occurring in the liquid crystal display device 10 and the angles formed by the distance directions DP1-$a$, DP1-$b$, and DP1-$c$ and the direction of the pixel pitch PP1.

As illustrated in FIG. 10, the period of the moire interference fringe has an extreme maximum value each time the angles formed by the distance directions DP1-$a$, DP1-$b$, and DP1-$c$ and the direction of the pixel pitch PP1 are 60 degrees when the light-diffusing member 15 is rotated.

Figure 11:
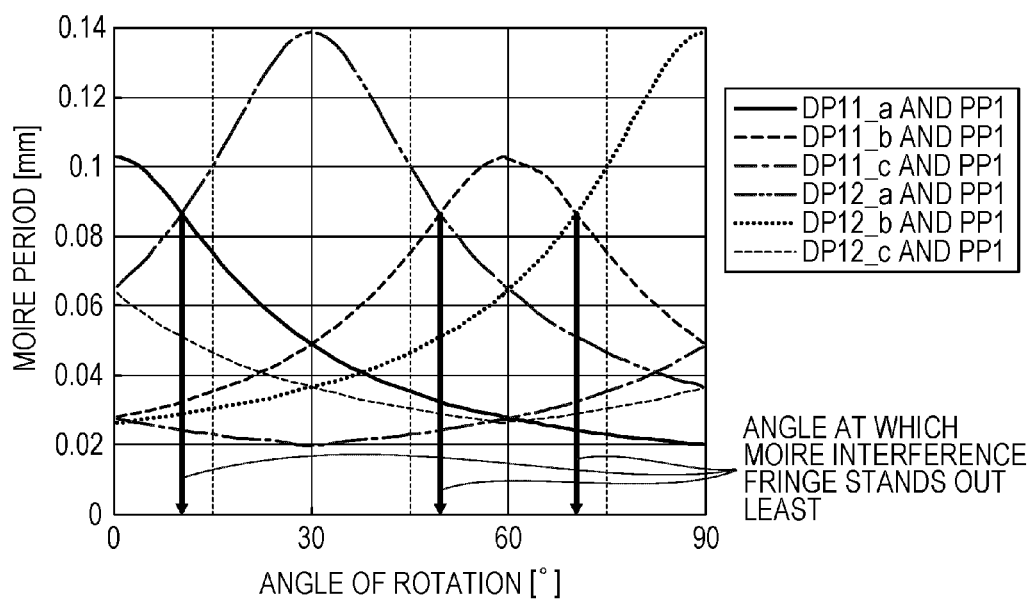
FIG. 11 is a graph illustrating a relationship between a pitch (period) of a moire interference fringe and an angle formed by a direction of a pixel pitch of the liquid crystal panel and a direction of movement from a dot of a light shielding layer to the closest dot thereof.
Figure 12:
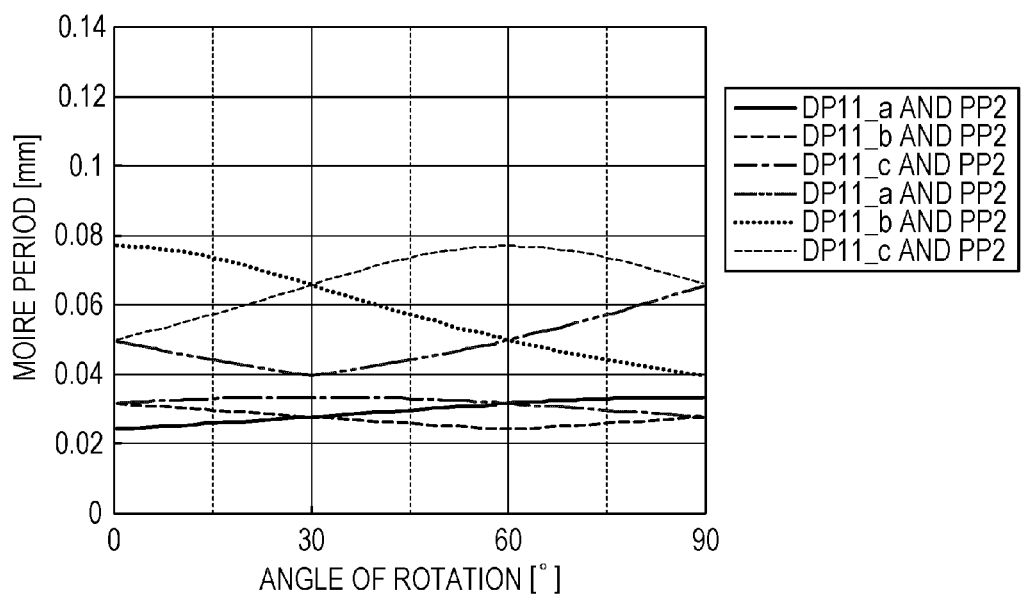
FIG. 12 is a graph illustrating a relationship between a pitch (period) of a moire interference fringe and an angle formed by a direction of a pixel pitch of the liquid crystal panel and a direction of movement from a dot of a light shielding layer to the closest dot thereof.

FIG. 11 is a graph illustrating a relationship between the period of the moire interference fringe occurring in the liquid crystal display device 10 and the angles formed by the distance directions DP1-$a$, DP1-$b$, DP1-$c$, DP2-$a$, DP2-$b$, and DP2-$c$ and the direction of the pixel pitch PP1. FIG. 12 is a graph illustrating a relationship between the period of the moire interference fringe occurring in the liquid crystal display device 10 and the angles formed by the distance directions DP1-$a$, DP1-$b$, DP1-$c$, DP2-$a$, DP2-$b$, and DP2-$c$ and the direction of the pixel pitch PP2.

What is understood from FIG. 11 and FIG. 12 is that the period of the moire interference fringe formed by the angles between the distance directions DP1-$a$, DP1-$b$, DP1-$c$, DP2-$a$, DP2-$b$, and DP2-$c$ and the direction of the pixel pitch PP1 is greater than the period of the moire interference fringe formed by the angles between the distance directions DP1-$a$, DP1-$b$, DP1-$c$, DP2-$a$, DP2-$b$, and DP2-$c$ and the direction of the pixel pitch PP2.

Thus, the moire interference fringe stands out the least in the liquid crystal display device 10 by adjusting the angle of rotation of the light-diffusing member 15 with respect to the liquid crystal panel 13 in such a manner that the period of the moire interference fringe formed by the angles between the distance directions DP1-$a$, DP1-$b$, DP1-$c$, DP2-$a$, DP2-$b$, and DP2-$c$ and the direction of the pixel pitch PP1 is minimized.

As illustrated in FIG. 11, the moire interference fringe stands out the least when the angle formed by the distance direction DP1-$a$ and the direction of the pixel pitch PP1 is set to 10 degrees, 50 degrees, or 70 degrees.

A method for measuring the direction of strong scattering of the light-diffusing member 15 will be described with reference to FIG. 13 and FIG. 14.

Figure 13:
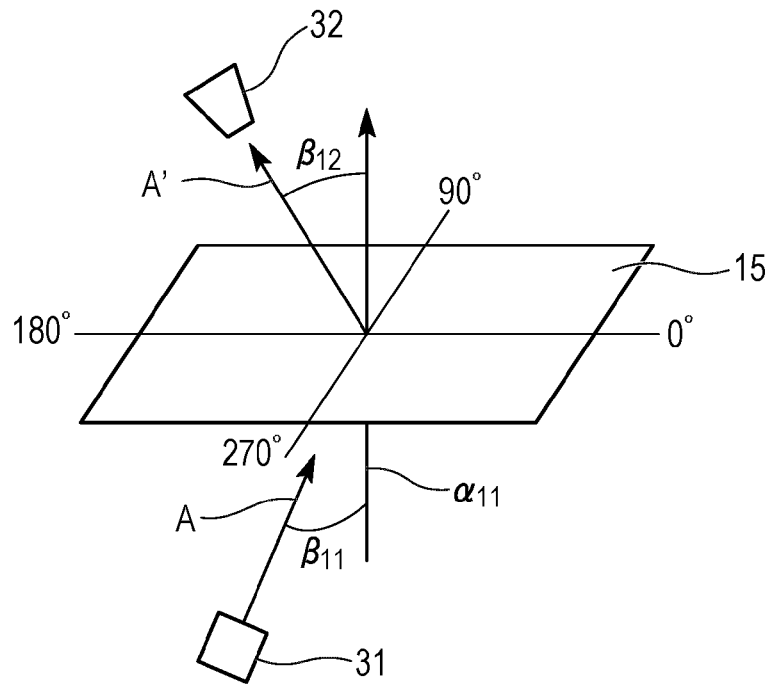
FIG. 13 is a diagram illustrating a method for measuring a direction of strong scattering of the light-diffusing member.

The normal of the light-diffusing member 15 is designated by a reference sign $\alpha_{11}$ in FIG. 13.

In this method for measuring the direction of strong scattering, the light source 31 irradiates the light-diffusing member 15 with parallel light A. At this time, the angle (light projection angle) formed by the normal $\alpha_{11}$ of the light-diffusing member 15 (normal of the one face 20$a$ of the substrate 20 constituting the light-diffusing member) and the parallel light A is designated by a reference sign $\beta_{11}$. The parallel light A that is incident on the light-diffusing member 15 is scattered by the light-diffusing member 15. A part of the parallel light A is emitted as parallel light A' to the side of the light-diffusing member 15 opposite to the side on which the parallel light A is incident and is received by a light receiver 32. At this time, the angle (light reception angle) formed by the normal $\alpha_{11}$ of the light-diffusing member 15 and the parallel light A' is designated by a reference sign $\beta_{12}$.

Figure 14:
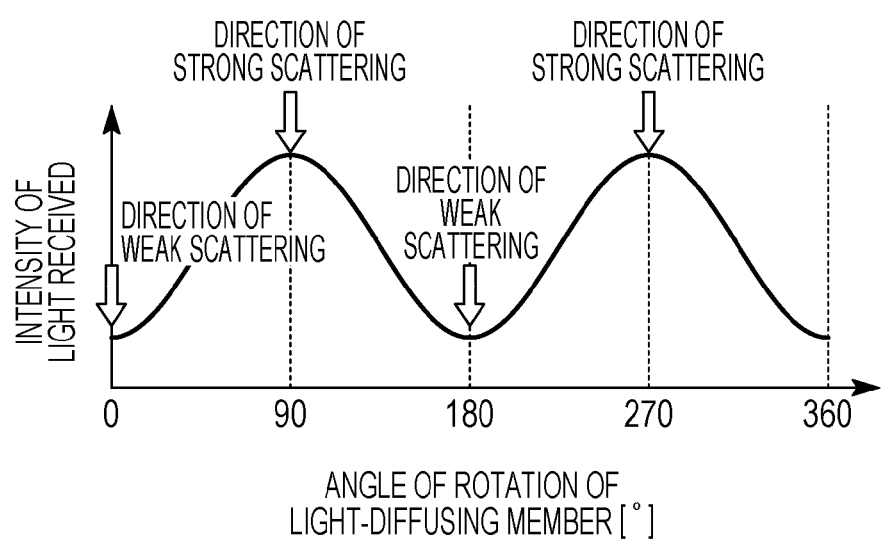
FIG. 14 is a graph illustrating a relationship between an angle of rotation of the light-diffusing member on the liquid crystal panel and the intensity of light received.

When the light-diffusing member 15 is rotated around the normal $\alpha_{11}$ after fixing the intensity and the light projection angle $\beta_{11}$ of the parallel light A emitted from the light source 31 and fixing the light reception angle $\beta_{12}$ of the parallel light A' received by the light receiver 32, there exist a direction in which the intensity of light received is relatively high and a direction in which the intensity of light received is relatively small as illustrated in FIG. 14. The direction in which the intensity of light received is high will be referred to as a direction of strong scattering, and the direction in which the intensity of light received is small will be referred to as a direction of weak scattering.

In this method for measuring the direction of strong scattering, the normal direction of the light-diffusing member 15, the direction (direction of light projection) in which the parallel light A is projected onto the light-diffusing member 15 from the light source 31, and the direction (direction of light reception) in which the light receiver 32 receives the parallel light A' from the light-diffusing member 15 are arranged on the same plane.

As such, the light-diffusing member 15 is an anisotropic light-diffusing member in which the intensity of scattering of the light-diffusing unit 22 has the direction of strong scattering and the direction of weak scattering when viewed from the normal direction thereof.

A method for measuring the direction of a recurring period of the light shielding layers 21 will be described with reference to FIG. 15 and FIG. 16.

Figure 15:
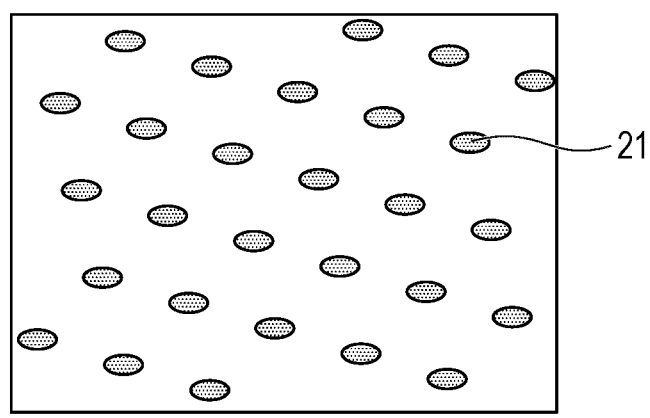
FIG. 15 is a diagram illustrating a method for measuring a direction of a recurring period of light shielding layers.

In this method for measuring the direction of the recurring period, an image of the light shielding layers 21 is captured within a range that is larger than the recurring period of the light shielding layers 21 (the pitch between each light shielding layer 21) as illustrated in FIG. 15.

Figure 16:
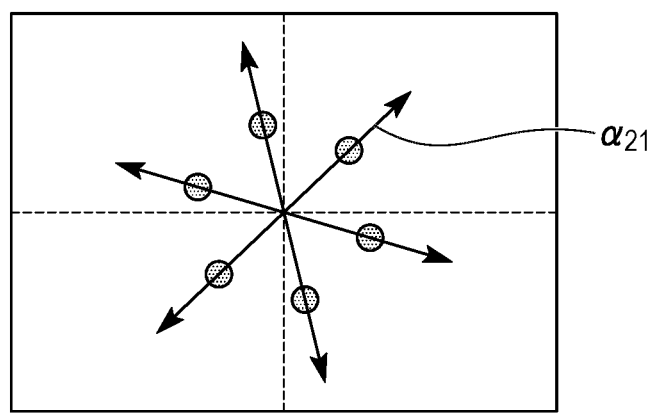
FIG. 16 is a diagram illustrating a method for measuring a direction of a recurring period of light shielding layers.

Next, the image is two-dimensionally Fourier-transformed, and the direction from the center of FIG. 16, representing power with a tint, to a bright point at which power is high as illustrated in FIG. 16 (the direction of a straight line indicated by a reference sign $\alpha 21$ in FIG. 16) is obtained as the direction of the recurring period.

Generally, a thermoplastic polymer or a resin such as a thermosetting resin or a photopolymerizable resin is used as the substrate 20 constituting the light-diffusing member 15. It is also possible to use an appropriate transparent resin (light-transmissive) substrate that is configured of an acryl-based polymer, an olefin-based polymer, a vinyl-based polymer, a cellulose-based polymer, an amide-based polymer, a fluorine-based polymer, an urethane-based polymer, a silicon-based polymer, an imide-based polymer, or the like.

For example, a transparent resin substrate such as a triacetylcellulose (TAC) film, a polyethylene terephthalate (PET) film, a cyclo olefin polymer (COP) film, a polycarbonate (PC) film, a polyethylene naphthalate (PEN) film, a polyethersulfone (PES) film, or a polyimide (PI) film or a glass substrate is preferably used as the substrate 20.

The thickness of the substrate 20 is preferably small to the extent not impairing thermal tolerance or mechanical strength. The reason is that a display may be blurred as the thickness of the substrate 20 is greater. In addition, the total light transmittance of the substrate 20 is preferably greater than or equal to 90% in the JIS K7361-1 standard. Sufficient transparency is obtained when the total light transmittance is greater than or equal to 90%.

The light shielding layers 21 are configured of an organic material such as a black resist that has light absorbing ability and photosensitivity. In addition, the light shielding layers 21 may be formed by using a metal film such as a chromium (Cr) film or a multilayer film of Cr or of Cr oxide, a pigment or a dye used in a black ink, and a black-based ink in which multiple color inks are mixed. Materials other than these having light blocking ability can also be used as the material of the light shielding layers 21.

The light-diffusing unit 22 is formed by curing a negative photosensitive resin that is applied to the one face 20a of the substrate 20. The negative photosensitive resin is exemplified as an organic material having light transmissivity and photosensitivity such as an acrylic resin or an epoxy resin.

The light-scattering layer 23 is a layer on the other face 20b of the substrate 20 that is configured by dispersing multiple light-scattering bodies such as acrylic beads in a binder resin such as an acrylic resin.

The thickness of the light-scattering layer 23, for example, is approximately 0.5 to 20 μm. When the light-scattering body has a spherical shape, the diameter of the light-scattering body is approximately 0.5 to 20 μm. The light-scattering layer 23 is an isotropic diffusion material. The light-scattering layer 23 isotropically diffuses light diffused by the light-diffusing unit 22 and spreads the light at a further wide angle.

The light-scattering body is not limited to an acrylic bead and may be configured of an appropriate transparent substance such as a resin piece configured of an acryl-based polymer, an olefin-based polymer, a vinyl-based polymer, a cellulose-based polymer, an amide-based polymer, a fluorine-based polymer, an urethane-based polymer, a silicon-based polymer, or an imide-based polymer; an inorganic minute particle configured of a titanium oxide or a zinc oxide; a glass bead; or the like.

In addition to these transparent substances, a scattering body that does not absorb light or a reflective body can be used as the light-scattering body.

The shape of each light-scattering body can be formed into one of various shapes such as a spherical shape, an ellipsoidal shape, a plate shape, and a polygonal cubic shape. The light-scattering bodies may be formed to have either a uniform size or a non-uniform size.

Hereinafter, a specific configuration of the liquid crystal panel 13 will be described.

While an active matrix transmissive liquid crystal panel will be described as the liquid crystal panel 13, a liquid crystal panel applicable to the present invention is not limited to an active matrix transmissive liquid crystal panel. A liquid crystal panel applicable to the present invention, for example, may be a semi-transmissive (dual-purpose for transmission and reflection) liquid crystal panel or a reflective liquid crystal panel or, furthermore, may be a simple matrix liquid crystal panel in which each pixel does not include a thin-film transistor (hereinafter, abbreviated to "TFT") for switching.

Figure 17:
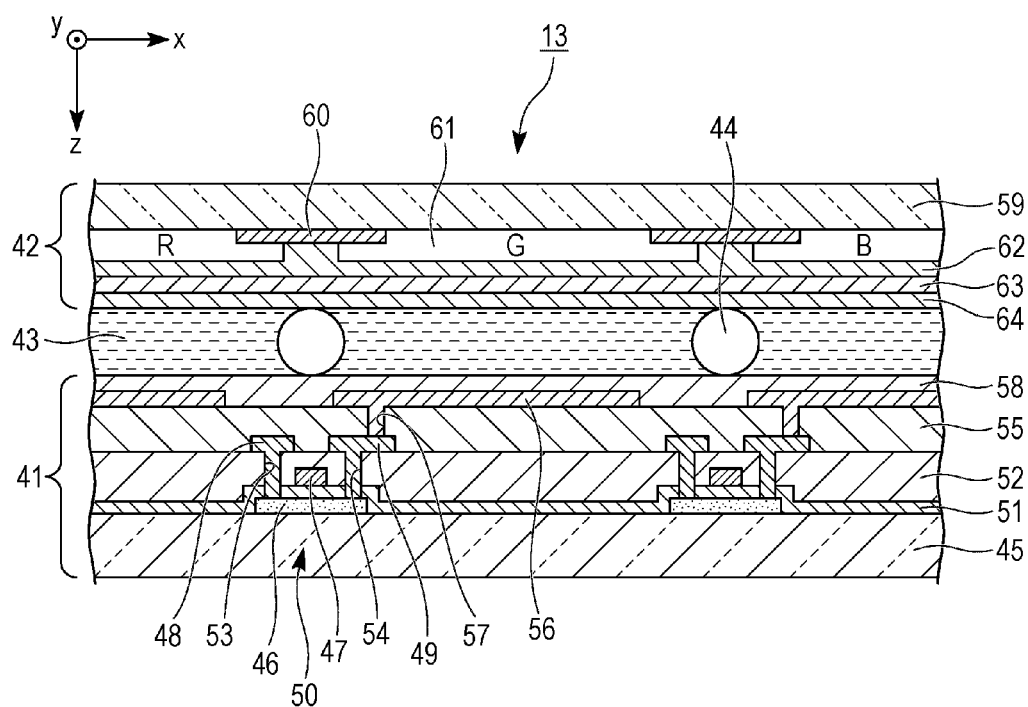
FIG. 17 is a vertical sectional view of the liquid crystal panel.

FIG. 17 is a vertical sectional view of the liquid crystal panel 13.

The liquid crystal panel 13, as illustrated in FIG. 17, includes a TFT substrate 41 (corresponds to the TFT substrate 16 in FIG. 1) as a switching element substrate, a color filter substrate 42 (corresponds to the color filter substrate 17 in FIG. 1) that is arranged to face the TFT substrate 41, and a liquid crystal layer 43 that is interposed between the TFT substrate 41 and the color filter substrate 42. The liquid crystal layer 43 is sealed in a space that is surrounded by the TFT substrate 41, the color filter substrate 42, and a frame seal member (not illustrated) that bonds the TFT substrate 41 and the color filter substrate 42 at a predetermined interval. The liquid crystal panel 13 of the present embodiment, for example, is a twisted nematic (TN) display. A spherical spacer 44 is arranged in the liquid crystal layer 43, between the TFT substrate 41 and the color filter substrate 42 in which a vertical alignment liquid crystal having negative dielectric anisotropy is used, in order to maintain a constant interval between these substrates. The type of display is not limited to the TN type. For example, a vertical alignment (VA) type, a super twisted nematic (STN) type, or an in-plane switching (IPS) type can be used.

A pixel (not illustrated) that is the minimum unit area of display is arranged in plural quantities into a matrix in the TFT substrate 41. In the TFT substrate 41, a plurality of source bus lines (not illustrated) is formed to extend parallel to each other, and a plurality of gate bus lines (not illustrated) is formed to extend parallel to each other and orthogonal to the plurality of source bus lines.

Therefore, the plurality of source bus lines and the plurality of gate bus lines are formed into a lattice shape on the TFT substrate 41, and a rectangular area that is defined by adjacent source bus lines and adjacent gate bus lines is one pixel. The source bus lines are connected to a source electrode of a TFT described later, and the gate bus lines are connected to a gate electrode of the TFT.

A TFT 50 that includes a semiconductor layer 46, a gate electrode 47, a source electrode 48, a drain electrode 49, and the like is formed on the liquid crystal layer 43 side face of a transparent substrate 45 that constitutes the TFT substrate 41.

A glass substrate, for example, can be used as the transparent substrate 45. The semiconductor layer 46 that is configured of a semiconductor material such as continuous grain silicon (CGS), low-temperature poly-silicon (LPS), or amorphous silicon (α-Si) is formed on the transparent substrate 45. In addition, a gate insulating layer 51 is formed on the transparent substrate 45 to cover the semiconductor layer 46. For example, a silicon oxide film, a silicon nitride film, or a laminated film thereof is used as the material of the gate insulating layer 51.

The gate electrode 47 is formed on the gate insulating layer 51 to face the semiconductor layer 46. For example, a laminated film of tungsten (W) or tantalum nitride (TaN), molybdenum (Mo), titanium (Ti), or aluminum (Al) is used as the material of the gate electrode 47.

A first interlayer insulating layer 52 is formed on the gate insulating layer 51 to cover the gate electrode 47. For example, a silicon oxide film, a silicon nitride film, or a laminated film thereof is used as the material of the first interlayer insulating layer 52.

The source electrode 48 and the drain electrode 49 are formed on the first interlayer insulating layer 52. The source electrode 48 is connected to a source area of the semiconductor layer 46 through a contact hole 53 that passes through the first interlayer insulating layer 52 and the gate insulating layer 51. Similarly, the drain electrode 49 is connected to a drain area of the semiconductor layer 46 through a contact hole 54 that passes through the first interlayer insulating layer 52 and the gate insulating layer 51.

The same conductive material as the gate electrode 47 is used as the material of the source electrode 48 and of the drain electrode 49.

A second interlayer insulating layer 55 is formed on the first interlayer insulating layer 52 to cover the source electrode 48 and the drain electrode 49. The same material as the first interlayer insulating layer 52 or an organic insulating material is used as the material of the second interlayer insulating layer 55.

A pixel electrode 56 is formed on the second interlayer insulating layer 55. The pixel electrode 56 is connected to the drain electrode 49 through a contact hole 57 that passes through the second interlayer insulating layer 55. Thus, the pixel electrode 56 is connected to the drain area of the semiconductor layer 46 with the drain electrode 49 as a relay electrode.

A transparent conductive material such as indium tin oxide (ITO) or indium zinc oxide (IZO) is used as the material of the pixel electrode 56.

According to this configuration, a scan signal is supplied through the gate bus lines, and an image signal that is supplied to the source electrode 48 through the source bus lines is supplied to the pixel electrode 56 via the semiconductor layer 46 and the drain electrode 49 when the TFT 50 goes into an ON state. An alignment layer 58 is formed on an entire face of the second interlayer insulating layer 55 to cover the pixel electrode 56. The alignment layer 58 has alignment regulating force that vertically aligns liquid crystal molecules constituting the liquid crystal layer 43. The type of TFT may be a bottom gate TFT illustrated in FIG. 17 or may be a top gate TFT.

Meanwhile, a black matrix 60, a color filter 61, a flattening layer 62, a counter-electrode 63, and an alignment layer 64 are formed in order on the liquid crystal layer 43 side face of a transparent substrate 59 that constitutes the color filter substrate 42.

The black matrix 60 has a function of blocking transmission of light in an area between pixels and is formed by a metal such as chromium (Cr) or a multilayer film of Cr or of Cr oxide or by a photoresist in which carbon particles are dispersed in a photosensitive resin.

The color filter 61 includes color elements for each of red (R), green (G), and blue (B). The color filter 61 having one of R, G, and B is arranged to face one pixel electrode 56 on the TFT substrate 41.

The flattening layer 62 is configured of an insulating film covering the black matrix 60 and the color filter 61 and has a function of reducing and flattening steps caused by the black matrix 60 and the color filter 61.

The counter-electrode 63 is formed on the flattening layer 62. The same transparent conductive material as the pixel electrode 56 is used as the material of the counter-electrode 63.

The alignment layer 64 having vertical alignment regulating force is formed on an entire face of the counter-electrode 63. The color filter 61 may be configured to have three colors of R, G, and B or more colors.

As illustrated in FIG. 1(A), the backlight 11 includes a light source 71, such as a light-emitting diode or a cold cathode tube, and a light guide plate 72 that emits light emitted from the light source 71 toward the liquid crystal panel 13 by using internal reflection of the light. The backlight 11 may be an edge-lit type in which a light source is arranged on an end face of a light guide or may be a direct-lit type in which a light source is arranged directly under the liquid crystal panel 13. The backlight 11 used in the present embodiment is desirably a backlight that has directivity by controlling the direction of emission of light, a so-called directional backlight. Using a directional backlight that causes collimated or approximately collimated light to be incident on the light-diffusing unit 23 of the light-diffusing member 15 can reduce blurriness and, furthermore, increase efficiency in use of light. The directional backlight can be realized by optimizing the shape, arrangement, and the like of a reflection pattern formed in the light guide plate 72. The first polarization plate 12 that functions as a polarizer is disposed between the backlight 11 and the liquid crystal panel 13. The second polarization plate 14 that functions as an analyzer is disposed between the liquid crystal panel 13 and the light-diffusing member 15.

While the present embodiment is described in a case where the second polarization plate 14 is disposed between the substrate 20 of the light-diffusing member 15 and the liquid crystal panel 13, a member that has a refractive index residing between the refractive index of the substrate 20 and the refractive index of the second polarization plate 14 may be interposed between the substrate 20 and the second polarization plate 14.

The liquid crystal panel 13 is a TN type in which light distribution characteristics do not have directional symmetry in the present embodiment.

The direction in which the anisotropy of the liquid crystal panel 13 is strong is approximately parallel to the direction of strong scattering of the light-diffusing member 15.

Next, a method for manufacturing a liquid crystal display device will be described.

Figure 18:
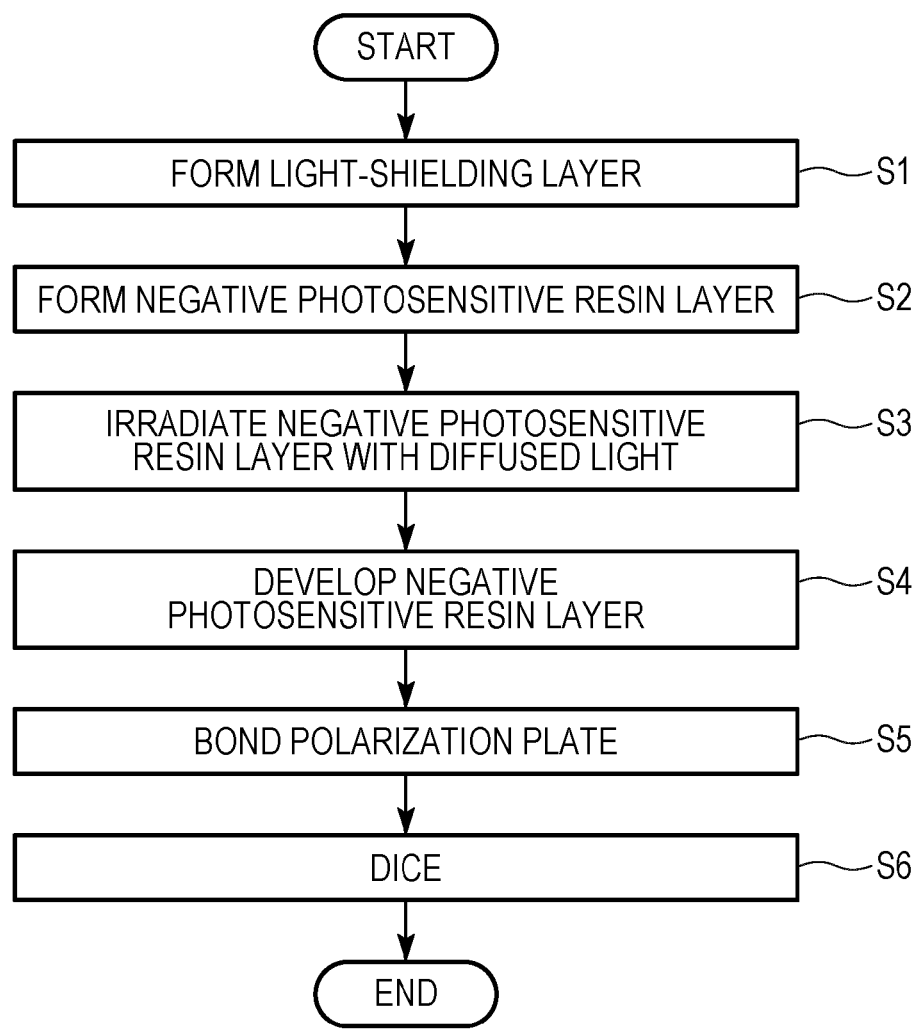
FIG. 18 is a flowchart illustrating a method for manufacturing the light-diffusing member.
Figure 19:
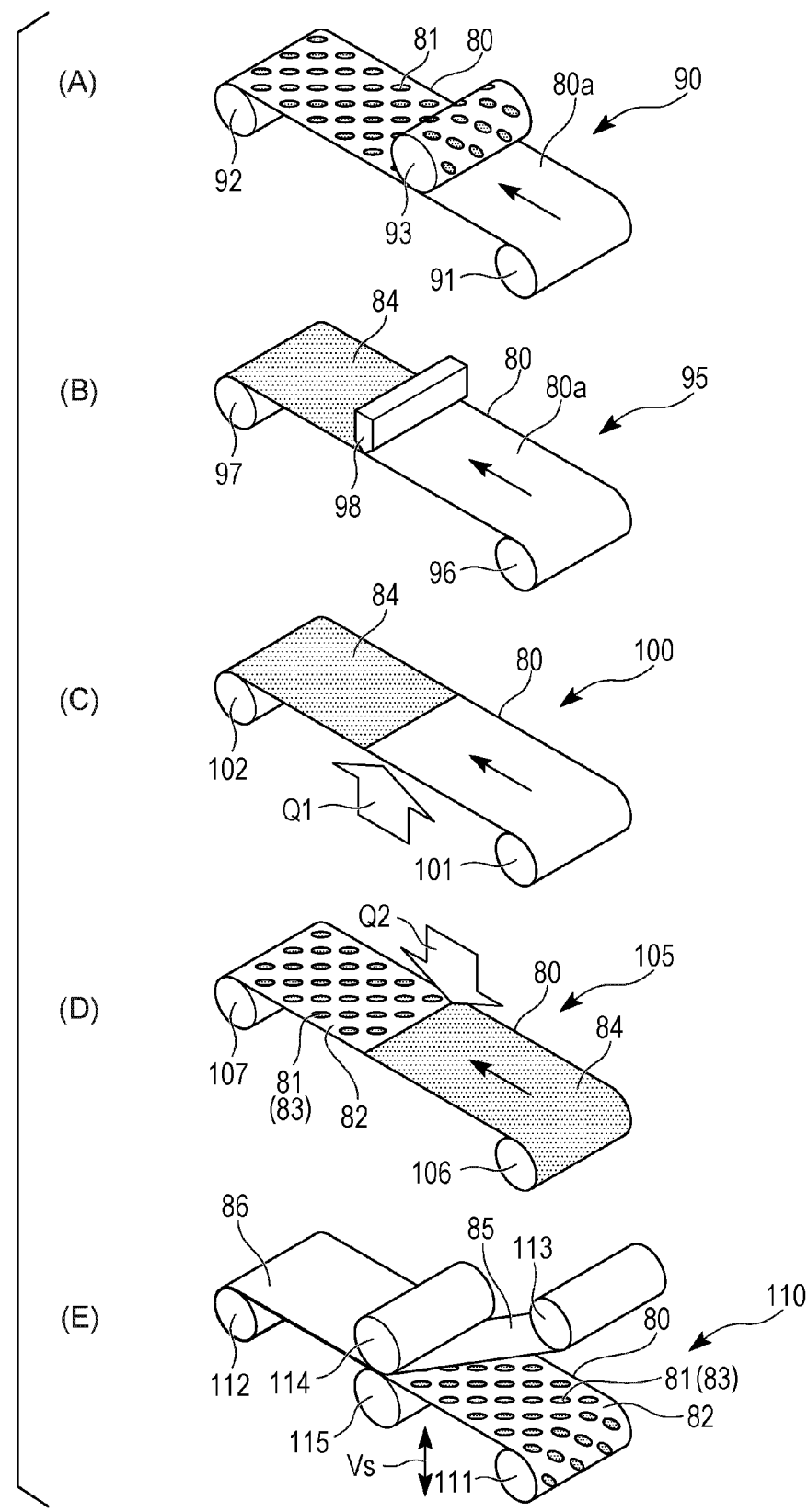
FIG. 19 is a perspective view illustrating steps for manufacturing the light-diffusing member in order.

FIG. 18 is a flowchart illustrating a method for manufacturing the light-diffusing member 15.

FIGS. 19(A) to 19(E) are perspective views illustrating steps for manufacturing the light-diffusing member 15 in order.

A method for manufacturing the liquid crystal display device 10 will be described with a main focus on the steps for manufacturing the light-diffusing member 15 that constitutes the liquid crystal display device 10 having the above configuration.

A summary of steps for manufacturing the liquid crystal panel 13 will be described beforehand.

First, each of the TFT substrate 41 and the color filter substrate 42 illustrated in FIG. 17 is manufactured. Then, the face of the TFT substrate 41 where the TFT 50 is formed and the face of the color filter substrate 42 where the color filter 61 is formed are arranged to face each other. Then, the TFT substrate 41 and the color filter substrate 42 are bonded through a seal member. Then, a liquid crystal is injected into a space that is surrounded by the TFT substrate 41, the color filter substrate 42, and the seal member. The liquid crystal panel 13 is completed through the steps thus far.

Then, the first polarization plate 12 is bonded to the TFT substrate 41 side outer face of the manufactured liquid crystal panel 13 by using an optical adhesive or the like.

A method for manufacturing the TFT substrate 41 or the color filter substrate 42 may use a known usual method and, thus, will not be described.

Next, the steps for manufacturing the light-diffusing member 15 will be described.

As illustrated in FIG. 19(A) to 19(E), the light-diffusing member 15 is manufactured by a manufacturing apparatus that includes a printing equipment 90, an applying equipment 95, a light exposure equipment 100, a developing equipment 105, and a polarization plate laminating equipment 110 through various processes performed by these devices in this order.

As illustrated in FIG. 19(A), the printing equipment 90 transports a long substrate 80 in a roll-to-roll manner and, meanwhile, performs a printing process. A forwarding roller 91 that forwards the substrate 80 is disposed at one end of the printing equipment 90, and a winding roller 92 that winds the substrate 80 is disposed at the other end thereof. The substrate 80 is configured to move from the forwarding roller 91 toward the winding roller 92. A printing roller 93 is disposed above the substrate 80.

As illustrated in FIG. 19(B), the applying equipment 95 transports the substrate 80 on which the printing process is performed in a roll-to-roll manner and, meanwhile, performs an application process. A forwarding roller 96 that forwards the substrate 80 is disposed at one end of the applying equipment 95, and a winding roller 97 that winds the substrate 80 is disposed at the other end thereof. The substrate 80 is configured to move from the forwarding roller 96 toward the winding roller 97. A slit coater 98 is disposed above the substrate 80.

As illustrated in FIG. 19(C), the light exposure equipment 100 transports the substrate 80 on which the application process is performed in a roll-to-roll manner and, meanwhile, performs an exposure process. A forwarding roller 101 that forwards the substrate 80 is disposed at one end of the light exposure equipment 100, and a winding roller 102 that winds the substrate 80 is disposed at the other end thereof. The substrate 80 is configured to move from the forwarding roller 101 toward the winding roller 102. A light source (not illustrated) that emits diffused light Q1 is disposed below the substrate 80.

As illustrated in FIG. 19(D), the developing equipment 105 transports the substrate 80 on which the exposure process is performed in a roll-to-roll manner and, meanwhile, performs a development process. A forwarding roller 106 that forwards the substrate 80 is disposed at one end of the developing equipment 105, and a winding roller 107 that winds the substrate 80 is disposed at the other end thereof. The substrate 80 is configured to move from the forwarding roller 106 toward the winding roller 107. A device (not illustrated) that discharges a development liquid Q2 is disposed above the substrate 80.

As illustrated in FIG. 19(E), the polarization plate laminating equipment 110 transports the substrate 80 on which the development process is performed (substrate of the light-diffusing member) in a roll-to-roll manner and, meanwhile, performs a polarization plate bonding process (process of bonding a substrate of the second polarization plate). A first forwarding roller 111 that forwards the substrate 80 is disposed at one end of the polarization plate laminating equipment 110, and a winding roller 112 that winds the substrate on which the polarization plate bonding process is performed is disposed at the other end thereof. The substrate 80 is configured to move from the forwarding roller 111 toward the winding roller 112. A second forwarding roller 113 that forwards a substrate of the second polarization plate is disposed above the substrate 80. A pair of bonding rollers 114 and 115 that bonds the substrate of the light-diffusing member and the substrate of the second polarization plate is disposed on a transport path of the substrate 80.

First, for example, a substrate configured of triacetylcellulose is prepared as the long substrate 80.

Next, light shielding layers 81 that are configured of a black resin including carbon or of a black ink as a material of a light shielding layer are transferred onto one face 80a of the substrate 80 from the printing roller 93 by using the printing equipment 90 illustrated in FIG. 19(A). The planar shape of the light shielding layers 81 is an elliptic shape.

In the present embodiment, the printing equipment 90 performs printing in such a manner that the direction of a recurring period of the light shielding layers 81 (light shielding layers 21) is non-parallel to the direction of strong scattering of the light-diffusing member 15. For example, printing is performed in such a manner that the direction of a long axis of the light shielding layer 81 is inclined with respect to the direction of the length of the substrate 80 (direction of the substrate 80 transported) at approximately 45 degrees or 135 degrees.

Printing such as gravure printing, offset printing, or gravure offset printing is used in formation of the light shielding layer 81 with the printing equipment 90.

Accordingly, the plurality of light shielding layers 21 is formed on the one face 80a of the substrate 80 (step S1 illustrated in FIG. 18).

The light shielding layers 81 having an elliptic shape correspond to an area where a light-diffusing unit 82 is not formed (cavity 83) in the next step. The interval (pitch) between adjacent light shielding layers 81 is arranged at a recurring period. The interval (pitch) between the light shielding layers 81 is desirably smaller than the interval (pitch) between the pixels of the liquid crystal panel 13. Accordingly, at least one light shielding layer 81 (light shielding layer 21) is formed within a pixel. Thus, for example, a wide viewing angle can be obtained when the light-diffusing member 15 is combined with a small pixel pitch liquid crystal panel used in a mobile device or the like.

While the light shielding layers 81 are formed by using printing in the present embodiment, the present embodiment is not limited thereto. The light shielding layers 81 can be formed by photolithography using a black negative resist in addition to printing in the present embodiment. In this case, a positive resist having light absorbing ability can also be used if a photomask in which an opening pattern and a light-blocking pattern are inverted is used. In addition, the light shielding layers 81 may be directly formed by using vapor deposition, screen printing, ink jetting, or the like.

Next, a transparent negative resist configured of an acrylic resin as a material of a light-diffusing unit is applied to the one face 80a of the substrate 80 by using the applying equipment 95 and the slit coater 98 illustrated in FIG. 19(B) in order to cover the plurality of light shielding layers 81. Accordingly, a coating film (negative photosensitive resin layer) 84 is formed (step S2 illustrated in FIG. 18).

While the transparent negative resist is formed by using a slit coater in the present embodiment, the present embodiment is not limited thereto. The transparent negative resist may be formed by using spin coating or printing in the present embodiment.

Next, the coating film 84 is irradiated with the diffused light Q1 with the plurality of light shielding layers 81, having an elliptic shape as the planar shape thereof, as a mask by using the light exposure equipment 100 illustrated in FIG. 19(C) and thereby is exposed to light (step S3 illustrated in FIG. 18). At this time, a light exposure equipment using an i-line having a wavelength of 365 nm, an h-line having a wavelength of 404 nm, and a g-line having a wavelength of 436 nm is used. The amount of light exposure is 500 mJ/cm$^2$.

Next, the coating film 84 configured of a transparent negative resist is developed by the developing equipment 105 illustrated in FIG. 19(D) using the dedicated development liquid Q2 and is post-baked at 100° C. to form the light-diffusing unit 81 having a plurality of cavities 83 on the one face 80a of the substrate 80 (step S4 illustrated in FIG. 18).

As illustrated in FIG. 19(C), since the exposure is performed by using diffused light in the present embodiment, the transparent negative resist constituting the coating film 84 is radially exposed outward from the area where the light shielding layers 81 are not formed. Accordingly, the cavities 83 having a normally tapered shape are formed. The light-diffusing unit 82 (light-diffusing unit 22 illustrated in FIG. 1 and FIG. 2) has an inversely tapered shape. The inclination angle of a side face (reflective face) of the light-diffusing unit 82 can be controlled by the degree of diffusion of the diffused light.

Parallel light, diffused light, or light in which intensity at a specific emission angle is different from intensity at another emission angle, that is, light that has high or low intensity at a specific emission angle can be used as the light Q1 used herein. In a case of using parallel light, the inclination angle of the reflective face of the light-diffusing unit 82 is a single inclination angle approximately between 60° and 90°. In a case of using diffused light, the reflective face is configured as an inclined face having an inclination angle changing continuously and having a curved sectional shape. In a case of using light that has high or low intensity at a specific emission angle, the reflective face is configured as an inclined face having an inclination angle corresponding to the high or low intensity of the light. By so doing, the inclination angle of the reflective face of the light-diffusing unit 82 can be adjusted. Accordingly, light diffusing ability of the light-diffusing member 15 can be adjusted so that target visibility can be obtained.

One of means for irradiating the substrate 80 with parallel light as the diffused light Q1 emitted from the light exposure equipment 100 is exemplified by a combination of the light exposure equipment 100 and a diffusion plate of a haze of approximately 50 that is arranged on the optical path of light emitted from the light exposure equipment 100. This combination enables irradiation with light that is emitted through the diffusion plate from the light exposure equipment 100.

Accordingly, a substrate of the light-diffusing member 15 (light-diffusing substrate) is completed through the steps of FIGS. 19(A) to 19(D). The total light transmittance of the light-diffusing member 15 is preferably greater than or equal to 90%. When the total light transmittance is greater than or equal to 90%, sufficient transparency is obtained, and optical performance of the light-diffusing member 15 required can be sufficiently exhibited. The total light transmittance is defined by the JIS K7361-1 standard.

Next, a substrate 85 of the second polarization plate 14 is bonded to the light incident end face 22b of the light-diffusing unit 22 in the substrate of the light-diffusing member 15 through an adhesive layer by using the polarization plate laminating equipment 110 illustrated in FIG. 19(E) (step S5 illustrated in FIG. 18).

Then, the light-diffusing member 15 having a size corresponding to the plan-view size of the liquid crystal display device 10 is diced by cleaving a bonded body 86 that results from bonding the substrate of the light-diffusing member 15 and the substrate 85 of the second polarization plate 14 (step S6 illustrated in FIG. 18).

Figure 20:
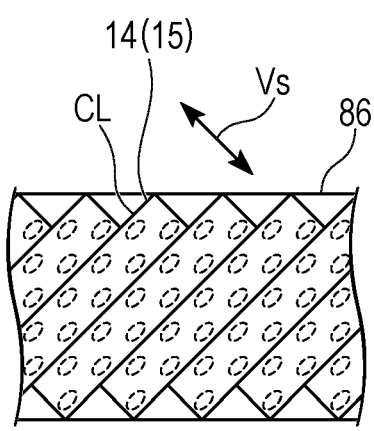
FIG. 20 is a diagram illustrating a step of dicing the light-diffusing member in manufacturing of the light-diffusing member.

In this step, the light-diffusing member 15 is diced in such a manner that a direction Vs of strong scattering of the light-diffusing member 15 is parallel to one edge of the second polarization plate 14 as illustrated in FIG. 20.

For example, as illustrated in FIG. 20, the bonded body 86 is cleaved along an imaginary cleaving line CL in such a manner that the direction Vs of an azimuth at which diffusing ability of the substrate of the light-diffusing member 15 is relatively high is approximately parallel to (or matches) a short edge of the exterior shape of the light-diffusing member 15 after being diced.

According to the steps thus far, the light-diffusing member 15 is completed.

Last, the completed light-diffusing member 15 is bonded to the liquid crystal panel 13 by using an optical adhesive or the like in a state where the substrate 20 is directed to the visible side while the second polarization plate 14 faces the liquid crystal panel 13 as illustrated in FIG. 1.

According to the steps thus far, the liquid crystal display device 10 according to the present embodiment is obtained. In the liquid crystal display device 10 that is manufactured as such, the periodic direction at which the light shielding layers 21 are recurrently formed is non-parallel to the direction of the pixel pitch of the liquid crystal panel 13.

While the light-diffusing member 15 is manufactured by cleaving the bonded body 86, resulting from bonding the substrate of the light-diffusing member 15 to the substrate 85 of the second polarization plate 14, at the plan-view size of the liquid crystal display device 10 in the present embodiment, the present embodiment is not limited thereto. For example, in the present embodiment, the light-diffusing member 15 may be manufactured by, after cleaving each of the substrate of the light-diffusing member 15 and the substrate 85 of the second polarization plate 14 at the plan-view size of the liquid crystal display device 10, bonding the light-diffusing member 15 and the second polarization plate 14 in such a manner that the periodic direction at which the light shielding layers 21 are recurrently formed is non-parallel to the direction of the pixel pitch of the liquid crystal panel 13.

While the liquid crystal display device 10 is formed by, after forming the light-diffusing member 15 in which the second polarization plate 14 and the light-diffusing member 15 are bonded, bonding the light-diffusing member 15 to the liquid crystal panel 13, the present embodiment is not limited thereto. For example, in the present embodiment, the liquid crystal display device 10 may be manufactured by, after forming the light-diffusing member 15 by cleaving the substrate of the light-diffusing member 15 at the plan-view size of the liquid crystal display device 10 after the steps of FIGS. 19(A) to 19(D), bonding the light-diffusing member 15 to the liquid crystal panel 13 to which the second polarization plate 14 is bonded in advance.

While the present embodiment is described in a case where the light-diffusing member 15 includes the substrate 20 having light transmissivity, the plurality of light shielding layers 21 that is formed on the one face 20a of the substrate 20, and the light-diffusing unit 22 that is formed in an area of the one face 20a of the substrate 20 except for the area where the light shielding layers 21 are formed, the present embodiment is not limited thereto. The light-diffusing member 15 may include the substrate 20 having light transmissivity, a plurality of light-diffusing units 22 that is formed at a recurring period on the one face 20a of the substrate 20, and the light shielding layer 21 that is formed in an area of the one face 20a of the substrate 20 except for the area where the light-diffusing units 22 are formed in the present embodiment.

In this case, the method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(2) Second Embodiment

Hereinafter, a second embodiment of the present invention will be described by using FIG. 21 and FIG. 22.

In the present embodiment, a liquid crystal display device that includes a transmissive liquid crystal display element will be described as an example of the display device.

In all of the drawings below, dimensions of elements may be illustrated on a different scale for easy viewing of each element.

Figure 21:
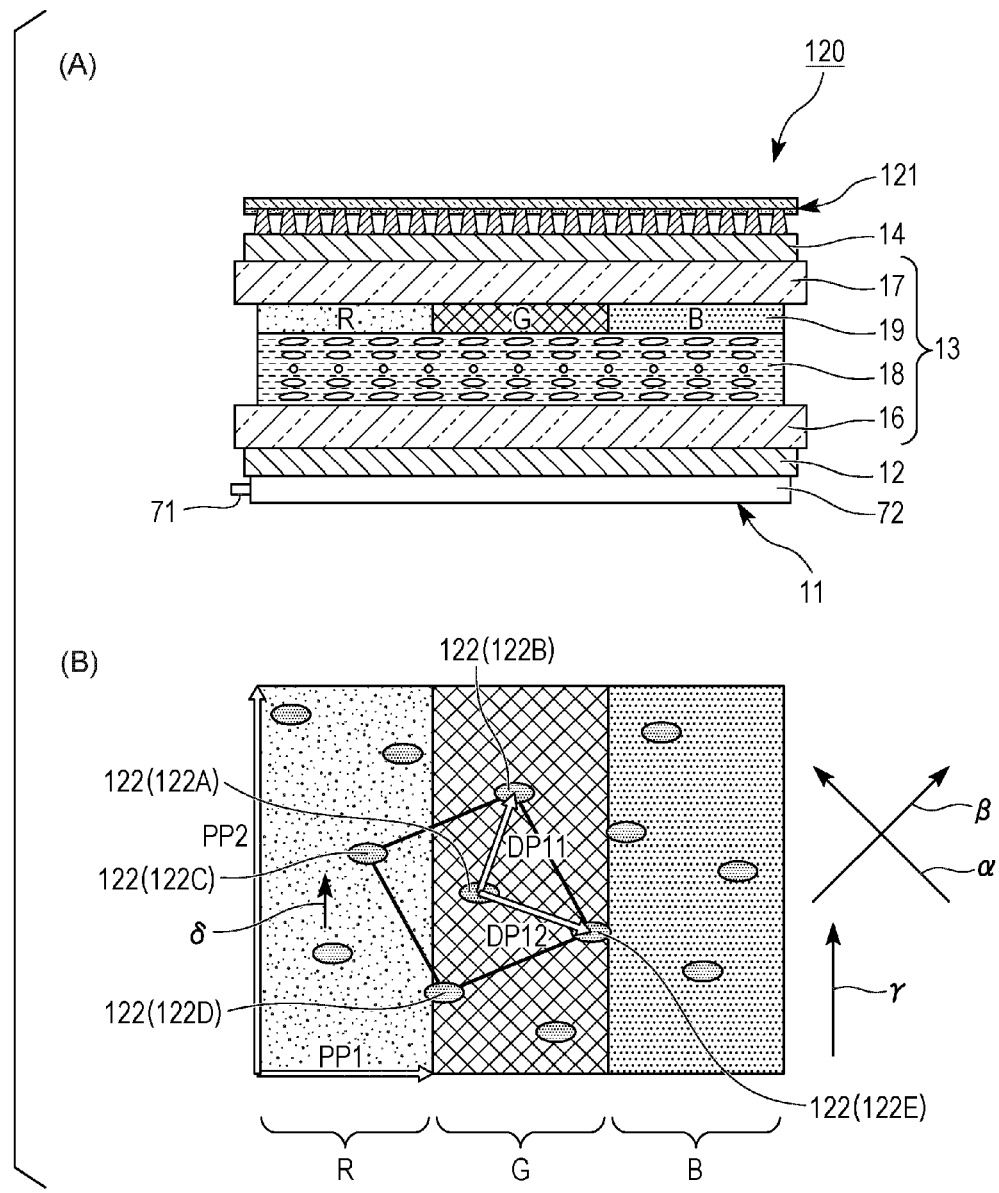
FIG. 21 is a schematic diagram illustrating a liquid crystal display device of a second embodiment.
Figure 22:
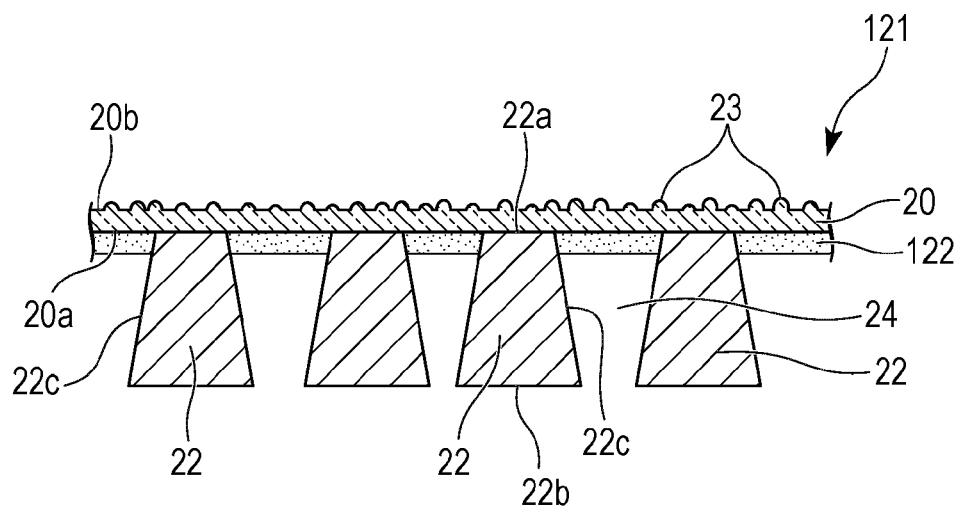
FIG. 22 is a sectional view of a light-diffusing member of the second embodiment.

The same configuration as illustrated in FIG. 1 will be designated by the same reference sign in FIG. 21 and will not be described further. In addition, the same configuration illustrated in FIG. 2 will be designated by the same reference sign in FIG. 22 and will not be described further.

FIG. 21 is a schematic diagram illustrating a liquid crystal display device of the present embodiment: FIG. 21(A) is a sectional view of the liquid crystal display device of the present embodiment, and FIG. 21(B) is a plan view of the liquid crystal display device of the present embodiment. FIG. 22 is a sectional view of a light-diffusing member of the present embodiment.

A liquid crystal display device (display device) 120 of the present embodiment is schematically configured of the backlight (light source) 11, the first polarization plate 12, the liquid crystal panel 13, the second polarization plate 14, and a light-diffusing member 121.

The light-diffusing member 121 is schematically configured of the substrate 20 having light transmissivity, a plurality of light shielding layers 122 that is formed on the one face 20a of the substrate 20, the light-diffusing unit 22 that is formed in an area of the one face 20a of the substrate 20 except for the area where the light shielding layers 122 are formed, and the light-scattering layer 23 that is formed on the other face (face on the visible side) 20b of the substrate 20.

The liquid crystal panel 13 of the present embodiment is a TN type in which light distribution characteristics do not have directional symmetry.

The direction in which the anisotropy of the liquid crystal panel 13 is strong is approximately parallel to the direction of strong scattering of the light-diffusing member 121.

As illustrated in FIG. 21(B), in the light-diffusing member 121, the planar shape of the light shielding layers 122 viewed from the normal direction of the other face 20b of the substrate 20 is an anisotropic shape having at least a long axis and a short axis (long and narrow elliptic shape).

The light shielding layers 122 are arranged at a predetermined period. For example, as illustrated in FIG. 21(B), four dots 122B, 122C, 122D, and 122E of the light shielding layers 122 are arranged to have four-fold rotational symmetry around one dot 122A of the light shielding layers 122.

The periodic direction at which the light shielding layers 122, that is, the dots 122A, 122B, 122C, 122D, 122E, and the like constituting the light shielding layers 122, are recurrently formed is non-parallel to the direction of the pixel pitch of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 21(B).

The dots 122B, 122C, 122D, and 122E are arranged to form an approximately square shape in the present embodiment. At this time, as illustrated in FIG. 21(B), for example, the direction of the pixel pitch PP1 and the direction of the pixel pitch PP2 are non-parallel to the distance (pitch) direction DP11 from the dot 122A to one dot 122B of the closest dots. In addition, the direction of the pixel pitch PP1 and the direction of the pixel pitch PP2 are non-parallel to the distance (pitch) direction DP12 from the dot 122A to one dot 122E of the closest dots.

The shape of each dot (dots 122A, 122B, 122C, 122D, 122E, and the like) constituting the light shielding layers 122 is not limited to a long and narrow elliptic shape and, as illustrated in FIG. 4, may be a long and narrow oblong shape, a long and narrow octagonal shape, a shape in which two facing edges of a long and narrow oblong are curved outward, a shape in which two oblongs having different aspect ratios intersect in two orthogonal directions, an isosceles triangular shape, a rhombus shape, or the like.

In addition, a plurality of types of light shielding layer of different sizes and shapes having various directions of anisotropy may coexist by making the planar shape of each light shielding layer 122 different from each other.

In addition, the planar shape of the light shielding layers 122 viewed from the normal direction of the one face 20a of the substrate 20 of the light-diffusing member 121 may be an isotropic shape while the side shape of the light shielding layers 122 is an anisotropic shape having a long axis and a short axis.

The period (interval or pitch) at which the light shielding layers 122 are arranged is preferably smaller than the pixel pitches PP1 and PP2.

Specifically, the interval (pitch) from the dot 122A to the dot 122B and the interval (pitch) from the dot 122A to the dot 122E are preferably smaller than the pixel pitches PP1 and PP2.

Accordingly, at least one light shielding layer 122 is formed within a pixel.

According to the present embodiment, the direction of the pixel pitch PP1 and the direction of the pixel pitch PP2 are non-parallel to the interval (pitch) direction DP11 of the interval from the dot 122A to the dot 122B, and the direction of the pixel pitch PP1 and the direction of the pixel pitch PP2 are non-parallel to the interval (pitch) direction DP12 of the interval from the dot 122A to the dot 122E. Thus, moire interference fringes do not stand out in the liquid crystal display device 120, and the visibility of the liquid crystal display device 120 can be improved. In addition, according to the present embodiment, since the four dots 122B, 122C, 122D, and 122E of the light shielding layers 122 are arranged to have four-fold rotational symmetry, the angular range in which moire interference fringes can be reduced is increased.

While the present embodiment is described in a case where the light-diffusing member 121 includes the substrate 20 having light transmissivity, the plurality of light shielding layers 122 that is formed on the one face 20a of the substrate 20, and the light-diffusing unit 22 that is formed in an area of the one face 20a of the substrate 20 except for the area where the light shielding layers 122 are formed, the present embodiment is not limited thereto. The light-diffusing member 121 may include the substrate 20 having light transmissivity, a plurality of light-diffusing units 22 that is formed at a recurring period on the one face 20a of the substrate 20, and the light shielding layer 122 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(3) Third Embodiment

Hereinafter, a third embodiment of the present invention will be described by using FIG. 23 and FIG. 24.

In the present embodiment, a liquid crystal display device that includes a transmissive liquid crystal display element will be described as an example of the display device.

In all of the drawings below, dimensions of elements may be illustrated on a different scale for easy viewing of each element.

Figure 23:
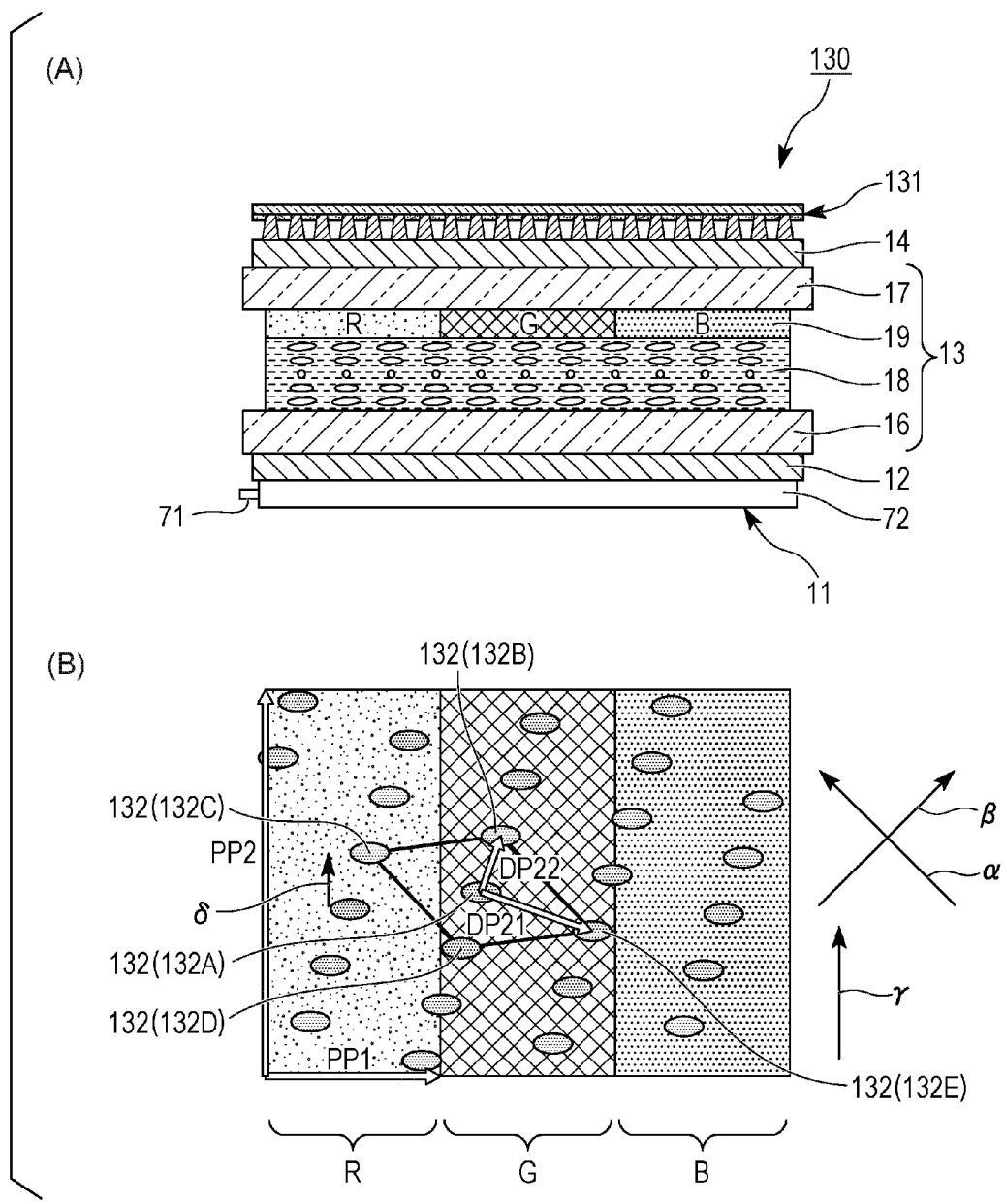
FIG. 23 is a schematic diagram illustrating a liquid crystal display device of a third embodiment.
Figure 24:
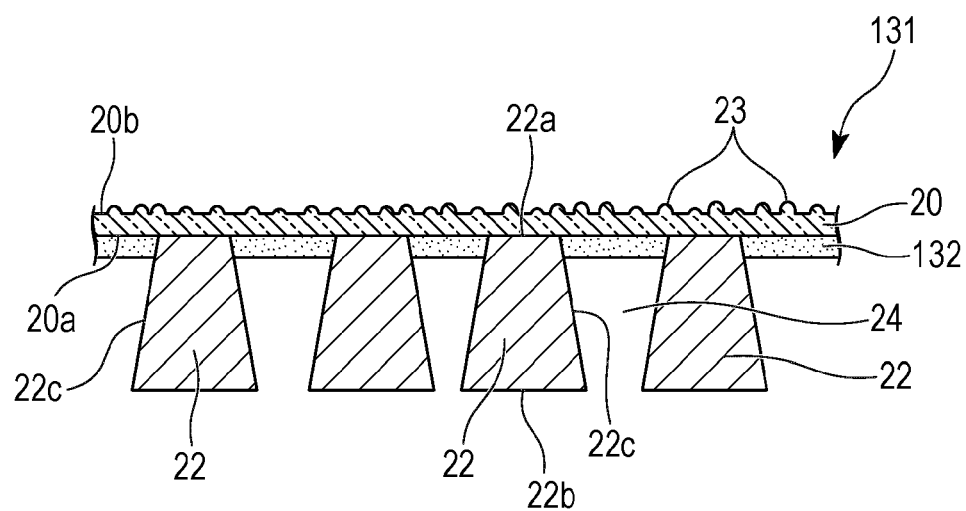
FIG. 24 is a sectional view of a light-diffusing member of the third embodiment.

The same configuration as illustrated in FIG. 1 will be designated by the same reference sign in FIG. 23 and will not be described further. In addition, the same configuration illustrated in FIG. 2 will be designated by the same reference sign in FIG. 24 and will not be described further.

FIG. 23 is a schematic diagram illustrating a liquid crystal display device of the present embodiment: FIG. 23(A) is a sectional view of the liquid crystal display device of the present embodiment, and FIG. 23(B) is a plan view of the liquid crystal display device of the present embodiment. FIG. 24 is a sectional view of a light-diffusing member of the present embodiment.

A liquid crystal display device (display device) 130 of the present embodiment is schematically configured of the backlight (light source) 11, the first polarization plate 12, the liquid crystal panel 13, the second polarization plate 14, and a light-diffusing member 131.

The light-diffusing member 131 is schematically configured of the substrate 20 having light transmissivity, a plurality of light shielding layers 132 that is formed on the one face 20a of the substrate 20, the light-diffusing unit 22 that is formed in an area of the one face 20a of the substrate 20 except for the area where the light shielding layers 132 are formed, and the light-scattering layer 23 that is formed on the other face (face on the visible side) 20b of the substrate 20.

The liquid crystal panel 13 of the present embodiment is a TN type in which light distribution characteristics do not have directional symmetry.

The direction in which the anisotropy of the liquid crystal panel 13 is strong is approximately parallel to the direction of strong scattering of the light-diffusing member 131.

As illustrated in FIG. 23(B), in the light-diffusing member 131, the planar shape of the light shielding layers 132 viewed from the normal direction of the other face 20b of the substrate 20 is an anisotropic shape having at least a long axis and a short axis (long and narrow elliptic shape).

The light shielding layers 132 are arranged at a predetermined period. For example, as illustrated in FIG. 23(B), four dots 132B, 132C, 132D, and 132E of the light shielding layers 132 are arranged to have two-fold rotational symmetry around one dot 132A of the light shielding layers 132.

The periodic direction at which the light shielding layers 132, that is, the dots 132A, 132B, 132C, 132D, 132E, and the like constituting the light shielding layers 132, are recurrently formed is non-parallel to the direction of the pixel pitch of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 23(B).

The dots 132B, 132C, 132D, and 132E are arranged to form an approximately rhombus shape in the present embodiment. At this time, the direction of the pixel pitch PP1 and the direction of the pixel pitch PP2 are non-parallel to a distance (pitch) direction DP22 of the distance from the dot 132A to the closest dot 132B as illustrated in FIG. 23(B) in the present embodiment. In addition, the direction of the pixel pitch PP1 and the direction of the pixel pitch PP2 are non-parallel to a distance (pitch) direction DP21 of the distance from the dot 132A to the second closest dot 132E.

The shape of each dot (dots 132A, 132B, 132C, 132D, 132E, and the like) constituting the light shielding layers 132 is not limited to a long and narrow elliptic shape and, as illustrated in FIG. 4, may be a long and narrow oblong shape, a long and narrow octagonal shape, a shape in which two facing edges of a long and narrow oblong are curved outward, a shape in which two oblongs having different aspect ratios intersect in two orthogonal directions, an isosceles triangular shape, a rhombus shape, or the like.

In addition, a plurality of types of light shielding layer of different sizes and shapes having various directions of anisotropy may coexist by making the planar shape of each light shielding layer 132 different from each other.

In addition, the planar shape of the light shielding layers 132 viewed from the normal direction of the one face 20a of the substrate 20 of the light-diffusing member 131 may be an isotropic shape while the side shape of the light shielding layers 132 is an anisotropic shape having a long axis and a short axis.

The period (interval or pitch) at which the light shielding layers 132 are arranged is preferably smaller than the pixel pitches PP1 and PP2.

Specifically, the interval (pitch) from the dot 132A to the dot 132B and the interval (pitch) from the dot 132A to the dot 132E are preferably smaller than the pixel pitches PP1 and PP2.

Accordingly, at least one light shielding layer 132 is formed within a pixel.

According to the present embodiment, the direction of the pixel pitch PP1 and the direction of the pixel pitch PP2 are non-parallel to the interval (pitch) direction DP22 of the interval from the dot 132A to the dot 132B, and the direction of the pixel pitch PP1 and the direction of the pixel pitch PP2 are non-parallel to the interval (pitch) direction DP21 of the interval from the dot 132A to the dot 132E. Thus, moire interference fringes do not stand out in the liquid crystal display device 130, and the visibility of the liquid crystal display device 130 can be improved. In addition, according to the present embodiment, since the four dots 132B, 132C, 132D, and 132E of the light shielding layers 132 are arranged to have two-fold rotational symmetry, the angular range in which moire interference fringes can be reduced is increased.

While the present embodiment is described in a case where the light-diffusing member 131 includes the substrate 20 having light transmissivity, the plurality of light shielding layers 132 that is formed on the one face 20a of the substrate 20, and the light-diffusing unit 22 that is formed in an area of the one face 20a of the substrate 20 except for the area where the light shielding layers 132 are formed, the present embodiment is not limited thereto. The light-diffusing member 131 may include the substrate 20 having light transmissivity, a plurality of light-diffusing units 22 that is formed at a recurring period on the one face 20a of the substrate 20, and the light shielding layer 132 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(4) Fourth Embodiment

Hereinafter, a fourth embodiment of the present invention will be described by using FIG. 25 and FIG. 26.

In the present embodiment, a liquid crystal display device that includes a transmissive liquid crystal display element will be described as an example of the display device.

In all of the drawings below, dimensions of elements may be illustrated on a different scale for easy viewing of each element.

Figure 25:
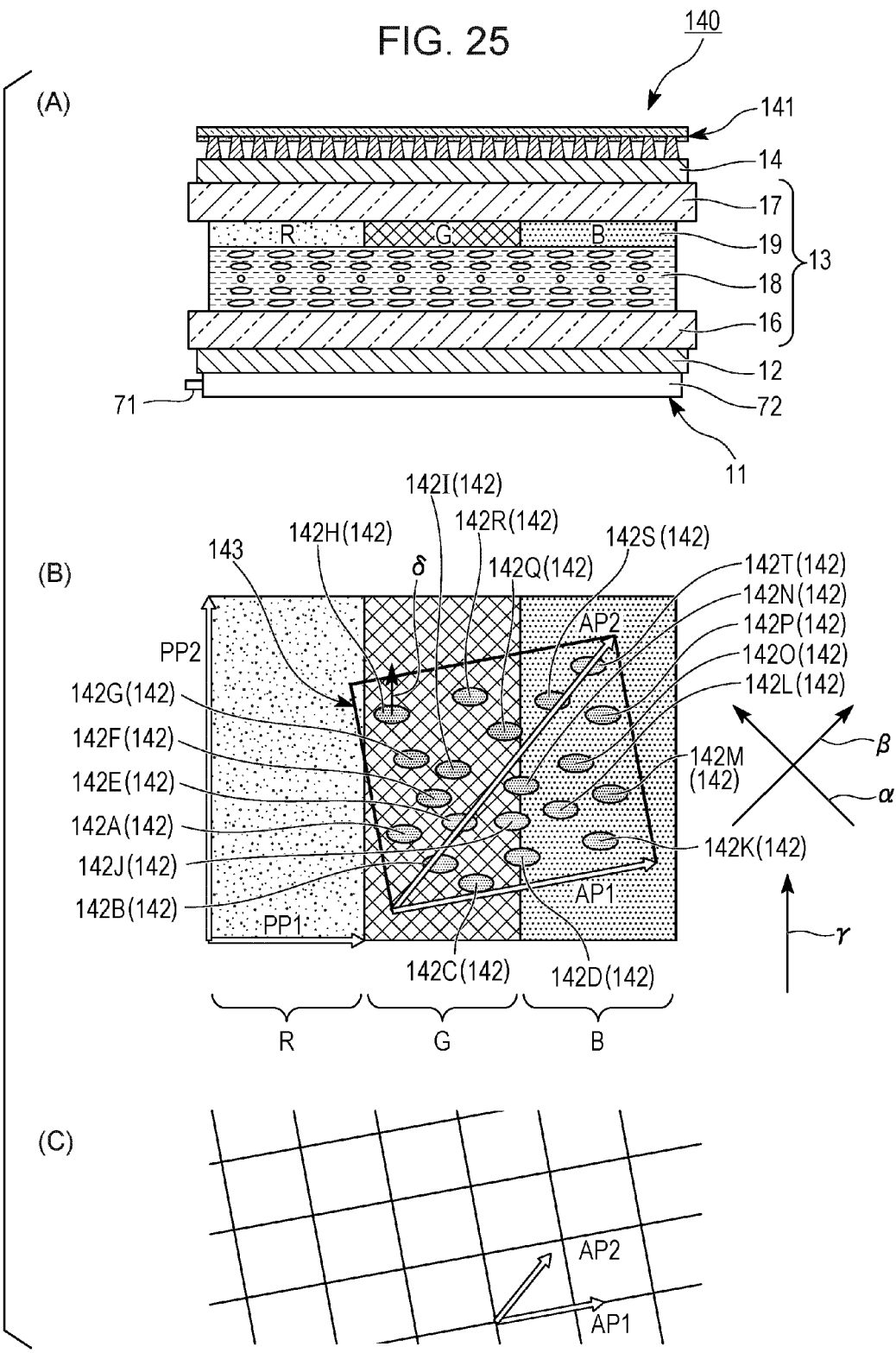
FIG. 25 is a schematic diagram illustrating a liquid crystal display device of a fourth embodiment.
Figure 26:
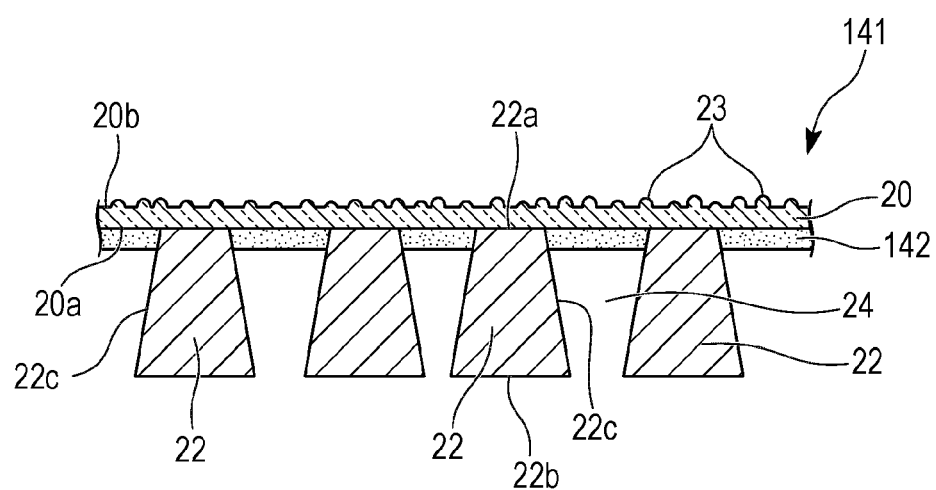
FIG. 26 is a sectional view of a light-diffusing member of the fourth embodiment.

The same configuration as illustrated in FIG. 1 will be designated by the same reference sign in FIG. 25 and will not be described further. In addition, the same configuration illustrated in FIG. 2 will be designated by the same reference sign in FIG. 26 and will not be described further.

FIG. 25 is a schematic diagram illustrating a liquid crystal display device of the present embodiment: FIG. 25(A) is a sectional view of the liquid crystal display device of the present embodiment, and FIGS. 25(B) and 25(C) are plan views of the liquid crystal display device of the present embodiment. FIG. 26 is a sectional view of a light-diffusing member of the present embodiment.

A liquid crystal display device (display device) 140 of the present embodiment is schematically configured of the backlight (light source) 11, the first polarization plate 12, the liquid crystal panel 13, the second polarization plate 14, and a light-diffusing member 141.

The light-diffusing member 141 is schematically configured of the substrate 20 having light transmissivity, a plurality of light shielding layers 142 that is formed on the one face 20a of the substrate 20, the light-diffusing unit 22 that is formed in an area of the one face 20a of the substrate 20 except for the area where the light shielding layers 142 are formed, and the light-scattering layer 23 that is formed on the other face (face on the visible side) 20b of the substrate 20.

The liquid crystal panel 13 of the present embodiment is a TN type in which light distribution characteristics do not have directional symmetry.

The direction in which the anisotropy of the liquid crystal panel 13 is strong is approximately parallel to the direction of strong scattering of the light-diffusing member 141.

As illustrated in FIG. 25(B), in the light-diffusing member 141, the planar shape of the light shielding layers 142 viewed from the normal direction of the other face 20b of the substrate 20 is an anisotropic shape having at least a long axis and a short axis (long and narrow elliptic shape).

While the light shielding layers 142 are randomly arranged when viewed microscopically as illustrated in FIG. 25(B), the plurality of randomly arranged light shielding layers 142 collectively constitutes one group, and the group is arranged at a predetermined period. For example, dots 142A to 142T of the light shielding layers 142 are randomly arranged as illustrated in FIG. 25(B). The plurality of dots 142A to 142T collectively constitutes one group 143, and the group 143 is arranged at a predetermined period.

The periodic direction at which the group 143 configured of the plurality of randomly arranged dots 142A to 142T is recurrently formed (direction of the interval between groups configured of a plurality of dots) is non-parallel to the direction of the pitch pixel of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 25(B).

The present embodiment assumes that the group 143 forms an approximately oblong area. At this time, as illustrated in FIGS. 25(B) and 25(C), for example, the direction of the pixel pitch PP1 and the direction of the pixel pitch PP2 are non-parallel to a length direction AP1 of the length of a long edge of the oblong area forming the group 143. In addition, the direction of the pixel pitch PP1 and the direction of the pixel pitch PP2 are non-parallel to a length direction AP2 of the length of a diagonal of the oblong area forming the group 143. The interval between the groups 143 configured of the plurality of dots 142A to 142T is represented by, when the group 143 forms an approximately oblong area, the length of the long edge or short edge of the oblong area or by the length of the diagonal of the oblong area.

The shape of each dot (dots 142A to 142T and the like) constituting the light shielding layers 142 is not limited to a long and narrow elliptic shape and, as illustrated in FIG. 4, may be a long and narrow oblong shape, a long and narrow octagonal shape, a shape in which two facing edges of a long and narrow oblong are curved outward, a shape in which two oblongs having different aspect ratios intersect in two orthogonal directions, an isosceles triangular shape, a rhombus shape, or the like.

In addition, a plurality of types of light shielding layer of different sizes and shapes having various directions of anisotropy may coexist by making the planar shape of each light shielding layer 142 different from each other.

In addition, the planar shape of the light shielding layers 142 viewed from the normal direction of the one face 20a of the substrate 20 of the light-diffusing member 141 may be an isotropic shape while the side shape of the light shielding layers 142 is an anisotropic shape having a long axis and a short axis.

The interval (pitch) at which the light shielding layers 142 are arranged is preferably smaller than the pixel pitches PP1 and PP2.

Specifically, the interval (pitch) from the dot 142A to the dot 142B and the interval (pitch) from the dot 142A to the dot 142E are preferably smaller than the pixel pitches PP1 and PP2.

Accordingly, at least one light shielding layer 142 is formed within a pixel.

According to the present embodiment, the direction of the pixel pitch PP1 and the direction of the pixel pitch PP2 are non-parallel to the length direction AP1 of the length of the long edge of the oblong area forming the group 143 which is configured of the plurality of dots 142A to 142T constituting the light shielding layers 142, and the direction of the pixel pitch PP1 and the direction of the pixel pitch PP2 are non-parallel to the length direction AP2 of the length of the diagonal of the oblong area forming the group 143 which is configured of the plurality of dots 142A to 142T constituting the light shielding layers 142. Thus, moire interference fringes do not stand out in the liquid crystal display device 140, and the visibility of the liquid crystal display device 140 can be improved. In addition, according to the present embodiment, the plurality of dots 142A to 142T collectively forms one group 143, and the group 143 is arranged at a predetermined period. Thus, the size of design data in manufacturing the light shielding layers 142 can be decreased.

While the present embodiment is described in a case where the light-diffusing member 141 includes the substrate 20 having light transmissivity, the plurality of light shielding layers 142 that is formed on the one face 20a of the substrate 20, and the light-diffusing unit 22 that is formed in an area of the one face 20a of the substrate 20 except for the area where the light shielding layers 142 are formed, the present embodiment is not limited thereto. The light-diffusing member 141 may include the substrate 20 having light transmissivity, a plurality of light-diffusing units 22 that is formed at a recurring period on the one face 20a of the substrate 20, and the light shielding layer 142 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(5) Fifth Embodiment

Hereinafter, a fifth embodiment of the present invention will be described by using FIG. 27 and FIG. 28.

In the present embodiment, a liquid crystal display device that includes a transmissive liquid crystal display element will be described as an example of the display device.

In all of the drawings below, dimensions of elements may be illustrated on a different scale for easy viewing of each element.

Figure 27:
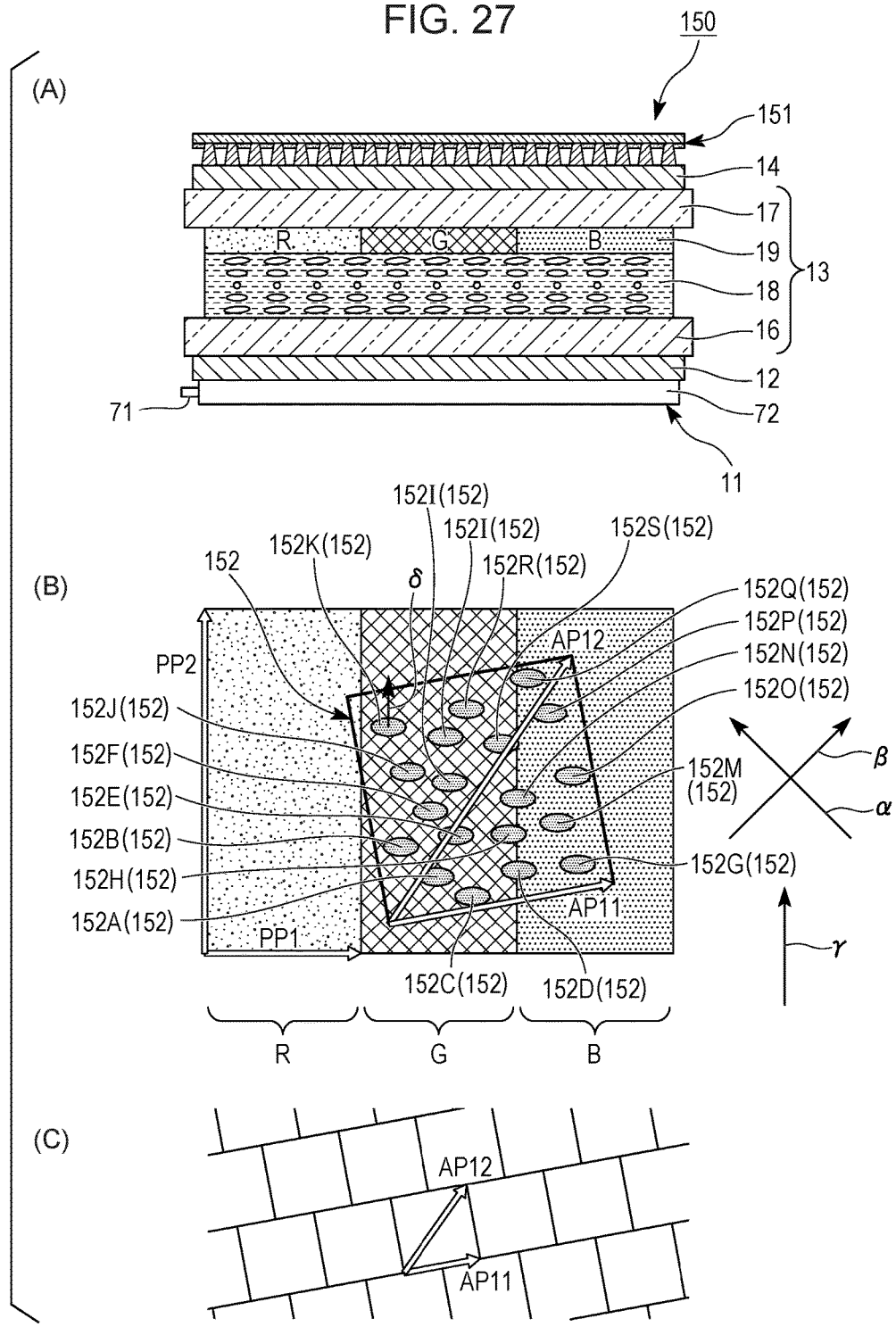
FIG. 27 is a schematic diagram illustrating a liquid crystal display device of a fifth embodiment.
Figure 28:
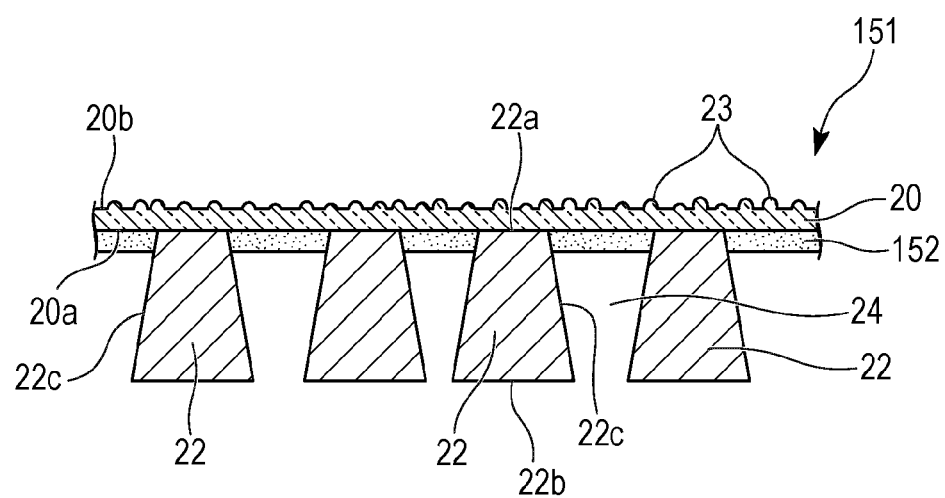
FIG. 28 is a sectional view of a light-diffusing member of the fifth embodiment.

The same configuration as illustrated in FIG. 1 will be designated by the same reference sign in FIG. 27 and will not be described further. In addition, the same configuration illustrated in FIG. 2 will be designated by the same reference sign in FIG. 28 and will not be described further.

FIG. 27 is a schematic diagram illustrating a liquid crystal display device of the present embodiment: FIG. 27(A) is a sectional view of the liquid crystal display device of the present embodiment, and FIGS. 27(B) and 27(C) are plan views of the liquid crystal display device of the present embodiment. FIG. 28 is a sectional view of a light-diffusing member of the present embodiment.

A liquid crystal display device (display device) 150 of the present embodiment is schematically configured of the backlight (light source) 11, the first polarization plate 12, the liquid crystal panel 13, the second polarization plate 14, and a light-diffusing member 151.

The light-diffusing member 151 is schematically configured of the substrate 20 having light transmissivity, a plurality of light shielding layers 152 that is formed on the one face 20a of the substrate 20, the light-diffusing unit 22 that is formed in an area of the one face 20a of the substrate 20 except for the area where the light shielding layers 152 are formed, and the light-scattering layer 23 that is formed on the other face (face on the visible side) 20b of the substrate 20.

The liquid crystal panel 13 of the present embodiment is a TN type in which light distribution characteristics do not have directional symmetry.

The direction in which the anisotropy of the liquid crystal panel 13 is strong is approximately parallel to the direction of strong scattering of the light-diffusing member 151.

As illustrated in FIG. 27(B), in the light-diffusing member 151, the planar shape of the light shielding layers 152 viewed from the normal direction of the other face 20b of the substrate 20 is an anisotropic shape having at least a long axis and a short axis (long and narrow elliptic shape).

While the light shielding layers 152 are randomly arranged when viewed microscopically as illustrated in FIG. 27(B), the plurality of randomly arranged light shielding layers 152 collectively constitutes one group, and the group is arranged at a predetermined period. For example, dots 152A to 152S of the light shielding layers 152 are randomly arranged as illustrated in FIG. 27(B). The plurality of dots 152A to 152S collectively constitutes one group 153, and the group 153 is arranged at a predetermined period.

The periodic direction at which the group 153 configured of the plurality of randomly arranged dots 152A to 152S is recurrently formed (direction of the interval between groups configured of a plurality of dots) is non-parallel to the direction of the pitch pixel of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 27(B).

The present embodiment assumes that the group 153 forms an approximately square area. At this time, as illustrated in FIGS. 27(B) and 27(C), for example, the direction of the pixel pitch PP1 and the direction of the pixel pitch PP2 are non-parallel to a length direction AP11 of the length of one edge of the square area forming the group 153. In addition, the direction of the pixel pitch PP1 and the direction of the pixel pitch PP2 are non-parallel to a length direction AP12 of the length of a diagonal of the square area forming the group 153. The interval between the groups 153 configured of the plurality of dots 152A to 152S is represented by, when the group 153 forms an approximately square area, the length of one edge of the square area or by the length of the diagonal of the square area.

The shape of each dot (dots 152A to 152S and the like) constituting the light shielding layers 152 is not limited to a long and narrow elliptic shape and, as illustrated in FIG. 4, may be a long and narrow oblong shape, a long and narrow octagonal shape, a shape in which two facing edges of a long and narrow oblong are curved outward, a shape in which two oblongs having different aspect ratios intersect in two orthogonal directions, an isosceles triangular shape, a rhombus shape, or the like.

In addition, a plurality of types of light shielding layer of different sizes and shapes having various directions of anisotropy may coexist by making the planar shape of each light shielding layer 152 different from each other.

In addition, the planar shape of the light shielding layers 152 viewed from the normal direction of the one face 20a of the substrate 20 of the light-diffusing member 151 may be an isotropic shape while the side shape of the light shielding layers 152 is an anisotropic shape having a long axis and a short axis.

The interval (pitch) at which the light shielding layers 152 are arranged is preferably smaller than the pixel pitches PP1 and PP2.

Specifically, the interval (pitch) from the dot 152A to the dot 152B and the interval (pitch) from the dot 152A to the dot 152E are preferably smaller than the pixel pitches PP1 and PP2.

Accordingly, at least one light shielding layer 152 is formed within a pixel.

According to the present embodiment, the direction of the pixel pitch PP1 and the direction of the pixel pitch PP2 are non-parallel to the length direction AP11 of the length of one edge of the square area forming the group 153 which is configured of the plurality of dots 152A to 152S constituting the light shielding layers 152, and the direction of the pixel pitch PP1 and the direction of the pixel pitch PP2 are non-parallel to the length direction AP12 of the length of the diagonal of the oblong area forming the group 153 which is configured of the plurality of dots 152A to 152S constituting the light shielding layers 152. Thus, moire interference fringes do not stand out in the liquid crystal display device 150, and the visibility of the liquid crystal display device 150 can be improved. In addition, according to the present embodiment, the plurality of dots 152A to 152S collectively forms one group 153, and the group 153 is arranged at a predetermined period. Thus, the size of design data in manufacturing the light shielding layers 152 can be decreased.

While the present embodiment is described in a case where the light-diffusing member 151 includes the substrate 20 having light transmissivity, the plurality of light shielding layers 152 that is formed on the one face 20a of the substrate 20, and the light-diffusing unit 22 that is formed in an area of the one face 20a of the substrate 20 except for the area where the light shielding layers 152 are formed, the present embodiment is not limited thereto. The light-diffusing member 151 may include the substrate 20 having light transmissivity, a plurality of light-diffusing units 22 that is formed at a recurring period on the one face 20a of the substrate 20, and the light shielding layer 152 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(6) Sixth Embodiment

Hereinafter, a sixth embodiment of the present invention will be described by using FIG. 29 and FIG. 30.

In the present embodiment, a liquid crystal display device that includes a transmissive liquid crystal display element will be described as an example of the display device.

In all of the drawings below, dimensions of elements may be illustrated on a different scale for easy viewing of each element.

Figure 29:
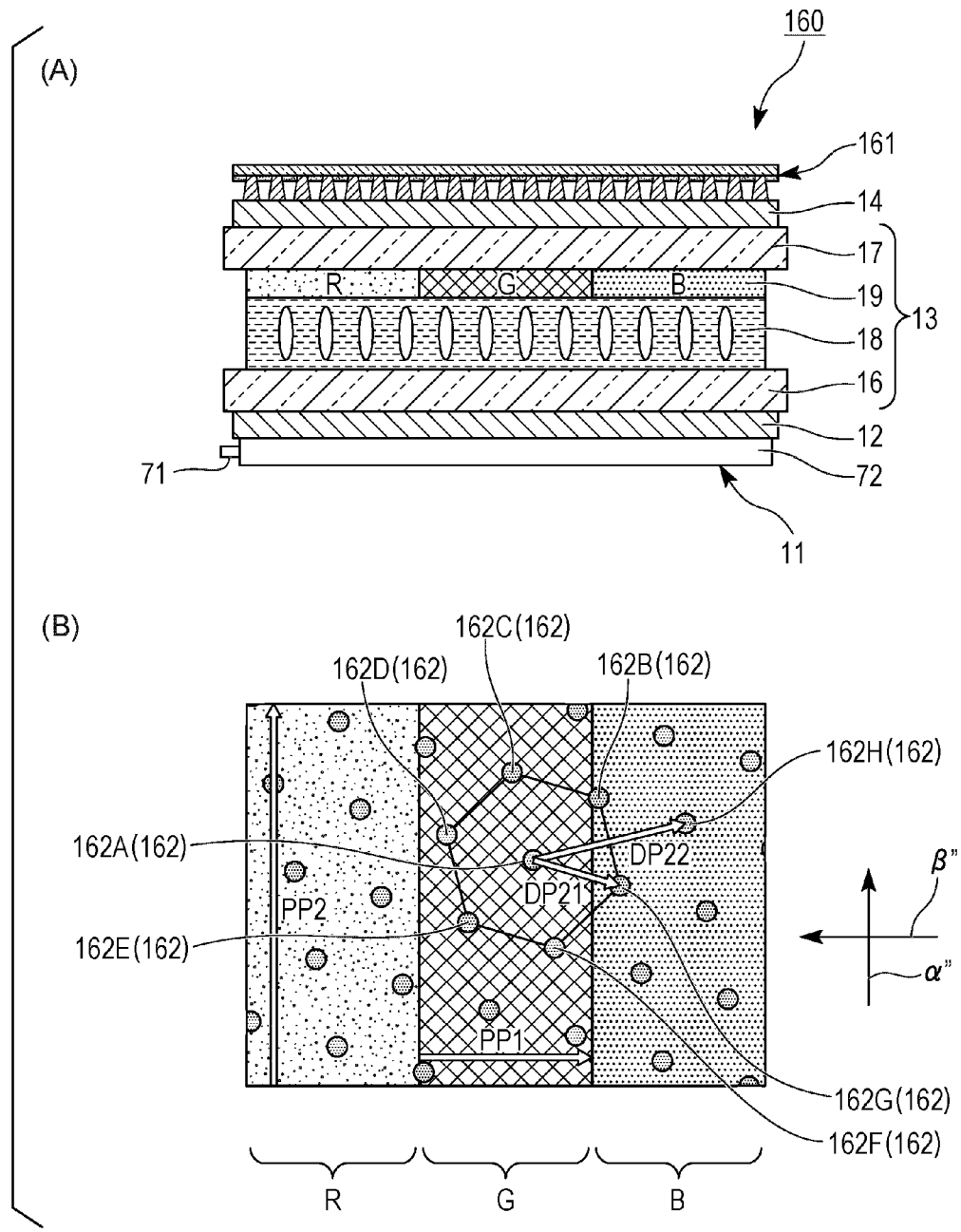
FIG. 29 is a schematic diagram illustrating a liquid crystal display device of a sixth embodiment.
Figure 30:
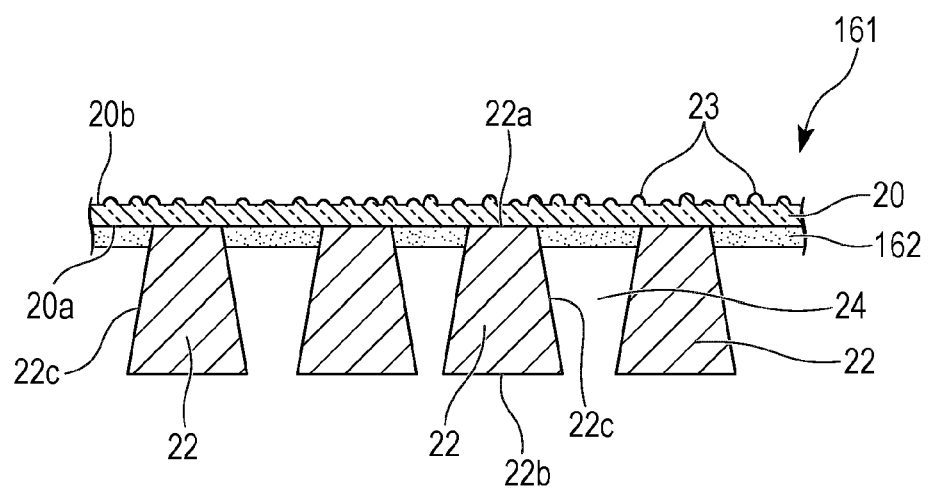
FIG. 30 is a sectional view of a light-diffusing member of the sixth embodiment.

The same configuration as illustrated in FIG. 1 will be designated by the same reference sign in FIG. 29 and will not be described further. In addition, the same configuration illustrated in FIG. 2 will be designated by the same reference sign in FIG. 30 and will not be described further.

FIG. 29 is a schematic diagram illustrating a liquid crystal display device of the present embodiment: FIG. 29(A) is a sectional view of the liquid crystal display device of the present embodiment, and FIG. 29(B) is a plan view of the liquid crystal display device of the present embodiment. FIG. 30 is a sectional view of a light-diffusing member of the present embodiment.

In FIG. 29(B), an arrow α″ indicates the direction of a transmission axis of the first polarization plate 12, and an arrow β″ indicates the direction of a transmission axis of the second polarization plate 14.

A liquid crystal display device (display device) 160 of the present embodiment is schematically configured of the backlight (light source) 11, the first polarization plate 12, the liquid crystal panel 13, the second polarization plate 14, and a light-diffusing member 161.

The light-diffusing member 161 is schematically configured of the substrate 20 having light transmissivity, a plurality of light shielding layers 162 that is formed on the one face 20a of the substrate 20, the light-diffusing unit 22 that is formed in an area of the one face 20a of the substrate 20 except for the area where the light shielding layers 162 are formed, and the light-scattering layer 23 that is formed on the other face (face on the visible side) 20b of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 161.

As illustrated in FIG. 29(B), in the light-diffusing member 161, the planar shape of the light shielding layers 162 viewed from the normal direction of the other face 20b of the substrate 20 is a shape that does not have anisotropy. That is, the shape of each dot (dots 162A, 162B, 162C, 162D, 162E, 162F, 162G, and the like) constituting the light shielding layers 162 is a circular shape.

The light shielding layers 162 are arranged at a predetermined period. For example, as illustrated in FIG. 29(B), six dots 162B, 162C, 162D, 162E, 162F, and 162G of the light shielding layers 162 are arranged around one dot 162A of the light shielding layers 162. In addition, these six dots 162B, 162C, 162D, 162E, 162F, and 162G are arranged to have six-fold rotational symmetry.

The periodic direction at which the light shielding layers 162, that is, the dots 162A, 162B, 162C, 162D, 162E, 162F, 162G, and the like constituting the light shielding layers 162, are recurrently formed is non-parallel to the direction of a pixel pitch of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 29(B).

For example, the direction of the pixel pitch PP1 and the direction of the pixel pitch PP2 are non-parallel to a distance (pitch) direction DP21 of the distance from the dot 162A to the closest dot 162G as illustrated in FIG. 29(B) in the present embodiment. In addition, the direction of the pixel pitch PP1 and the direction of the pixel pitch PP2 are non-parallel to a distance (pitch) direction DP22 of the distance from the dot 162A to the second closest dot 162H.

The period (interval or pitch) at which the light shielding layers 162 are arranged is preferably smaller than the pixel pitches PP1 and PP2.

Specifically, the interval (pitch) from the dot 162A to the dot 162G and the interval (pitch) from the dot 162A to the dot 162H are preferably smaller than the pixel pitches PP1 and PP2.

Accordingly, at least one light shielding layer 162 is formed within a pixel.

The direction of strong scattering of the diffusing unit 22 of the light-diffusing member 161 is preferably non-parallel to the periodic direction at which the light shielding layers 162 are arranged.

According to the present embodiment, the direction of the pixel pitch PP1 and the direction of the pixel pitch PP2 are non-parallel to the interval (pitch) direction DP21 of the interval from the dot 162A to the dot 162G, and the direction of the pixel pitch PP1 and the direction of the pixel pitch PP2 are non-parallel to the interval (pitch) direction DP22 of the interval from the dot 162A to the dot 162H. Thus, moire interference fringes do not stand out in the liquid crystal display device 160, and the visibility of the liquid crystal display device 160 can be improved. In addition, according to the present embodiment, since the six dots 162B, 162C, 162D, 162E, 162F, and 162G of the light shielding layers 162 are arranged to have six-fold rotational symmetry, the light shielding layers 162 can be arranged at high density.

While the present embodiment is described in a case where the light-diffusing member 161 includes the substrate20 having light transmissivity, the plurality of light shielding layers 162 that is formed on the one face 20a of the substrate 20, and the light-diffusing unit 22 that is formed in an area of the one face 20a of the substrate 20 except for the area where the light shielding layers 162 are formed, the present embodiment is not limited thereto. The light-diffusing member 161 may include the substrate 20 having light transmissivity, a plurality of light-diffusing units 22 that is formed on the one face 20a of the substrate 20, and the light shielding layer 162 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(7) Seventh Embodiment

Hereinafter, a seventh embodiment of the present invention will be described by using FIG. 31 and FIG. 32.

In the present embodiment, a liquid crystal display device that includes a transmissive liquid crystal display element will be described as an example of the display device.

In all of the drawings below, dimensions of elements may be illustrated on a different scale for easy viewing of each element.

Figure 31:
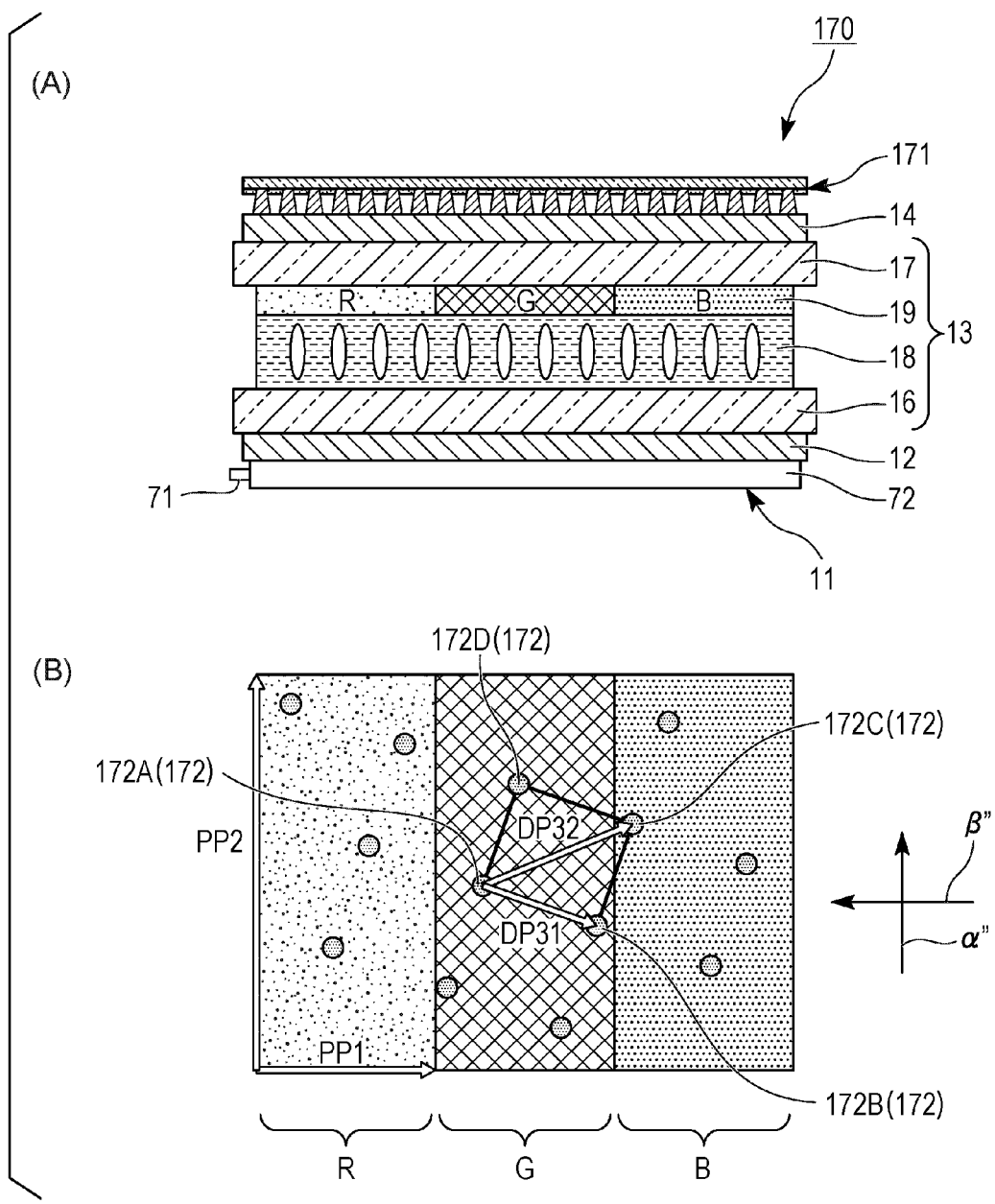
FIG. 31 is a schematic diagram illustrating a liquid crystal display device of a seventh embodiment.
Figure 32:
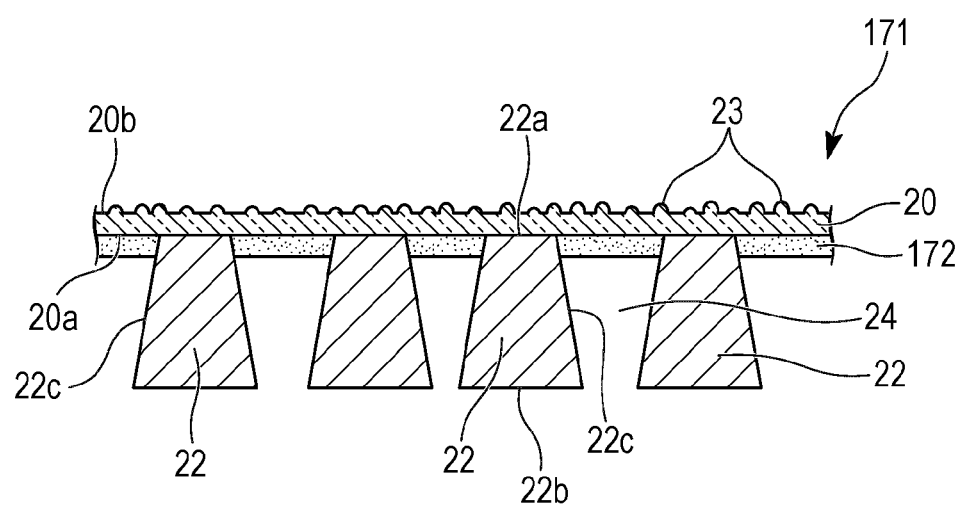
FIG. 32 is a sectional view of a light-diffusing member of the seventh embodiment.

The same configuration as illustrated in FIG. 1 will be designated by the same reference sign in FIG. 31 and will not be described further. In addition, the same configuration illustrated in FIG. 2 will be designated by the same reference sign in FIG. 32 and will not be described further.

FIG. 31 is a schematic diagram illustrating a liquid crystal display device of the present embodiment: FIG. 31(A) is a sectional view of the liquid crystal display device of the present embodiment, and FIG. 31(B) is a plan view of the liquid crystal display device of the present embodiment. FIG. 32 is a sectional view of a light-diffusing member of the present embodiment.

In FIG. 31(B), the arrow α" indicates the direction of a transmission axis of the first polarization plate 12, and the arrow β" indicates the direction of a transmission axis of the second polarization plate 14.

A liquid crystal display device (display device) 170 of the present embodiment is schematically configured of the backlight (light source) 11, the first polarization plate 12, the liquid crystal panel 13, the second polarization plate 14, and a light-diffusing member 171.

The light-diffusing member 171 is schematically configured of the substrate 20 having light transmissivity, a plurality of light shielding layers 172 that is formed on the one face 20a of the substrate 20, the light-diffusing unit 22 that is formed in an area of the one face 20a of the substrate 20 except for the area where the light shielding layers 172 are formed, and the light-scattering layer 23 that is formed on the other face (face on the visible side) 20b of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 171.

As illustrated in FIG. 31(B), in the light-diffusing member 171, the planar shape of the light shielding layers 172 viewed from the normal direction of the other face 20b of the substrate 20 is a shape that does not have anisotropy. That is, the shape of each dot (dots 172A, 172B, 172C, 172D, and the like) constituting the light shielding layers 172 is a circular shape.

The light shielding layers 172 are arranged at a predetermined period. For example, as illustrated in FIG. 31(B), four dots 172A, 172B, 172C, and 172D of the light shielding layers 172 are arranged to have four-fold rotational symmetry.

The periodic direction at which the light shielding layers 172, that is, the dots 172A, 172B, 172C, 172D, and the like constituting the light shielding layers 172, are recurrently formed is non-parallel to the direction of the pixel pitch of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 31(B).

The dots 172A, 172B, 172C, and 172D are arranged to form an approximately square shape in the present embodiment. At this time, the direction of the pixel pitch PP1 and the direction of the pixel pitch PP2 are non-parallel to a distance (pitch) direction DP31 of the distance from the dot 172A to the closest dot 172B as illustrated in FIG. 31(B) in the present embodiment. In addition, the direction of the pixel pitch PP1 and the direction of the pixel pitch PP2 are non-parallel to a distance (pitch) direction DP32 of the distance from the dot 172A to the second closest dot 172C.

The period (interval or pitch) at which the light shielding layers 172 are arranged is preferably smaller than the pixel pitches PP1 and PP2.

Specifically, the interval (pitch) from the dot 172A to the dot 172B and the interval (pitch) from the dot 172A to the dot 172C are preferably smaller than the pixel pitches PP1 and PP2.

Accordingly, at least one light shielding layer 172 is formed within a pixel.

The direction of strong scattering of the diffusing unit 22 of the light-diffusing member 171 is preferably non-parallel to the periodic direction at which the light shielding layers 172 are arranged.

According to the present embodiment, the direction of the pixel pitch PP1 and the direction of the pixel pitch PP2 are non-parallel to the interval (pitch) direction DP31 of the interval from the dot 172A to the dot 172B, and the direction of the pixel pitch PP1 and the direction of the pixel pitch PP2 are non-parallel to the interval (pitch) direction DP32 of the interval from the dot 172A to the dot 172C. Thus, moire interference fringes do not stand out in the liquid crystal display device 170, and the visibility of the liquid crystal display device 170 can be improved. In addition, according to the present embodiment, since the four dots 172A, 172B, 172C, and 172D of the light shielding layers 172 are arranged to have four-fold rotational symmetry, the angular range in which moire interference fringes can be reduced is increased.

While the present embodiment is described in a case where the light-diffusing member 171 includes the substrate 20 having light transmissivity, the plurality of light shielding layers 172 that is formed on the one face 20a of the substrate 20, and the light-diffusing unit 22 that is formed in an area of the one face 20a of the substrate 20 except for the area where the light shielding layers 172 are formed, the present embodiment is not limited thereto. The light-diffusing member 171 may include the substrate 20 having light transmissivity, a plurality of light-diffusing units 22 that is formed on the one face 20a of the substrate 20, and the light shielding layer 172 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(8) Eighth Embodiment

Hereinafter, an eighth embodiment of the present invention will be described by using FIG. 33 and FIG. 34.

In the present embodiment, a liquid crystal display device that includes a transmissive liquid crystal display element will be described as an example of the display device.

In all of the drawings below, dimensions of elements may be illustrated on a different scale for easy viewing of each element.

Figure 33:
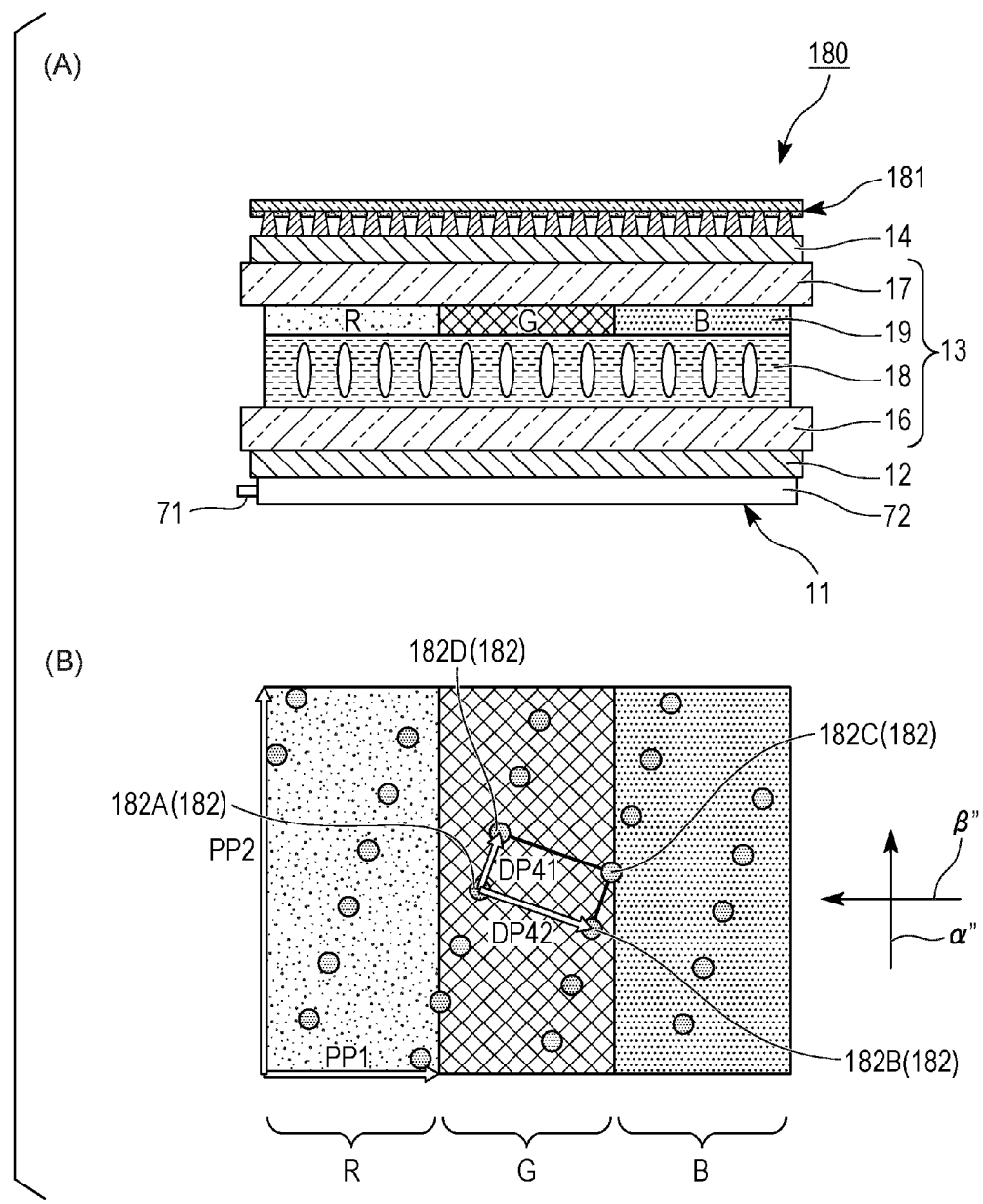
FIG. 33 is a schematic diagram illustrating a liquid crystal display device of an eighth embodiment.
Figure 34:
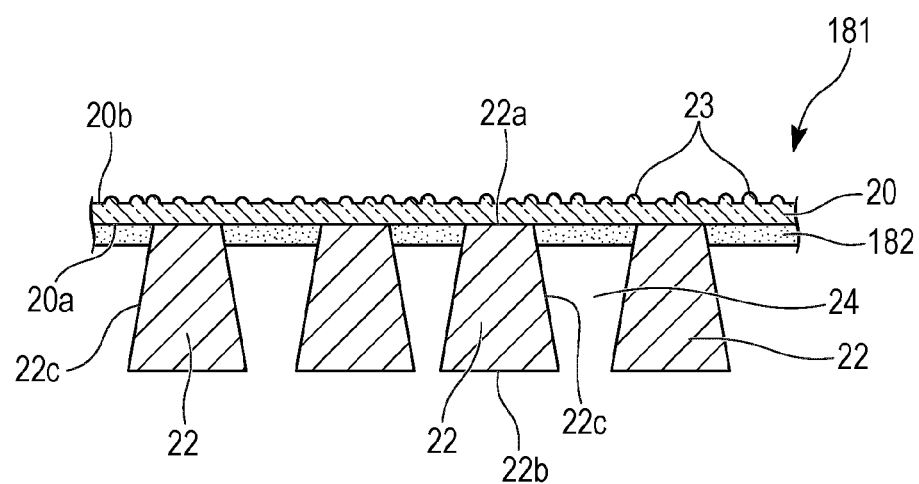
FIG. 34 is a sectional view of a light-diffusing member of the eighth embodiment.

The same configuration as illustrated in FIG. 1 will be designated by the same reference sign in FIG. 33 and will not be described further. In addition, the same configuration illustrated in FIG. 2 will be designated by the same reference sign in FIG. 34 and will not be described further.

FIG. 33 is a schematic diagram illustrating a liquid crystal display device of the present embodiment: FIG. 33(A) is a sectional view of the liquid crystal display device of the present embodiment, and FIG. 33(B) is a plan view of the liquid crystal display device of the present embodiment. FIG. 34 is a sectional view of a light-diffusing member of the present embodiment.

In FIG. 33(B), the arrow α" indicates the direction of a transmission axis of the first polarization plate 12, and the arrow β" indicates the direction of a transmission axis of the second polarization plate 14.

A liquid crystal display device (display device) 180 of the present embodiment is schematically configured of the backlight (light source) 11, the first polarization plate 12, the liquid crystal panel 13, the second polarization plate 14, and a light-diffusing member 181.

The light-diffusing member 181 is schematically configured of the substrate 20 having light transmissivity, a plurality of light shielding layers 182 that is formed on the one face 20a of the substrate 20, the light-diffusing unit 22 that is formed in an area of the one face 20a of the substrate 20 except for the area where the light shielding layers 182 are formed, and the light-scattering layer 23 that is formed on the other face (face on the visible side) 20b of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 181.

As illustrated in FIG. 33(B), in the light-diffusing member 181, the planar shape of the light shielding layers 182 viewed from the normal direction of the other face 20b of the substrate 20 is a shape that does not have anisotropy. That is, the shape of each dot (dots 182A, 182B, 182C, 182D, and the like) constituting the light shielding layers 182 is a circular shape.

The light shielding layers 182 are arranged at a predetermined period. For example, as illustrated in FIG. 33(B), four dots 182A, 182B, 182C, and 182D of the light shielding layers 182 are arranged to have two-fold rotational symmetry.

The periodic direction at which the light shielding layers 182, that is, the dots 182A, 182B, 182C, 182D, and the like constituting the light shielding layers 182, are recurrently formed is non-parallel to the direction of the pixel pitch of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 33(B).

The dots 182A, 182B, 182C, and 182D are arranged to form an approximately oblong shape in the present embodiment. At this time, the direction of the pixel pitch PP1 and the direction of the pixel pitch PP2 are non-parallel to a distance (pitch) direction DP41 of the distance from the dot 182A to the closest dot 182D as illustrated in FIG. 33(B) in the present embodiment. In addition, the direction of the pixel pitch PP1 and the direction of the pixel pitch PP2 are non-parallel to a distance (pitch) direction DP42 of the distance from the dot 182A to the second closest dot 182B.

The period (interval or pitch) at which the light shielding layers 182 are arranged is preferably smaller than the pixel pitches PP1 and PP2.

Specifically, the interval (pitch) from the dot 182A to the dot 182B and the interval (pitch) from the dot 182A to the dot 182D are preferably smaller than the pixel pitches PP1 and PP2.

Accordingly, at least one light shielding layer 182 is formed within a pixel.

The direction of strong scattering of the diffusing unit 22 of the light-diffusing member 181 is preferably non-parallel to the periodic direction at which the light shielding layers 182 are arranged.

According to the present embodiment, the direction of the pixel pitch PP1 and the direction of the pixel pitch PP2 are non-parallel to the interval (pitch) direction DP41 of the interval from the dot 182A to the dot 182D, and the direction of the pixel pitch PP1 and the direction of the pixel pitch PP2 are non-parallel to the interval (pitch) direction DP42 of the interval from the dot 182A to the dot 182B. Thus, moire interference fringes do not stand out in the liquid crystal display device 180, and the visibility of the liquid crystal display device 180 can be improved. In addition, according to the present embodiment, since the four dots 182A, 182B, 182C, and 182D of the light shielding layers 182 are arranged to have two-fold rotational symmetry, the angular range in which moire interference fringes can be reduced is increased.

While the present embodiment is described in a case where the light-diffusing member 181 includes the substrate 20 having light transmissivity, the plurality of light shielding layers 182 that is formed on the one face 20a of the substrate 20, and the light-diffusing unit 22 that is formed in an area of the one face 20a of the substrate 20 except for the area where the light shielding layers 182 are formed, the present embodiment is not limited thereto. The light-diffusing member 181 may include the substrate 20 having light transmissivity, a plurality of light-diffusing units 22 that is formed on the one face 20a of the substrate 20, and the light shielding layer 182 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(9) Ninth Embodiment

Hereinafter, a ninth embodiment of the present invention will be described by using FIG. 35 and FIG. 36.

In the present embodiment, a liquid crystal display device that includes a transmissive liquid crystal display element will be described as an example of the display device.

In all of the drawings below, dimensions of elements may be illustrated on a different scale for easy viewing of each element.

Figure 35:
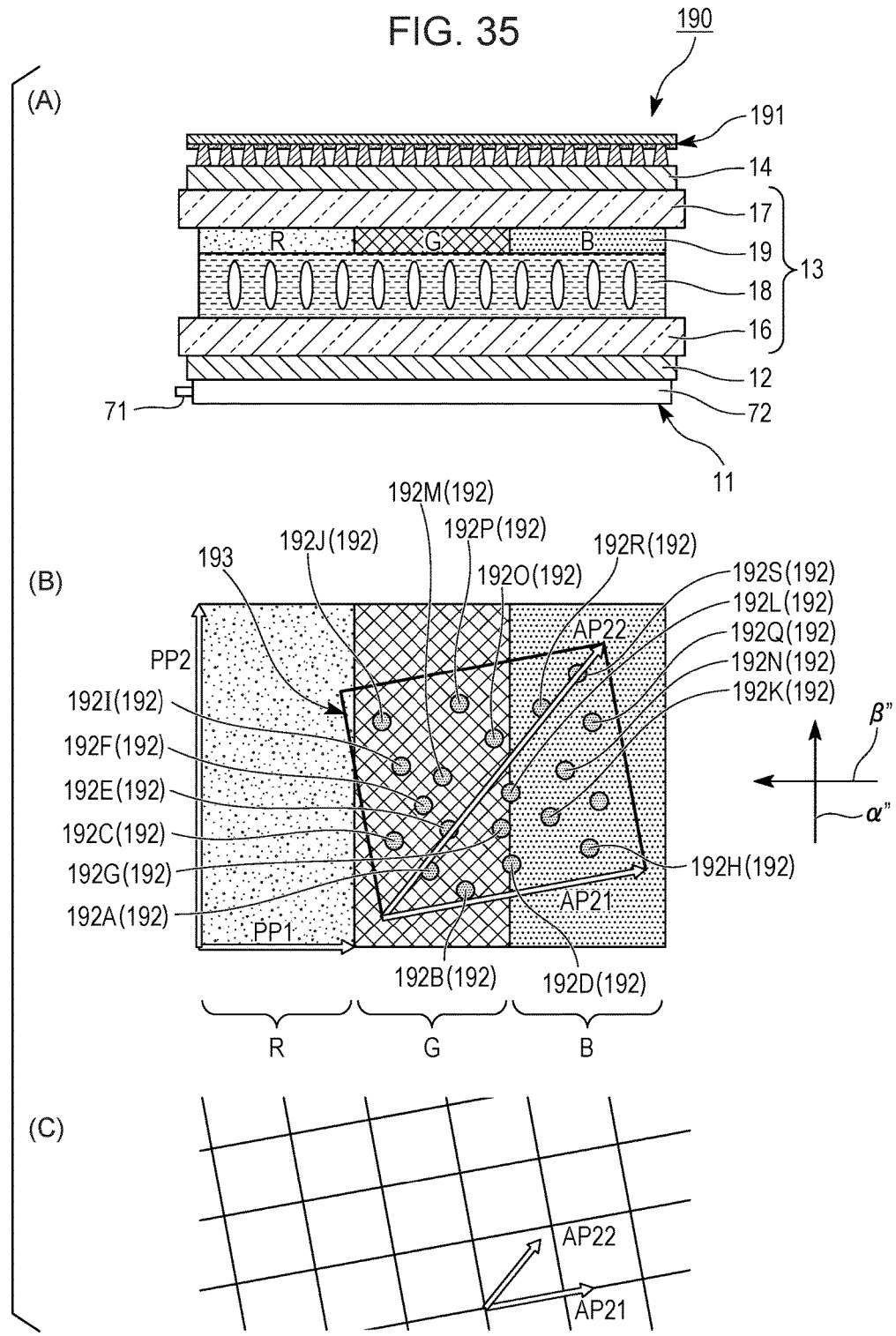
FIG. 35 is a schematic diagram illustrating a liquid crystal display device of a ninth embodiment.
Figure 36:
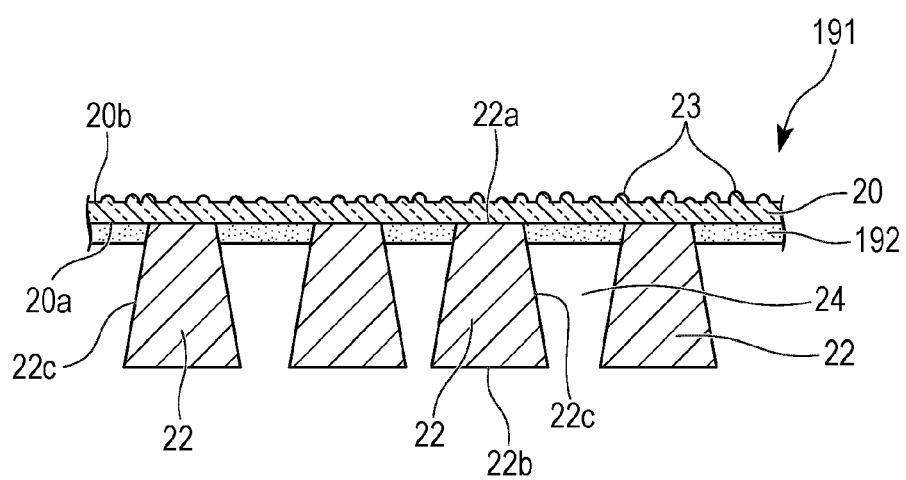
FIG. 36 is a sectional view of a light-diffusing member of the ninth embodiment.

The same configuration as illustrated in FIG. 1 will be designated by the same reference sign in FIG. 35 and will not be described further. In addition, the same configuration illustrated in FIG. 2 will be designated by the same reference sign in FIG. 36 and will not be described further.

FIG. 35 is a schematic diagram illustrating a liquid crystal display device of the present embodiment: FIG. 35(A) is a sectional view of the liquid crystal display device of the present embodiment, and FIGS. 35(B) and 35(C) are plan views of the liquid crystal display device of the present embodiment. FIG. 36 is a sectional view of a light-diffusing member of the present embodiment.

In FIG. 35(B), the arrow α" indicates the direction of a transmission axis of the first polarization plate 12, and the arrow β" indicates the direction of a transmission axis of the second polarization plate 14.

A liquid crystal display device (display device) 190 of the present embodiment is schematically configured of the backlight (light source) 11, the first polarization plate 12, the liquid crystal panel 13, the second polarization plate 14, and a light-diffusing member 191.

The light-diffusing member 191 is schematically configured of the substrate 20 having light transmissivity, a plurality of light shielding layers 192 that is formed on the one face 20a of the substrate 20, the light-diffusing unit 22 that is formed in an area of the one face 20a of the substrate 20 except for the area where the light shielding layers 192 are formed, and the light-scattering layer 23 that is formed on the other face (face on the visible side) 20b of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 191.

As illustrated in FIG. 35(B), in the light-diffusing member 191, the planar shape of the light shielding layers 192 viewed from the normal direction of the other face 20b of the substrate 20 is a shape that does not have anisotropy. That is, the shape of each dot (dots 192A to 192S and the like) constituting the light shielding layers 192 is a circular shape.

While the light shielding layers 192 are randomly arranged when viewed microscopically as illustrated in FIG. 35(B), the plurality of randomly arranged light shielding layers 192 collectively constitutes one group, and the group is arranged at a predetermined period. For example, dots 192A to 192S of the light shielding layers 192 are randomly arranged as illustrated in FIG. 35(B). The plurality of dots 192A to 192S collectively constitutes one group 193, and the group 193 is arranged at a predetermined period.

The periodic direction at which the group 193 configured of the plurality of randomly arranged dots 192A to 192S is recurrently formed (direction of the interval between groups configured of a plurality of dots) is non-parallel to the direction of the pitch pixel of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 35(B).

The present embodiment assumes that the group 193 forms an approximately oblong area. At this time, as illustrated in FIGS. 35(B) and 35(C), for example, the direction of the pixel pitch PP1 and the direction of the pixel pitch PP2 are non-parallel to a length direction AP21 of the length of a long edge of the oblong area forming the group 193. In addition, the direction of the pixel pitch PP1 and the direction of the pixel pitch PP2 are non-parallel to a length direction AP22 of the length of a diagonal of the oblong area forming the group 193. The interval between the groups 193 configured of the plurality of dots 192A to 192S is represented by, when the group 193 forms an approximately oblong area, the length of the long edge or short edge of the oblong area or by the length of the diagonal of the oblong area.

The interval (pitch) at which the light shielding layers 192 are arranged is preferably smaller than the pixel pitches PP1 and PP2.

Specifically, the interval (pitch) from the dot 192A to the dot 192B and the interval (pitch) from the dot 192A to the dot 192C are preferably smaller than the pixel pitches PP1 and PP2.

Accordingly, at least one light shielding layer 192 is formed within a pixel.

The direction of strong scattering of the diffusing unit 22 of the light-diffusing member 191 is preferably non-parallel to the periodic direction at which the light shielding layers 192 are arranged.

According to the present embodiment, the direction of the pixel pitch PP1 and the direction of the pixel pitch PP2 are non-parallel to the length direction AP21 of the length of the long edge of the oblong area forming the group 193 which is configured of the plurality of dots 192A to 192S constituting the light shielding layers 192, and the direction of the pixel pitch PP1 and the direction of the pixel pitch PP2 are non-parallel to the length direction AP22 of the length of the diagonal of the oblong area forming the group 193 which is configured of the plurality of dots 192A to 192S constituting the light shielding layers 192. Thus, moire interference fringes do not stand out in the liquid crystal display device 190, and the visibility of the liquid crystal display device 190 can be improved. In addition, according to the present embodiment, the plurality of dots 192A to 192S collectively forms one group 193, and the group 193 is arranged at a predetermined period. Thus, the size of design data in manufacturing the light shielding layers 192 can be decreased.

While the present embodiment is described in a case where the light-diffusing member 191 includes the substrate 20 having light transmissivity, the plurality of light shielding layers 192 that is formed on the one face 20*a* of the substrate 20, and the light-diffusing unit 22 that is formed in an area of the one face 20*a* of the substrate 20 except for the area where the light shielding layers 192 are formed, the present embodiment is not limited thereto. The light-diffusing member 191 may include the substrate 20 having light transmissivity, a plurality of light-diffusing units 22 that is formed on the one face 20*a* of the substrate 20, and the light shielding layer 192 that is formed in an area of the one face 20*a* of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20*a* of the substrate 20, forming a negative photosensitive resin layer having light transmissivity on the one face 20*a* of the substrate 20 to cover the light shielding layer 21, irradiating the negative photosensitive resin layer with diffused light through the opening portion of the light shielding layer 21 from the face of the substrate 20 opposite to the one face 20*a* on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20*a* of the substrate 20.

(10) Tenth Embodiment

Hereinafter, a tenth embodiment of the present invention will be described by using FIG. 37 and FIG. 38.

In the present embodiment, a liquid crystal display device that includes a transmissive liquid crystal display element will be described as an example of the display device.

In all of the drawings below, dimensions of elements may be illustrated on a different scale for easy viewing of each element.

Figure 37:
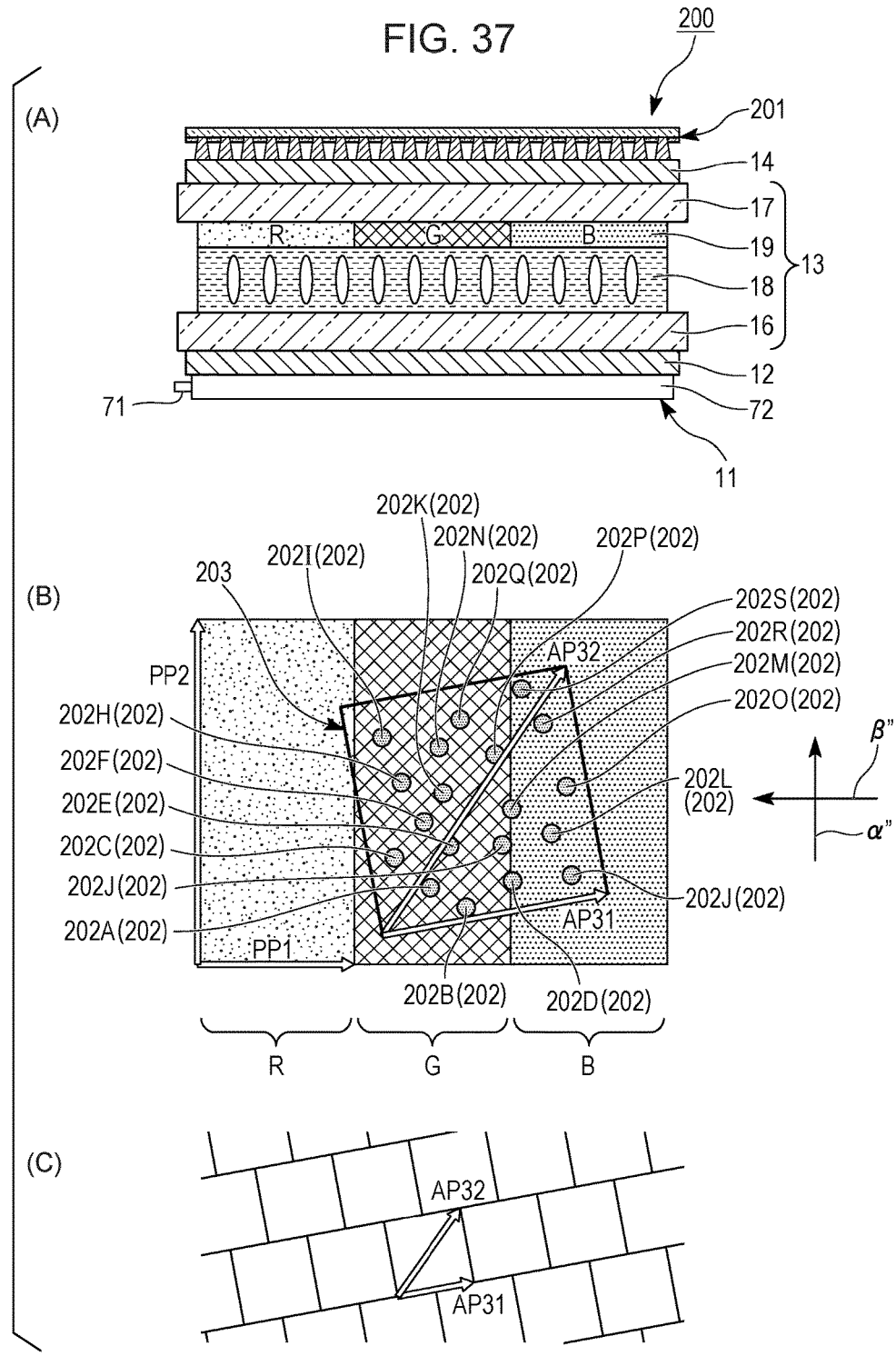
FIG. 37 is a schematic diagram illustrating a liquid crystal display device of a tenth embodiment.
Figure 38:
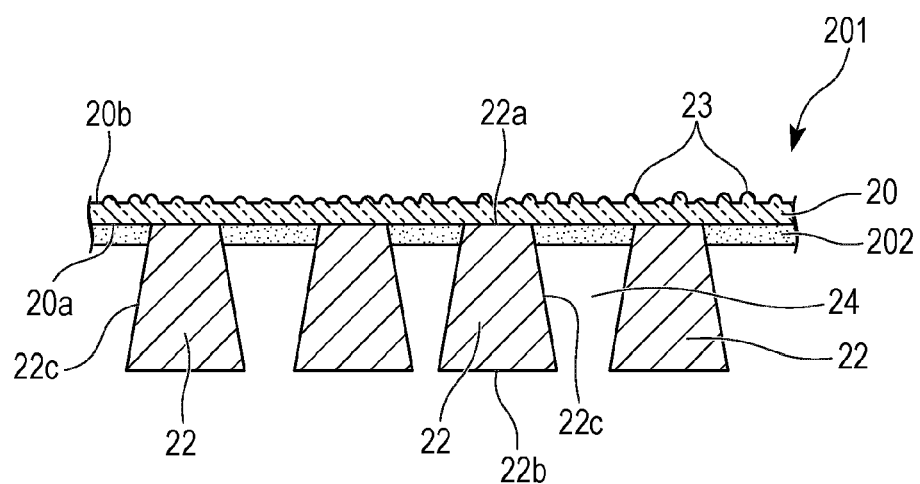
FIG. 38 is a sectional view of a light-diffusing member of the tenth embodiment.

The same configuration as illustrated in FIG. 1 will be designated by the same reference sign in FIG. 37 and will not be described further. In addition, the same configuration illustrated in FIG. 2 will be designated by the same reference sign in FIG. 38 and will not be described further.

FIG. 37 is a schematic diagram illustrating a liquid crystal display device of the present embodiment: FIG. 37(A) is a sectional view of the liquid crystal display device of the present embodiment, and FIGS. 37(B) and 37(C) are plan views of the liquid crystal display device of the present embodiment. FIG. 38 is a sectional view of a light-diffusing member of the present embodiment.

In FIG. 38(B), the arrow α" indicates the direction of a transmission axis of the first polarization plate 12, and the arrow β" indicates the direction of a transmission axis of the second polarization plate 14.

A liquid crystal display device (display device) 200 of the present embodiment is schematically configured of the backlight (light source) 11, the first polarization plate 12, the liquid crystal panel 13, the second polarization plate 14, and a light-diffusing member 201.

The light-diffusing member 201 is schematically configured of the substrate 20 having light transmissivity, a plurality of light shielding layers 202 that is formed on the one face 20*a* of the substrate 20, the light-diffusing unit 22 that is formed in an area of the one face 20*a* of the substrate 20 except for the area where the light shielding layers 202 are formed, and the light-scattering layer 23 that is formed on the other face (face on the visible side) 20*b* of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 201.

As illustrated in FIG. 37(B), in the light-diffusing member 201, the planar shape of the light shielding layers 202 viewed from the normal direction of the other face 20*b* of the substrate 20 is a shape that does not have anisotropy. That is, the shape of each dot (dots 202A to 202S and the like) constituting the light shielding layers 202 is a circular shape.

While the light shielding layers 202 are randomly arranged when viewed microscopically as illustrated in FIG. 37(B), the plurality of randomly arranged light shielding layers 202 collectively constitutes one group, and the group is arranged at a predetermined period. For example, dots 202A to 202S of the light shielding layers 202 are randomly arranged as illustrated in FIG. 37(B). The plurality of dots 202A to 202S collectively constitutes one group 203, and the group 203 is arranged at a predetermined period.

The periodic direction at which the group 203 configured of the plurality of randomly arranged dots 202A to 202S is recurrently formed (direction of the interval between groups configured of a plurality of dots) is non-parallel to the direction of the pitch pixel of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 37(B).

The present embodiment assumes that the group 203 forms an approximately square area. At this time, as illustrated in FIGS. 37(B) and 37(C), for example, the direction of the pixel pitch PP1 and the direction of the pixel pitch PP2 are non-parallel to a length direction AP31 of the length of one edge of the square area forming the group 203. In addition, the direction of the pixel pitch PP1 and the direction of the pixel pitch PP2 are non-parallel to a length direction AP32 of the length of a diagonal of the square area forming the group 203. The interval between the groups 203 configured of the plurality of dots 202A to 202S is represented by, when the group 203 forms an approximately square area, the length of one edge of the square area or by the length of the diagonal of the square area.

The interval (pitch) at which the light shielding layers 202 are arranged is preferably smaller than the pixel pitches PP1 and PP2.

Specifically, the interval (pitch) from the dot 202A to the dot 202B and the interval (pitch) from the dot 202A to the dot 202C are preferably smaller than the pixel pitches PP1 and PP2.

Accordingly, at least one light shielding layer 202 is formed within a pixel.

The direction of strong scattering of the diffusing unit 22 of the light-diffusing member 201 is preferably non-parallel to the periodic direction at which the light shielding layers 202 are arranged.

According to the present embodiment, the direction of the pixel pitch PP1 and the direction of the pixel pitch PP2 are non-parallel to the length direction AP31 of the length of one edge of the square area forming the group 203 which is configured of the plurality of dots 202A to 202S constituting the light shielding layers 202, and the direction of the pixel pitch PP1 and the direction of the pixel pitch PP2 are non-parallel to the length direction AP32 of the length of the diagonal of the oblong area forming the group 203 which is configured of the plurality of dots 202A to 202S constituting the light shielding layers 202. Thus, moire interference fringes do not stand out in the liquid crystal display device 200, and the visibility of the liquid crystal display device 200 can be improved. In addition, according to the present embodiment, the plurality of dots 202A to 202S collectively forms one group 203, and the group 203 is arranged at a predetermined period. Thus, the size of design data in manufacturing the light shielding layers 202 can be decreased.

While the present embodiment is described in a case where the light-diffusing member 201 includes the substrate 20 having light transmissivity, the plurality of light shielding layers 202 that is formed on the one face 20a of the substrate 20, and the light-diffusing unit 22 that is formed in an area of the one face 20a of the substrate 20 except for the area where the light shielding layers 202 are formed, the present embodiment is not limited thereto. The light-diffusing member 201 may include the substrate 20 having light transmissivity, a plurality of light-diffusing units 22 that is formed on the one face 20a of the substrate 20, and the light shielding layer 202 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

(11) Eleventh Embodiment

Hereinafter, an eleventh embodiment of the present invention will be described by using FIG. 39 and FIG. 40.

In the present embodiment, a liquid crystal display device that includes a transmissive liquid crystal display element will be described as an example of the display device.

In all of the drawings below, dimensions of elements may be illustrated on a different scale for easy viewing of each element.

Figure 39:
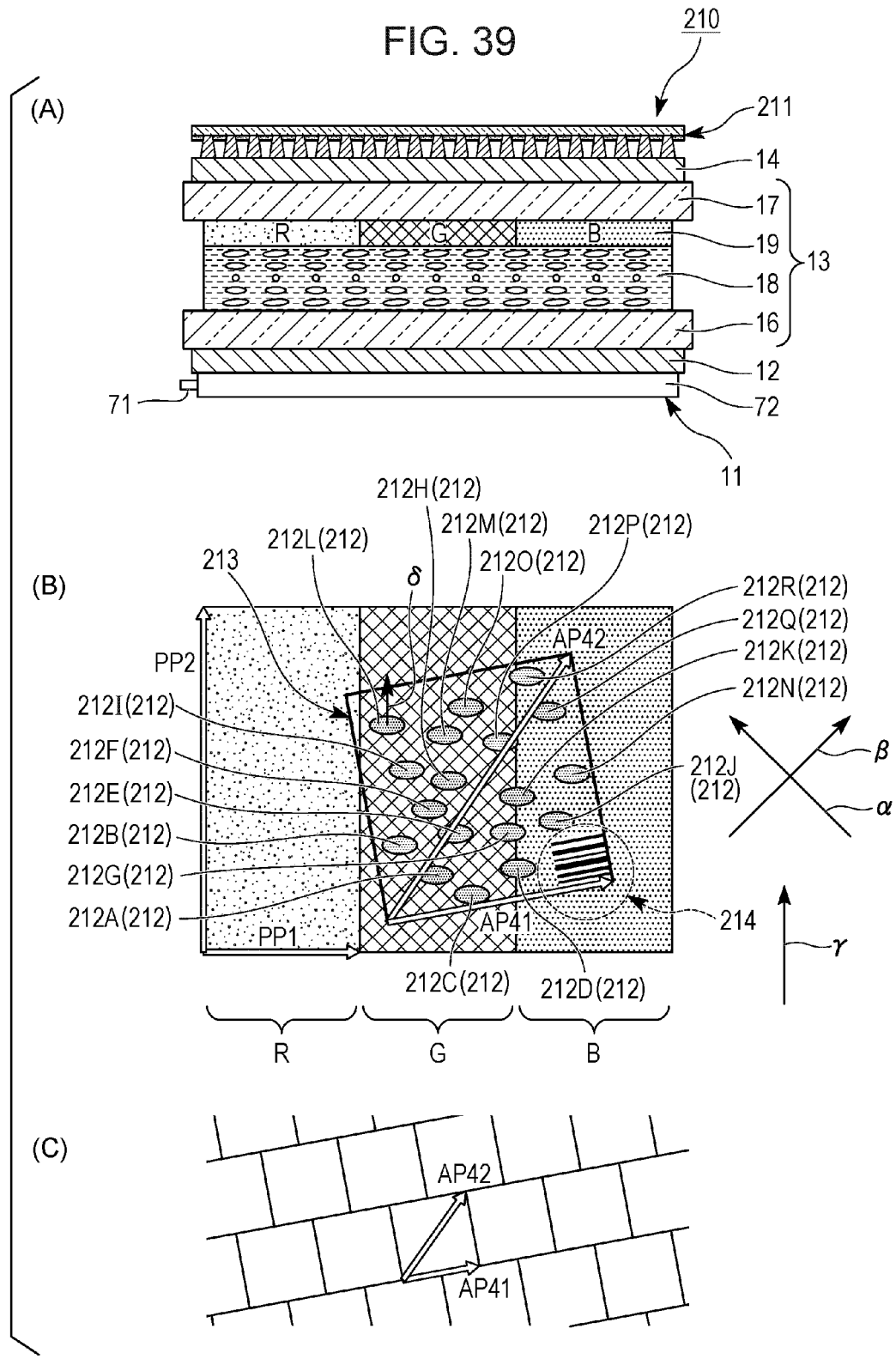
FIG. 39 is a schematic diagram illustrating a liquid crystal display device of an eleventh embodiment.
Figure 40:
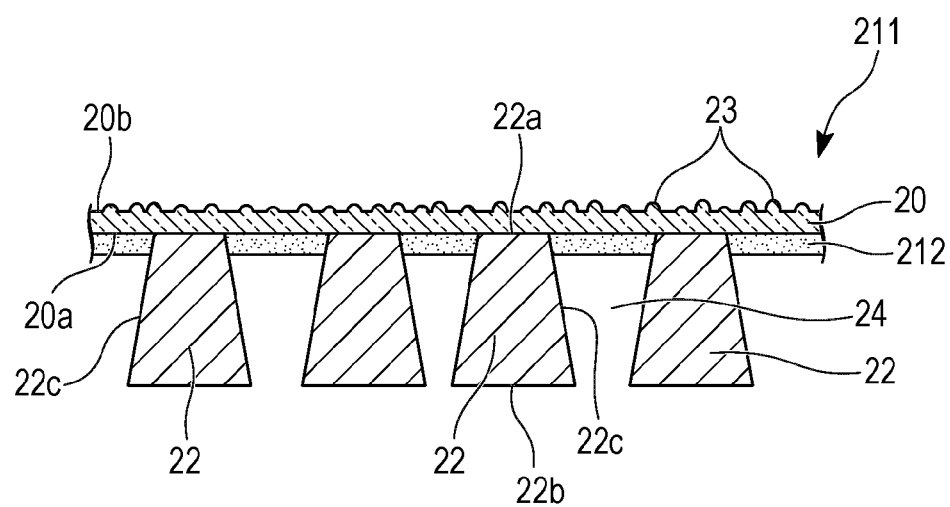
FIG. 40 is a sectional view of a light-diffusing member of the eleventh embodiment.

The same configuration as illustrated in FIG. 1 will be designated by the same reference sign in FIG. 39 and will not be described further. In addition, the same configuration illustrated in FIG. 2 will be designated by the same reference sign in FIG. 40 and will not be described further.

FIG. 39 is a schematic diagram illustrating a liquid crystal display device of the present embodiment: FIG. 39(A) is a sectional view of the liquid crystal display device of the present embodiment, and FIGS. 39(B) and 39(C) are plan views of the liquid crystal display device of the present embodiment. FIG. 40 is a sectional view of a light-diffusing member of the present embodiment.

In FIG. 39(B), the arrow α indicates the direction of a transmission axis of the first polarization plate 12, the arrow β indicates the direction of a transmission axis of the second polarization plate 14, the arrow γ indicates a direction of view (asymmetrical direction), and the arrow δ indicates the direction in which the intensity of scattering of a light-diffusing member 211 is high (direction of strong scattering).

A liquid crystal display device (display device) 210 of the present embodiment is schematically configured of the backlight (light source) 11, the first polarization plate 12, the liquid crystal panel 13, the second polarization plate 14, and a light-diffusing member 211.

The light-diffusing member 211 is schematically configured of the substrate 20 having light transmissivity, a plurality of light shielding layers 212 that is formed on the one face 20a of the substrate 20, the light-diffusing unit 22 that is formed in an area of the one face 20a of the substrate 20 except for the area where the light shielding layers 212 are formed, and the light-scattering layer 23 that is formed on the other face (face on the visible side) 20b of the substrate 20.

The liquid crystal panel 13 of the present embodiment is either a VA type or an IPS type in which light distribution characteristics have multi-directional symmetry.

The direction in which the anisotropy of the liquid crystal panel 13 is strong is approximately parallel to the direction of strong scattering of the light-diffusing member 211.

As illustrated in FIG. 39(B), in the light-diffusing member 211, the planar shape of the light shielding layers 212 viewed from the normal direction of the other face 20b of the substrate 20 is an anisotropic shape having at least a long axis and a short axis (long and narrow elliptic shape).

While the light shielding layers 212 are randomly arranged when viewed microscopically as illustrated in FIG. 39(B), the plurality of randomly arranged light shielding layers 212 collectively constitutes one group, and the group is arranged at a predetermined period. For example, dots 212A to 212R of the light shielding layers 212 are randomly arranged as illustrated in FIG. 39(B). The plurality of dots 212A to 212R collectively constitutes one group 213, and the group 213 is arranged at a predetermined period.

The periodic direction at which the group 213 configured of the plurality of randomly arranged dots 212A to 212R is recurrently formed (direction of the interval between groups configured of a plurality of dots) is non-parallel to the direction of the pitch pixel of the liquid crystal panel 13 in the present embodiment.

The pixel pitch of the liquid crystal panel 13 includes the pixel pitch PP1 which is the interval between the color elements for each of red (R), green (G), and blue (B) and the pixel pitch PP2 which is the width of each color element as illustrated in FIG. 39(B).

The present embodiment assumes that the group 213 forms an approximately square area. At this time, as illustrated in FIGS. 39(B) and 39(C), for example, the direction of the pixel pitch PP1 and the direction of the pixel pitch PP2 are non-parallel to a length direction AP41 of the length of one edge of the square area forming the group 213. In addition, the direction of the pixel pitch PP1 and the direction of the pixel pitch PP2 are non-parallel to a length direction AP42 of the length of a diagonal of the square area forming the group 213. The interval between the groups 213 configured of the plurality of dots 212A to 212R is represented by, when the group 213 forms an approximately square area, the length of one edge of the square area or by the length of the diagonal of the square area.

The shape of each dot (dots 212A to 212R and the like) constituting the light shielding layers 212 is not limited to a long and narrow elliptic shape and, as illustrated in FIG. 4, may be a long and narrow oblong shape, a long and narrow octagonal shape, a shape in which two facing edges of a long and narrow oblong are curved outward, a shape in which two oblongs having different aspect ratios intersect in two orthogonal directions, an isosceles triangular shape, a rhombus shape, or the like.

In addition, a plurality of types of light shielding layer of different sizes and shapes having various directions of anisotropy may coexist by making the planar shape of each light shielding layer 212 different from each other.

In addition, the planar shape of the light shielding layers 212 viewed from the normal direction of the one face 20a of the substrate 20 of the light-diffusing member 211 may be an isotropic shape while the side shape of the light shielding layers 212 is an anisotropic shape having a long axis and a short axis.

A pattern 214 in which information such as a one-dimensional or two-dimensional barcode is written is formed in a part of the area of the group 213.

The interval (pitch) at which the light shielding layers 212 are arranged is preferably smaller than the pixel pitches PP1 and PP2.

Specifically, the interval (pitch) from the dot 212A to the dot 212B and the interval (pitch) from the dot 212A to the dot 212C are preferably smaller than the pixel pitches PP1 and PP2.

Accordingly, at least one light shielding layer 212 is formed within a pixel.

The direction of strong scattering of the diffusing unit 22 of the light-diffusing member 211 is preferably non-parallel to the periodic direction at which the light shielding layers 212 are arranged.

According to the present embodiment, the direction of the pixel pitch PP1 and the direction of the pixel pitch PP2 are non-parallel to the length direction AP41 of the length of one edge of the square area forming the group 213 which is configured of the plurality of dots 212A to 212R constituting the light shielding layers 212, and the direction of the pixel pitch PP1 and the direction of the pixel pitch PP2 are non-parallel to the length direction AP42 of the length of the diagonal of the oblong area forming the group 213 which is configured of the plurality of dots 212A to 212R constituting the light shielding layers 212. Thus, moire interference fringes do not stand out in the liquid crystal display device 210, and the visibility of the liquid crystal display device 210 can be improved. In addition, according to the present embodiment, the plurality of dots 212A to 212R collectively forms one group 213, and the group 213 is arranged at a predetermined period. Thus, the size of design data in manufacturing the light shielding layers 212 can be decreased.

While the present embodiment is described in a case where the light-diffusing member 211 includes the substrate 20 having light transmissivity, the plurality of light shielding layers 212 that is formed on the one face 20a of the substrate 20, and the light-diffusing unit 22 that is formed in an area of the one face 20a of the substrate 20 except for the area where the light shielding layers 212 are formed, the present embodiment is not limited thereto. The light-diffusing member 211 may include the substrate 20 having light transmissivity, a plurality of light-diffusing units 22 that is formed on the one face 20a of the substrate 20, and the light shielding layer 212 that is formed in an area of the one face 20a of the substrate 20 except for the area where the light-diffusing units 22 are formed in the present embodiment.

In this case, a method for manufacturing the light-diffusing member 15 may include forming the light shielding layer 21 having an opening portion at a recurring period on the one face 20a of the substrate 20, forming a negative photosensitive resin layer having light transmissivity on the one face 20a of the substrate 20 to cover the light shielding layer 21, irradiating the negative photosensitive resin layer with diffused light through the opening portion of the light shielding layer 21 from the face of the substrate 20 opposite to the one face 20a on which the light shielding layer 21 and the negative photosensitive resin layer are formed, exposing the negative photosensitive resin layer to light, and developing the negative photosensitive resin layer on which the exposure is completed to form the light-diffusing units 22 on the one face 20a of the substrate 20.

INDUSTRIAL APPLICABILITY

The present invention can be used in various display devices such as a liquid crystal display device, an organic electroluminescent display device, and a plasma display.

REFERENCE SIGNS LIST

10 LIQUID CRYSTAL DISPLAY DEVICE (DISPLAY DEVICE)
11 BACKLIGHT (LIGHT SOURCE)
12 FIRST POLARIZATION PLATE
13 LIQUID CRYSTAL PANEL
14 SECOND POLARIZATION PLATE
15 LIGHT-DIFFUSING MEMBER
16 TFT SUBSTRATE
17 COLOR FILTER SUBSTRATE
18 LIQUID CRYSTAL LAYER
19 COLOR FILTER
20 SUBSTRATE
21 LIGHT SHIELDING LAYER
22 LIGHT-DIFFUSING UNIT
23 LIGHT-SCATTERING LAYER
24 CAVITY
41 TFT SUBSTRATE
42 COLOR FILTER SUBSTRATE
43 LIQUID CRYSTAL LAYER
44 SPACER
45 TRANSPARENT SUBSTRATE
46 SEMICONDUCTOR LAYER
47 GATE ELECTRODE
48 SOURCE ELECTRODE
49 DRAIN ELECTRODE
50 TFT
51 GATE INSULATING LAYER
52 FIRST INTERLAYER INSULATING LAYER
53, 54, 57 CONTACT HOLE
55 SECOND INTERLAYER INSULATING LAYER
56 PIXEL ELECTRODE
58 ALIGNMENT LAYER
59 TRANSPARENT SUBSTRATE
60 BLACK MATRIX
61 COLOR FILTER
62 FLATTENING LAYER
63 COUNTER-ELECTRODE
64 ALIGNMENT LAYER
71 LIGHT SOURCE
72 LIGHT GUIDE PLATE
90 PRINTING EQUIPMENT
95 APPLYING EQUIPMENT
100 LIGHT EXPOSURE EQUIPMENT
105 DEVELOPING EQUIPMENT

110 POLARIZATION PLATE LAMINATING EQUIPMENT

The invention claimed is:

1. A light-diffusing member comprising:
a substrate that has light transmissivity;
a plurality of light shielding layers arranged at a recurring period on one face of the substrate; and
a light diffuser provided in a first area of the one face of the substrate, the first area including all portions of the one face of the substrate except for a second area where the plurality of light shielding layers are arranged, wherein
the light diffuser includes a light emitting end face on a first side of the substrate and includes a light incident end face including a third area larger than a fourth area of the light emitting end face on a second side of the substrate opposite to the first side of the substrate,
a height of the light diffuser from the light incident end face to the light emitting end face is greater than a thickness of the plurality of light shielding layers,
the light-diffusing member is an anisotropic light-diffusing member in which an intensity of scattering of the light diffuser has a first direction of strong scattering and a second direction of weak scattering when viewed from a normal direction of the one face of the substrate, and
the first direction is non-parallel to a periodic direction at which the plurality of light shielding layers are recurrently arranged.

2. The display device according to claim 1, wherein the first direction is an in-plane direction of the substrate.

3. The display device according to claim 1, wherein the first direction is perpendicular to a longitudinal direction of the plurality of light shielding layers.

4. The display device according to claim 1, wherein
the recurring period is smaller than a pixel pitch of a display body,
the plurality of light shielding layers include a first light shielding layer, a second light shielding layer, and a third light shielding layer,
the second light shielding layer is closest to the first light shielding layer among the plurality of light shielding layers, and
the third light shielding layer is second closest to the first light shielding layer among the plurality of light shielding layers,
a third direction is non-parallel to a fourth direction of the pixel pitch of the display body,
the third direction is along a first line that connects the first light shielding layer and the second light shielding layer,
a fifth direction is non-parallel to the fourth direction,
the fifth direction is along a second line that connects the first light shielding layer and the third light shielding layer, and
the first direction is non-parallel to the third direction and the fifth direction.

5. The display device according to claim 4, wherein a sixth direction of relatively strong anisotropy of display characteristics of the display body is approximately parallel to the first direction.

6. A display device comprising:
a substrate that has light transmissivity;
a plurality of light shielding layers provided at a recurring period on one face of the substrate; and
a light diffuser provided in a first area of the one face of the substrate, the first area including all portions of the one face of the substrate except for a second area where the plurality of light shielding layers are provided, wherein
the light diffuser includes a light emitting end face on a first side of the substrate and includes a light incident end face including a third area larger than a fourth area of the light emitting end face on a second side of the substrate opposite to the first side of the substrate,
a height of the light diffuser from the light incident end face to the light emitting end face is greater than a thickness of the plurality of light shielding layers,
the light-diffusing member is an anisotropic light-diffusing member in which an intensity of scattering of the light diffuser has a first direction of strong scattering and a second direction of weak scattering when viewed from a normal direction of the one face of the substrate,
the first direction of strong scattering of the light diffuser is non-parallel to a periodic direction at which the plurality of light shielding layers are recurrently arranged,
the periodic direction at which the light shielding layers are arranged is non-parallel to a third direction of a pixel pitch of a display body, and
the recurring period at which the light shielding layers are arranged is smaller than the pixel pitch.

7. The display device according to claim 6, wherein at least one of an anti-reflective layer, an anti-static layer, an anti-glare processed layer, and an anti-stain processed layer is disposed on another face of the substrate opposite to the one face of the substrate.

8. The display device according to claim 6, wherein the first direction is non-parallel to a diagonal that connects vertices of the display body.

9. The display device according to claim 6, wherein a polarization plate is disposed between the substrate and the display body, and a member that has a first refractive index residing between a second refractive index of the substrate and a third refractive index of the polarization plate is interposed between the substrate and the polarization plate.

10. The display device according to claim 6, wherein a portion of faces of the plurality of light shielding layers on an opposite side thereof from the substrate is covered by a member that has light scattering ability.

11. The display device according to claim 6, wherein a first light shielding layer and a second light shielding layer of the plurality of light shielding layers have different sizes.

12. The display device according to claim 6, wherein a space that is defined by the plurality of light shielding layers and a side face of the light diffuser is a cavity, and the cavity is filled with gas.

13. The display device according to claim 6, wherein a first inclination angle of a first side face of the light diffuser is different from a second inclination angle of a second side face of another light diffuser.

14. The display device according to claim 6, wherein an inclination angle of a side face of the light diffuser is different depending on location.

15. The display device according to claim 6, wherein each of the plurality of light shielding layers has a planar shape, and has an anisotropic shape that has a long axis and a short axis when viewed from the normal direction.

16. The display device according to claim 15, wherein the anisotropic shape is an elliptic shape or a polygonal shape.

17. A method for manufacturing a light-diffusing member, the method comprising:

forming a plurality of light shielding layers at a recurring period on one face of a substrate that has light transmissivity; and forming a light diffuser in a first area of the one face, the first area including all portions of the one face except for a second area where the plurality of light shielding layers are formed, wherein the light diffuser includes a light emitting end face on a first side of the substrate and includes a light incident end face including a third area larger than a fourth area of the light emitting end face on a second side opposite to the first side, a height of the light diffuser from the light incident end face to the light emitting end face is greater than a thickness of the plurality of light shielding layers, the light-diffusing member is an anisotropic light-diffusing member in which an intensity of scattering of the light diffuser has a first direction of strong scattering and a second direction of weak scattering when viewed from a normal direction of the one face of the substrate, and the first direction is non-parallel to a periodic direction at which the plurality of light shielding layers are recurrently formed.

* * * * *